United States Patent
Ito et al.

(10) Patent No.: US 7,989,903 B2
(45) Date of Patent: Aug. 2, 2011

(54) SEMICONDUCTOR DEVICE WITH EXTENSION STRUCTURE AND METHOD FOR FABRICATING THE SAME

(75) Inventors: Takayuki Ito, Kawasaki (JP); Kyoichi Suguro, Yokohama (JP); Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/757,658

(22) Filed: Apr. 9, 2010

(65) Prior Publication Data
US 2010/0193874 A1 Aug. 5, 2010

Related U.S. Application Data

(63) Continuation of application No. 11/704,924, filed on Feb. 12, 2007, now Pat. No. 7,781,848.

(30) Foreign Application Priority Data

Feb. 14, 2006 (JP) ................................ 2006-037107

(51) Int. Cl.
*H01L 21/02* (2006.01)

(52) U.S. Cl. ............. 257/411; 257/351; 257/E29.255; 257/E21.625

(58) Field of Classification Search .............. 257/344, 257/350, 351, 369, 386, 387, 408, 336, E29.266, 257/288, 407, 410, 411, E29.255, E21.625
See application file for complete search history.

(56) References Cited

U.S. PATENT DOCUMENTS

| 5,517,049 | A | 5/1996 | Huang |
| 5,885,877 | A | 3/1999 | Gardner et al. |
| 6,017,808 | A | 1/2000 | Wang et al. |
| 6,191,450 | B1 | 2/2001 | Maeda et al. |
| 6,506,642 | B1* | 1/2003 | Luning et al. ............. 438/231 |
| 6,806,584 | B2 | 10/2004 | Fung et al. |
| 6,881,657 | B2 | 4/2005 | Torii et al. |
| 6,929,992 | B1 | 8/2005 | Djomehri et al. |
| 7,109,553 | B2* | 9/2006 | Matsumoto et al. ......... 257/344 |
| 2005/0151173 | A1 | 7/2005 | Seo et al. |
| 2006/0043430 | A1 | 3/2006 | Feudel et al. |
| 2007/0126062 | A1 | 6/2007 | Akiyama et al. |
| 2007/0207572 | A1 | 9/2007 | Varghese et al. |

FOREIGN PATENT DOCUMENTS

| JP | 10-242292 | 9/1998 |
| JP | 3068270 | 5/2000 |
| JP | 2001-68666 | 3/2001 |
| JP | 2004-63574 | 2/2004 |

* cited by examiner

*Primary Examiner* — Evan Pert
*Assistant Examiner* — Eduardo A Rodela
(74) *Attorney, Agent, or Firm* — Finnegan, Henderson, Farabow, Garrett & Dunner, L.L.P.

(57) ABSTRACT

A semiconductor device includes a semiconductor region, a source region, a drain region, a source extension region a drain extension region, a first gate insulation film, a second gate insulation film, and a gate electrode. The source region, drain region, source extension region and drain extension region are formed in a surface portion of the semiconductor region. The first gate insulation film is formed on the semiconductor region between the source extension region and the drain extension region. The first gate insulation film is formed of a silicon oxide film or a silicon oxynitride film having a nitrogen concentration of 15 atomic % or less. The second gate insulation film is formed on the first gate insulation film and contains nitrogen at a concentration of between 20 atomic % and 57 atomic %. The gate electrode is formed on the second gate insulation film.

6 Claims, 61 Drawing Sheets

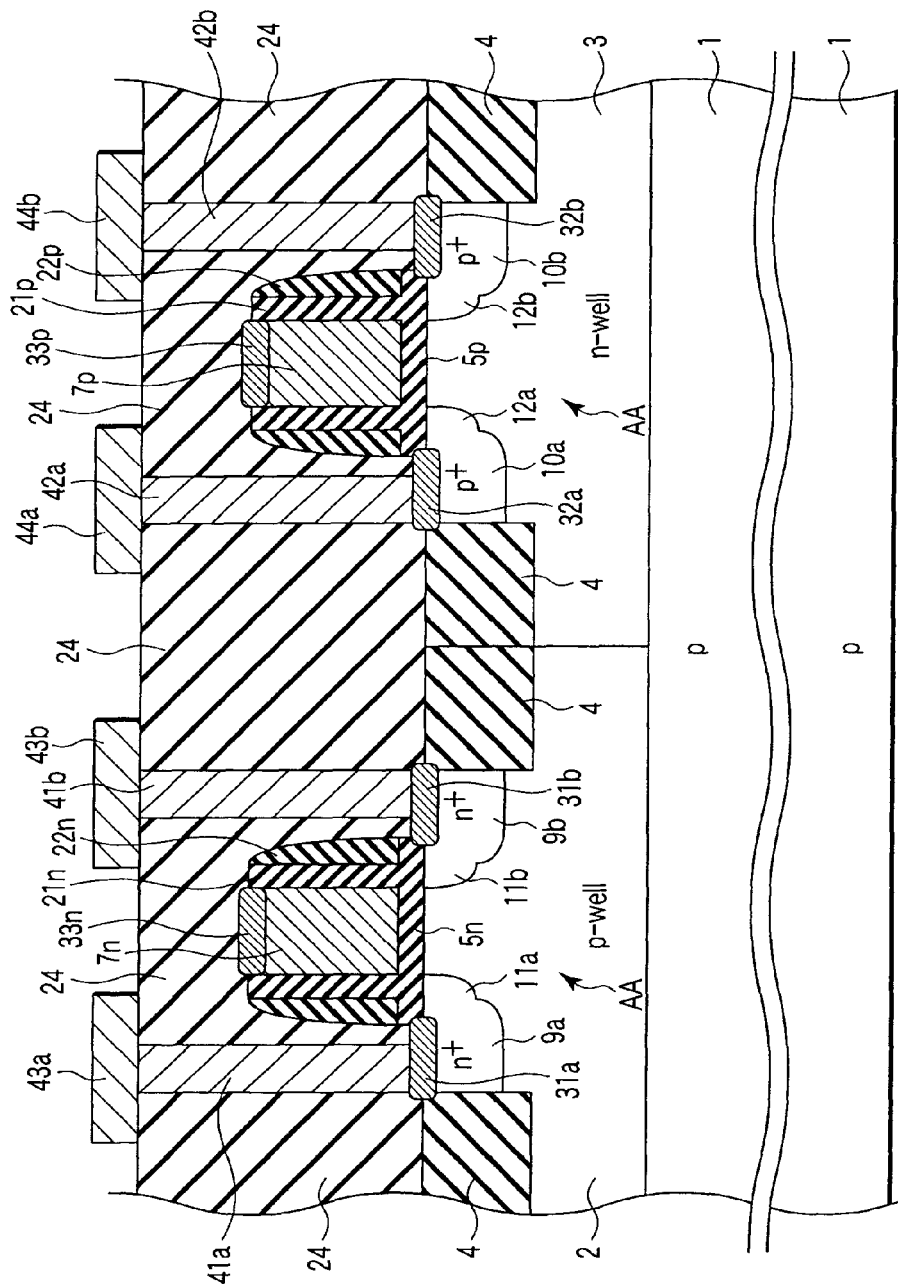
F I G. 1

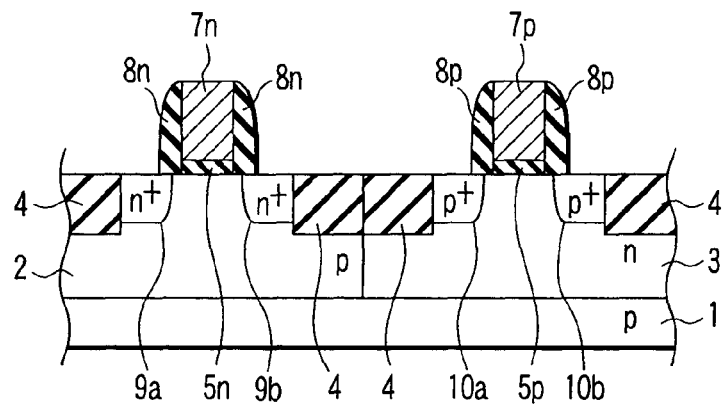
F I G. 10
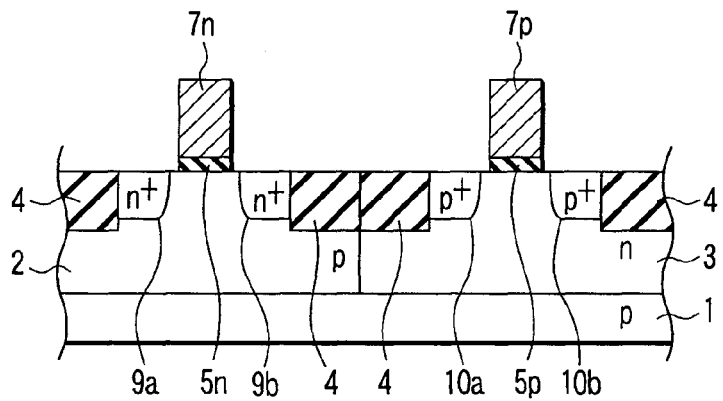
F I G. 11
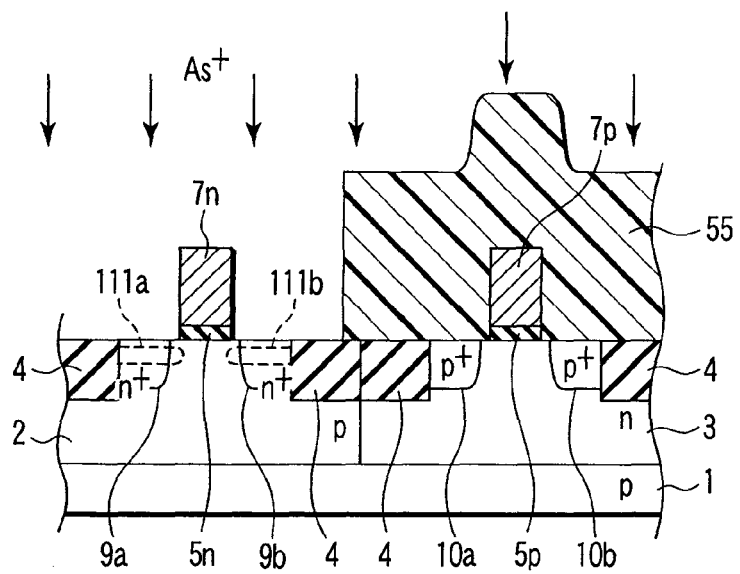
F I G. 12

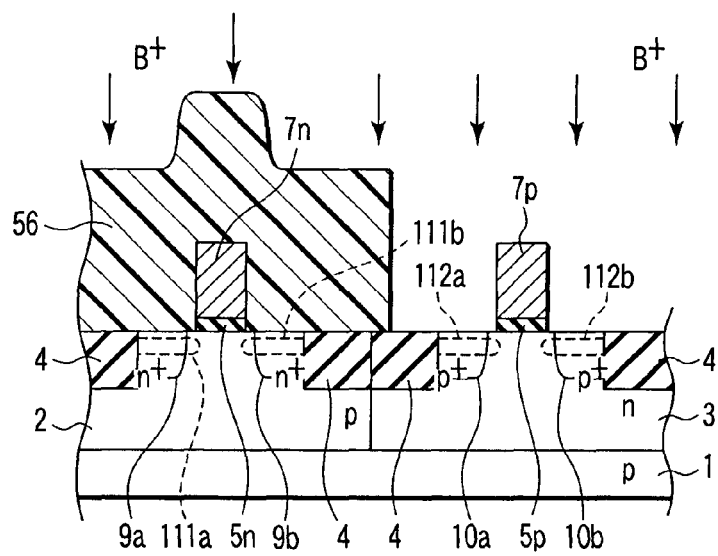
F I G. 13
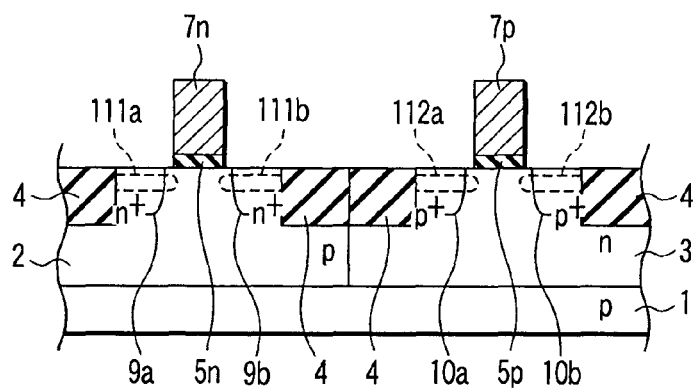
F I G. 14
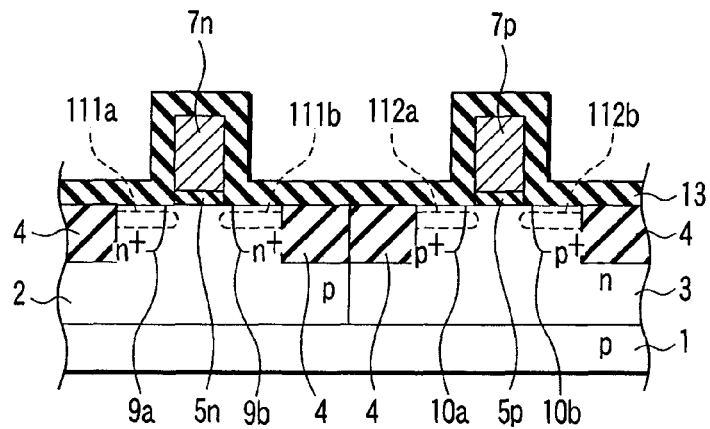
F I G. 15

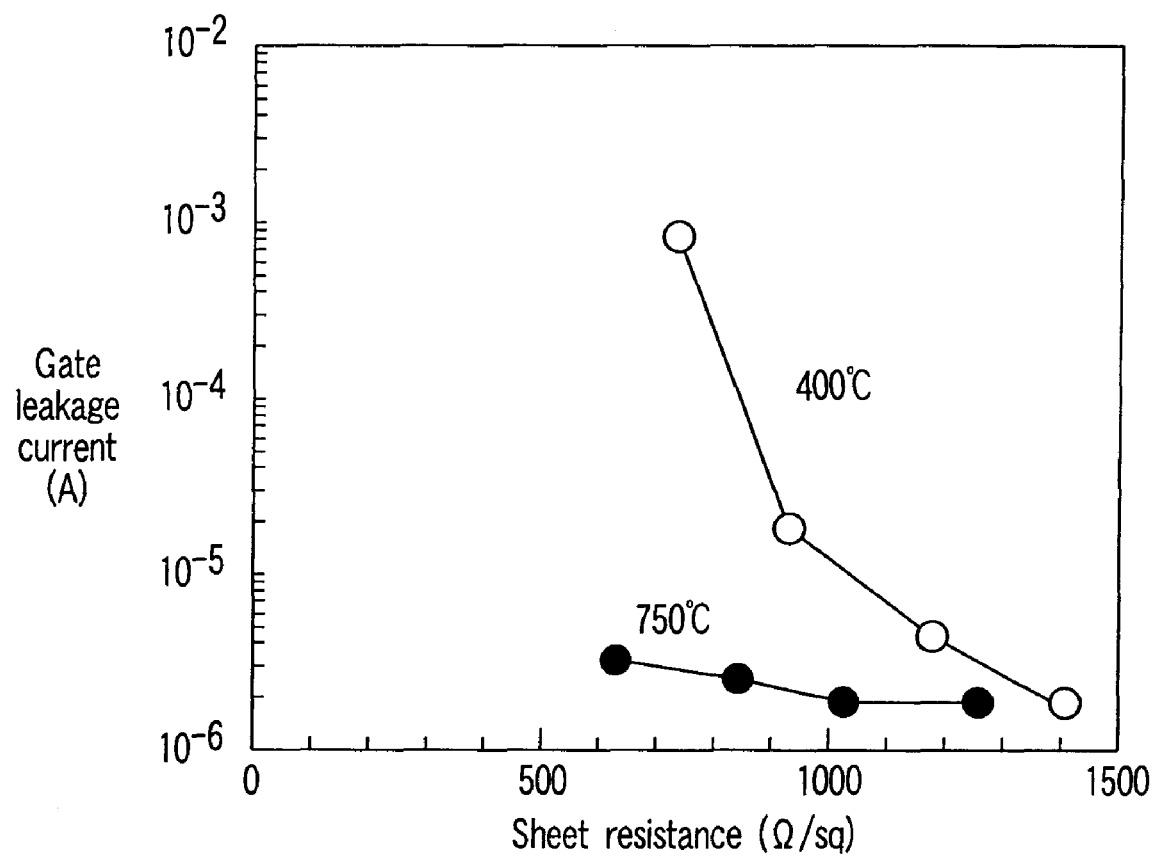
F I G. 25

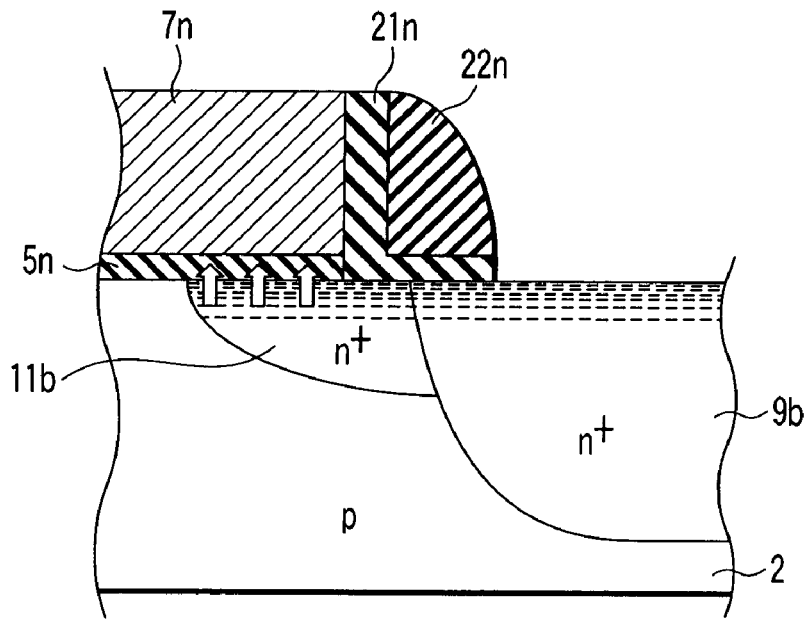
F I G. 35
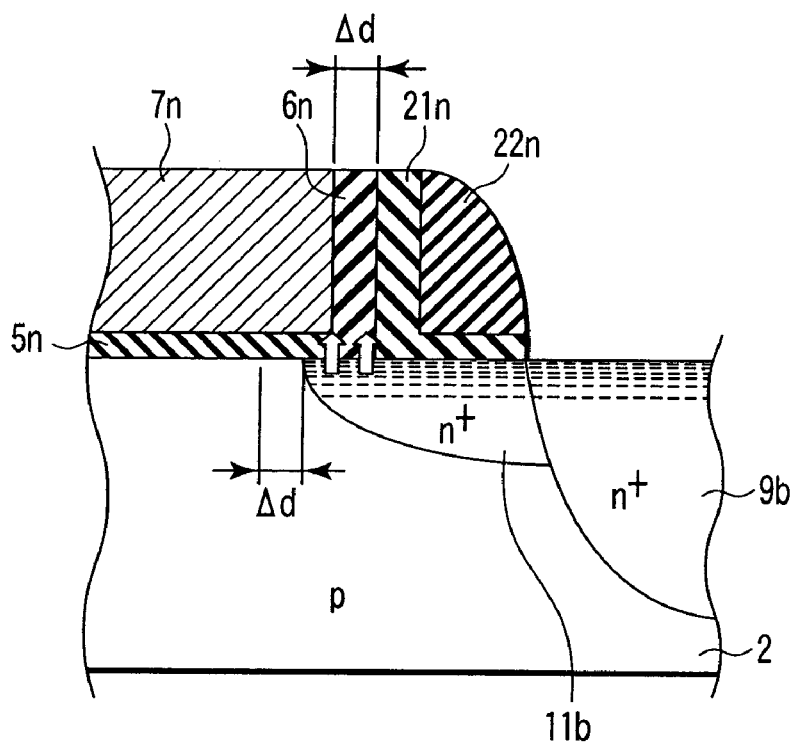
F I G. 36

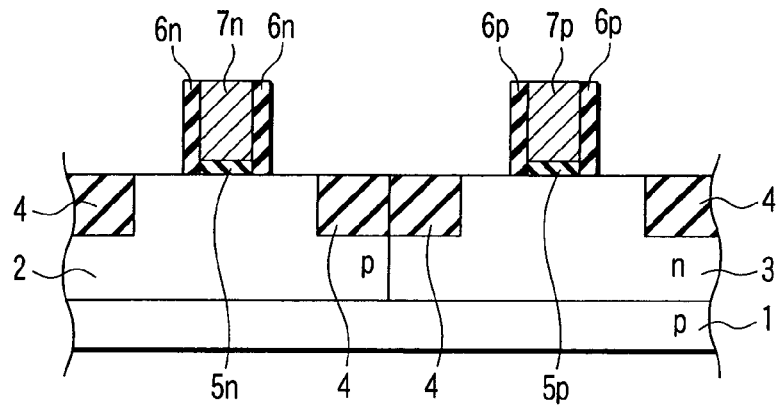
F I G. 37
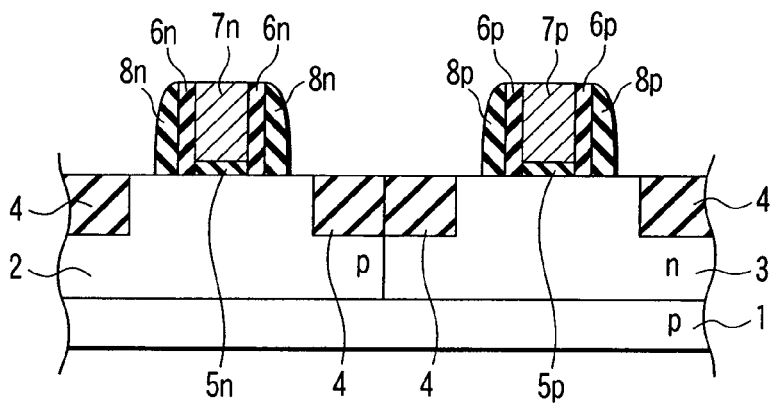
F I G. 38
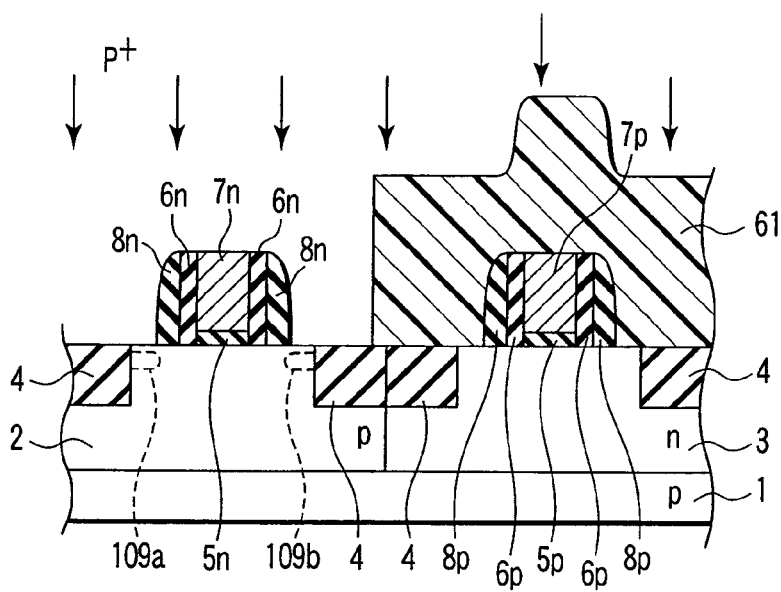
F I G. 39

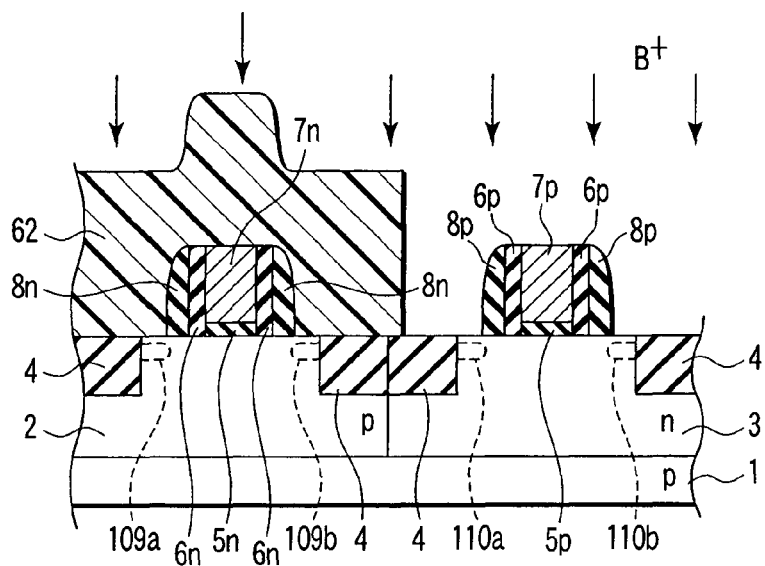
F I G. 40
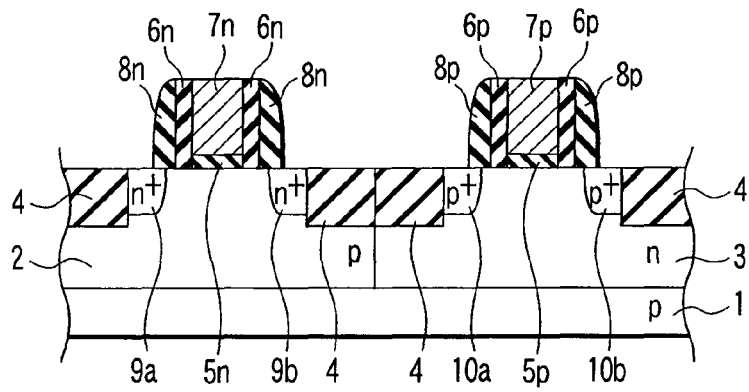
F I G. 41
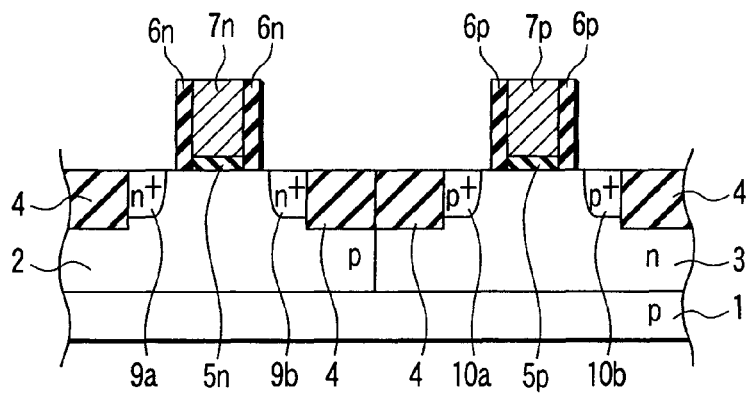
F I G. 42

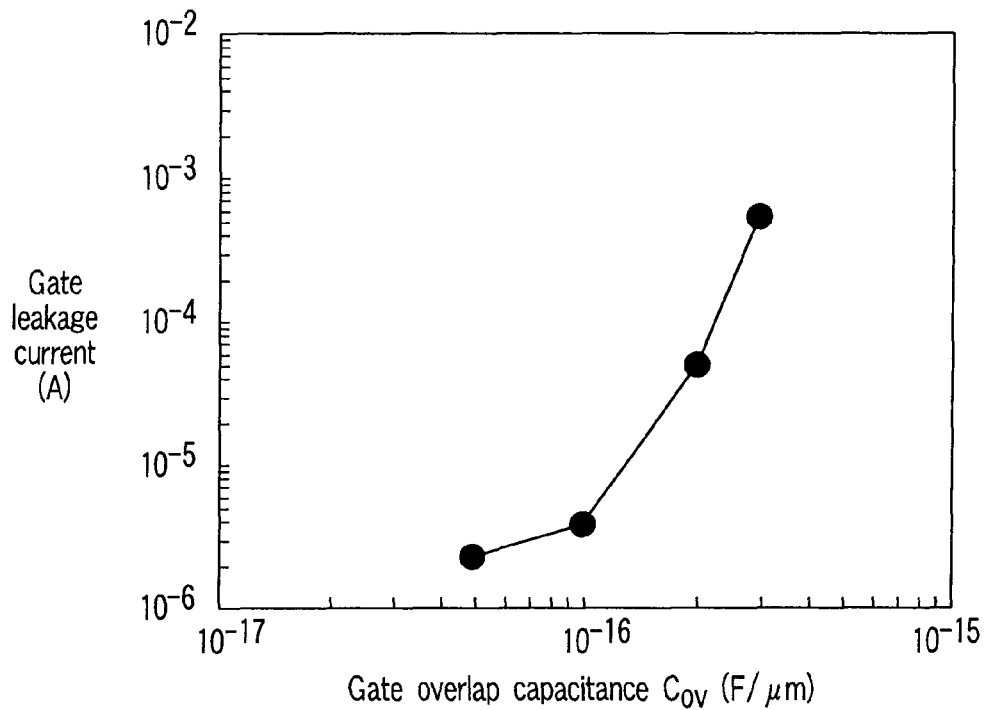
F I G. 50
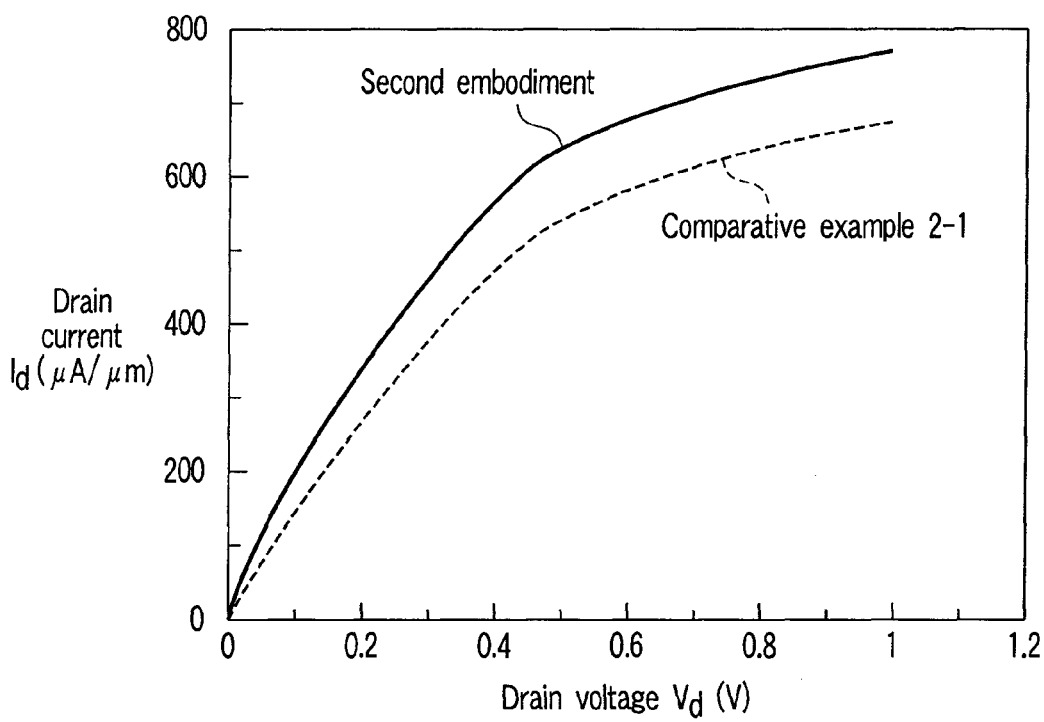
F I G. 51

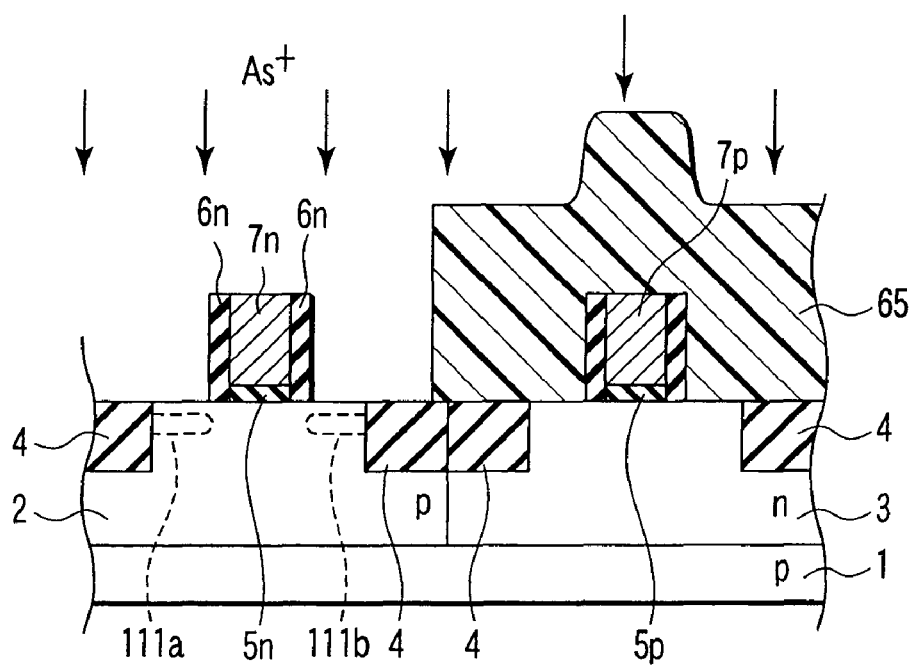
F I G. 53
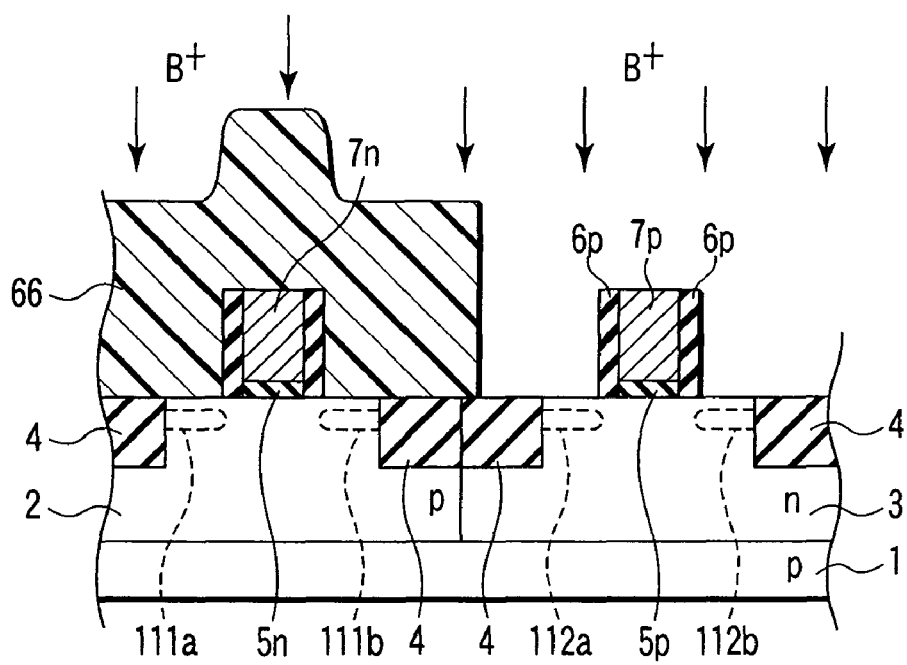
F I G. 54

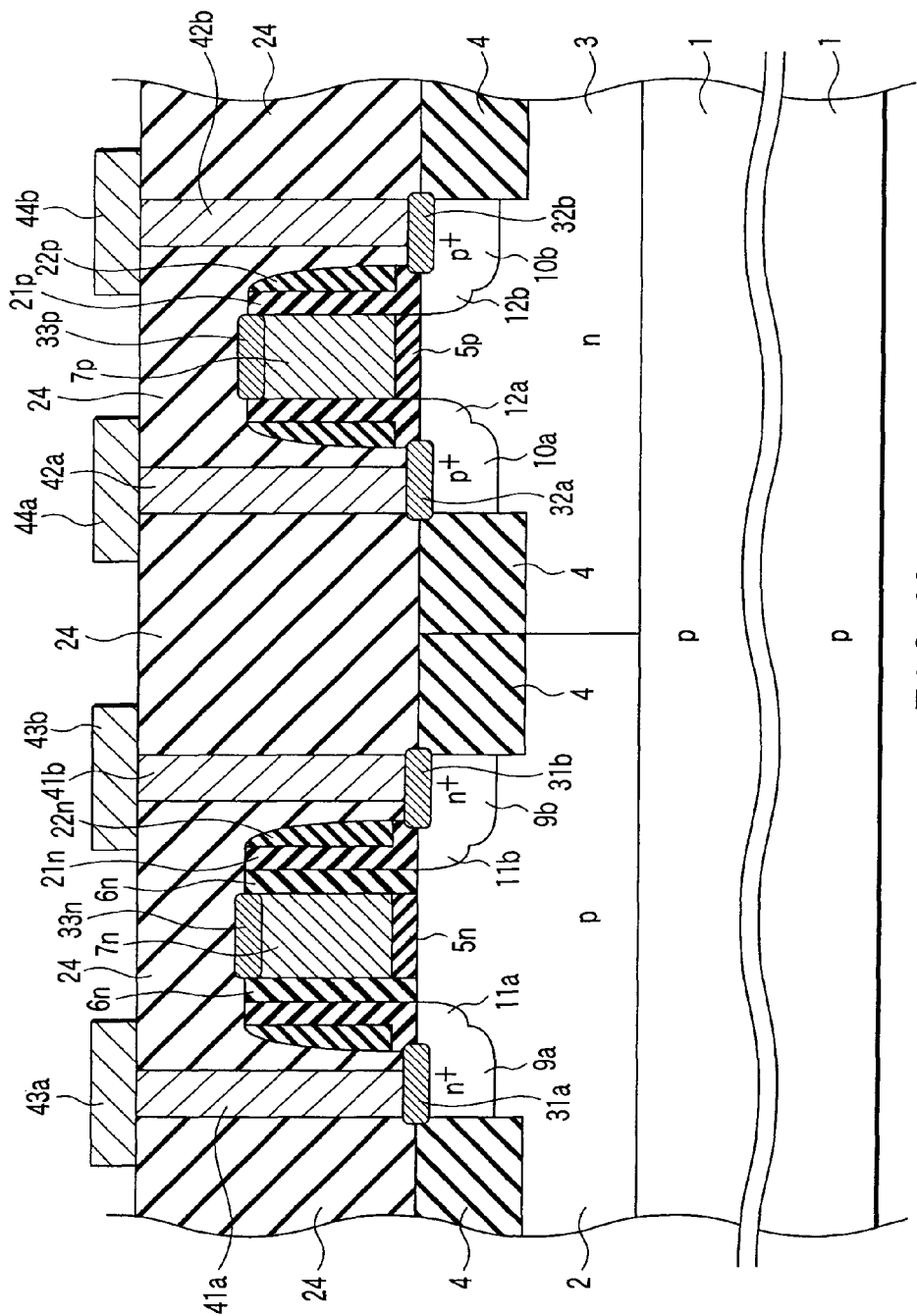
F I G. 60

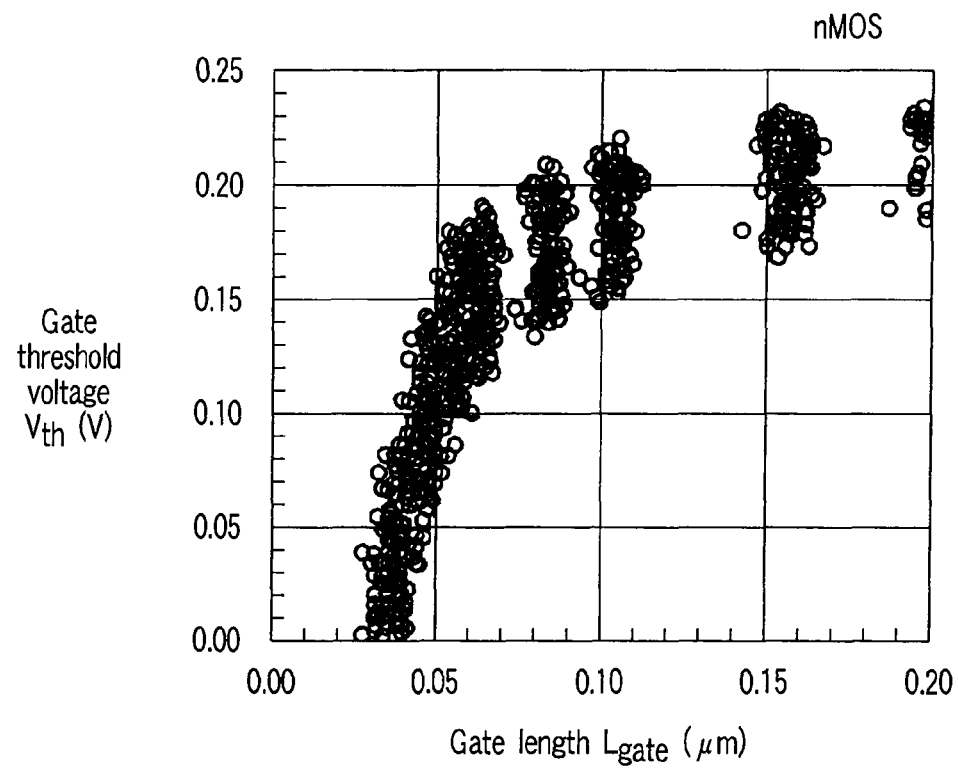
F I G. 63
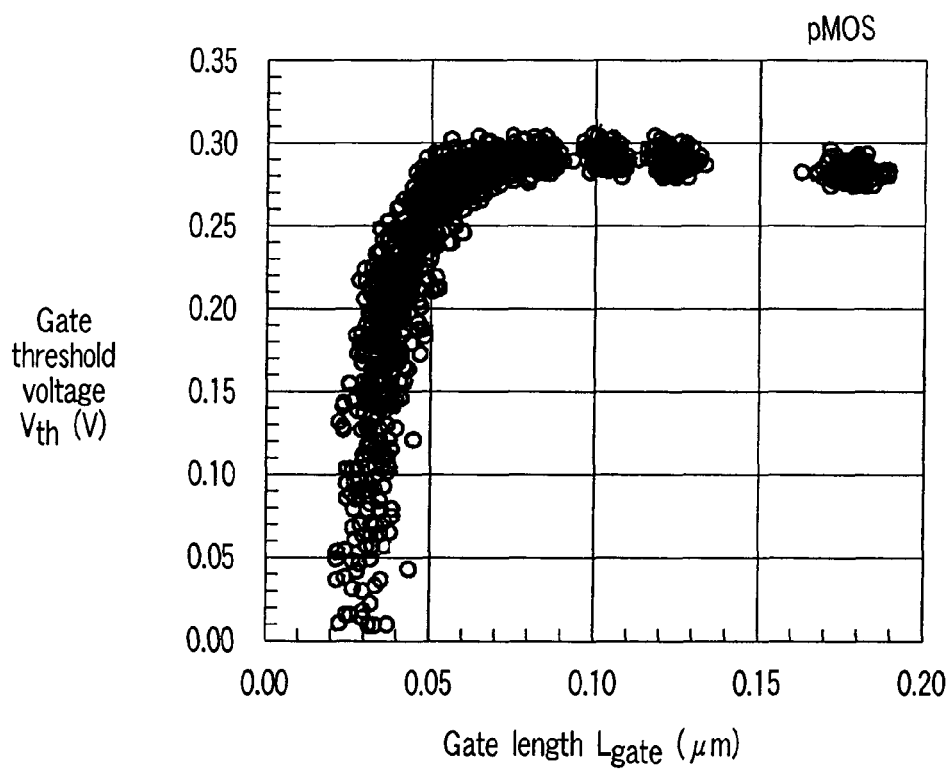
F I G. 64

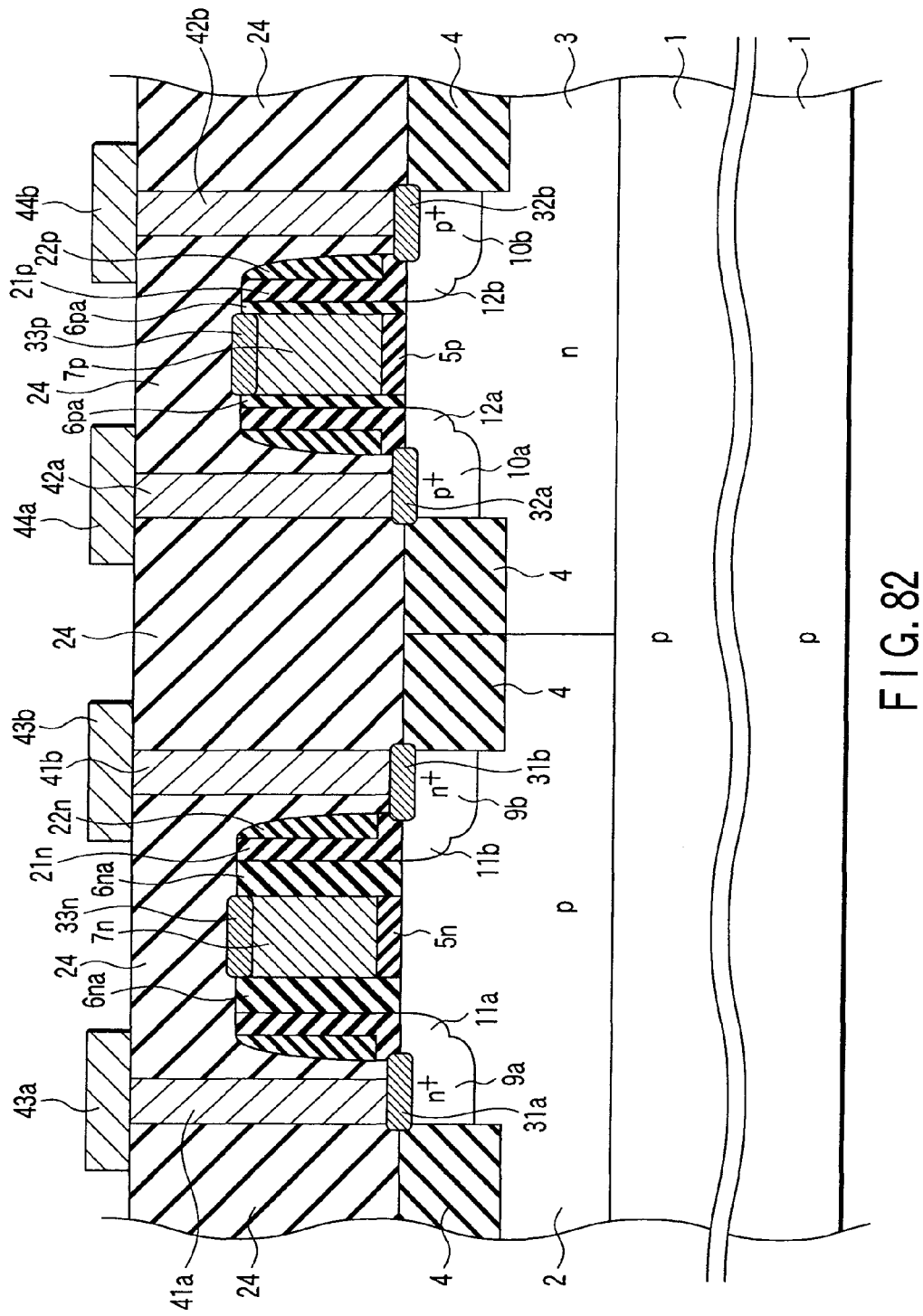
F I G. 82

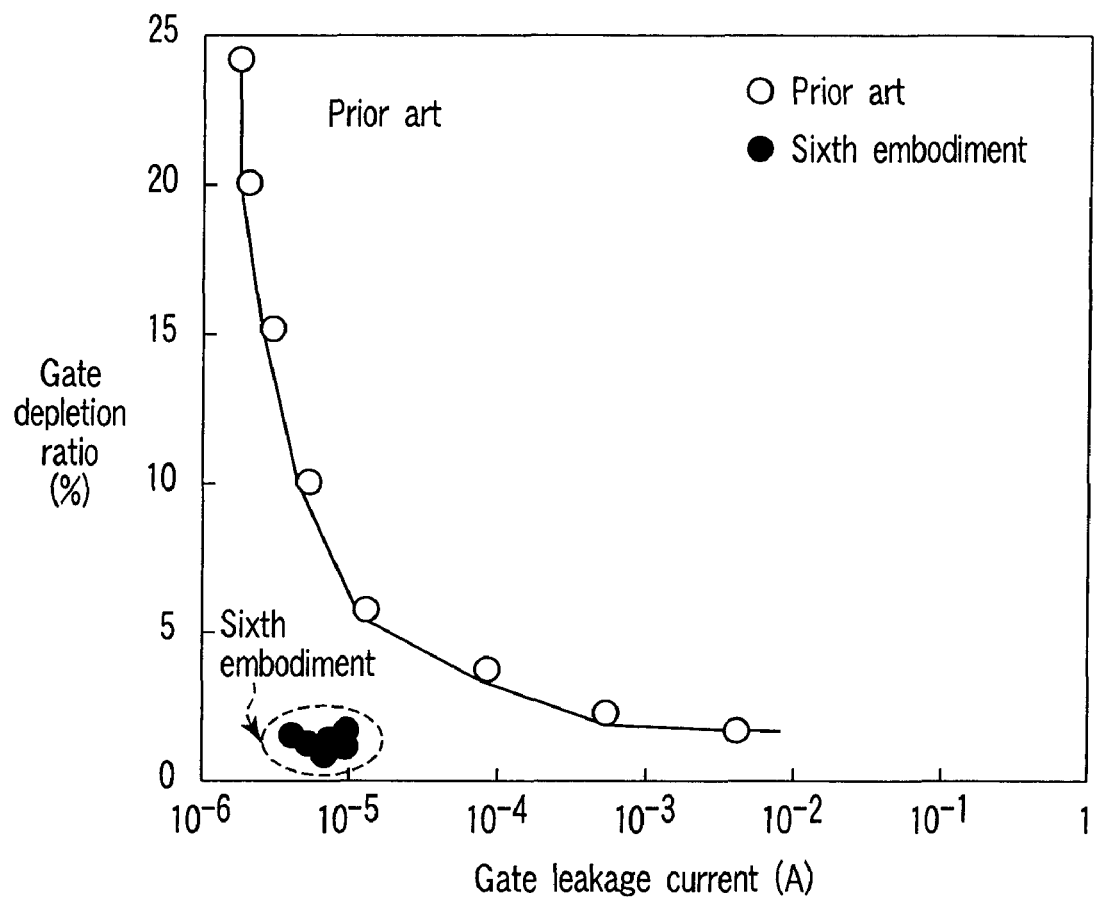
F I G. 102

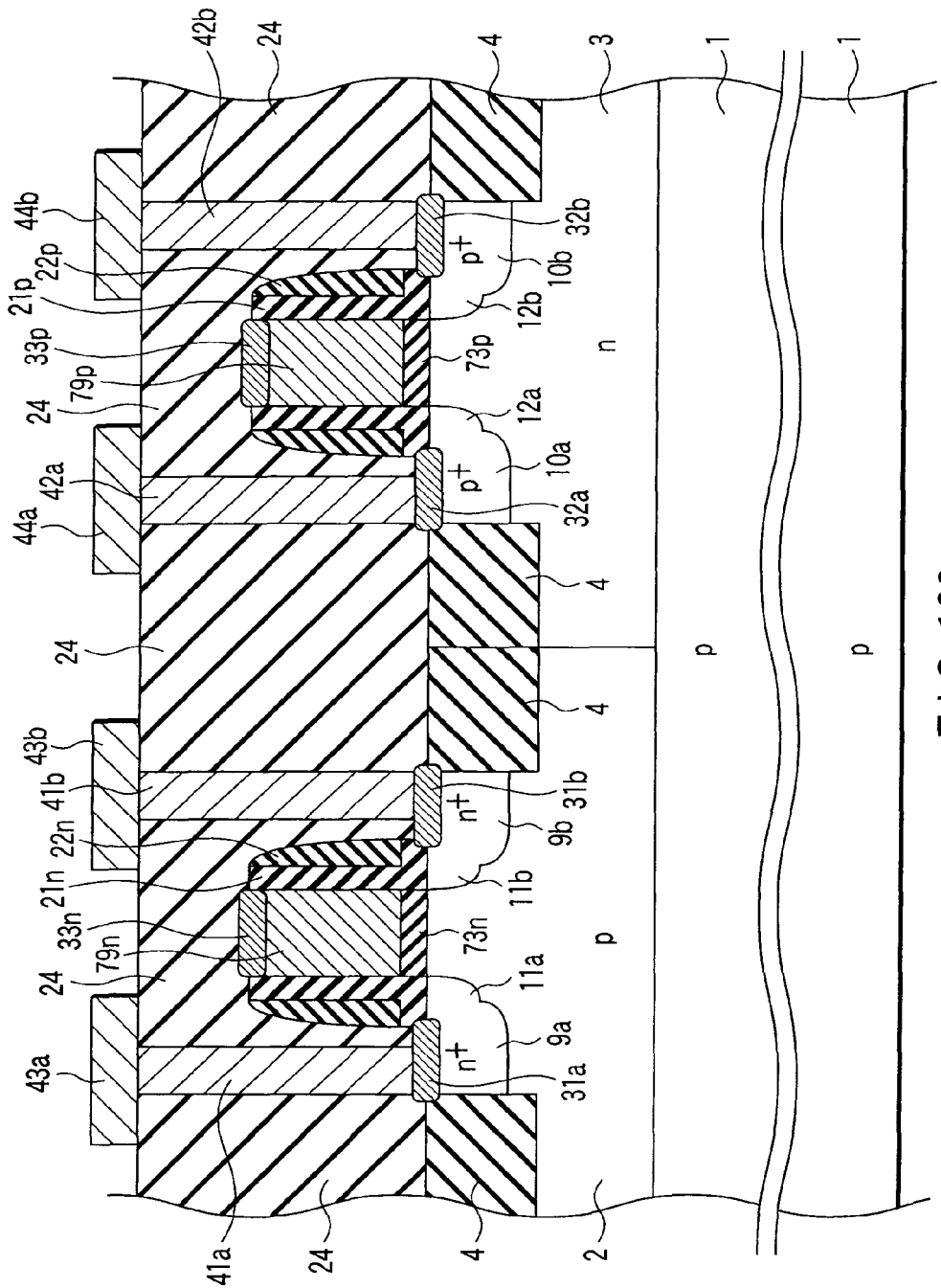
F I G. 103

| Group III | | Group IV | | Group V | |
|---|---|---|---|---|---|
| B | 0.088 | C | 0.077 | P | 0.110 |
| Al | 0.126 | Si | 0.117 | As | 0.118 |
| Ga | 0.126 | Ge | 0.122 | Sb | 0.136 |
| Tl | 0.147 | Sn | 0.146 | Bi | 0.146 |
F I G. 104
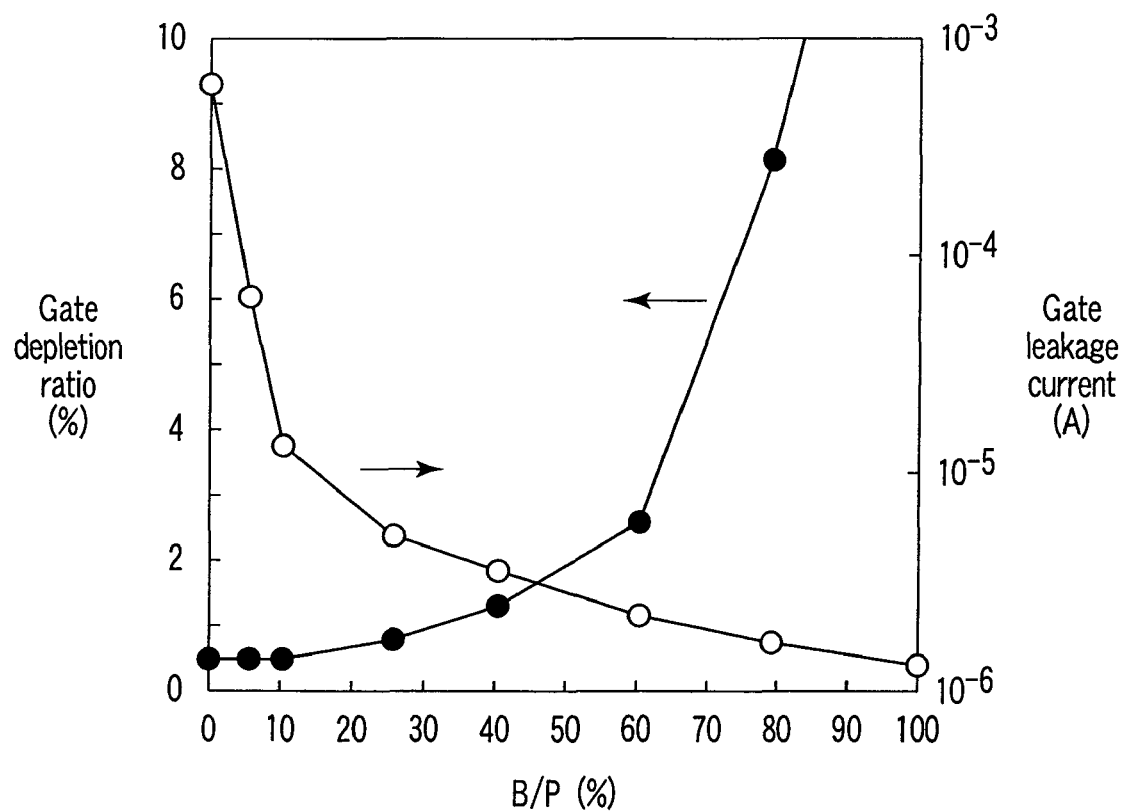
F I G. 105

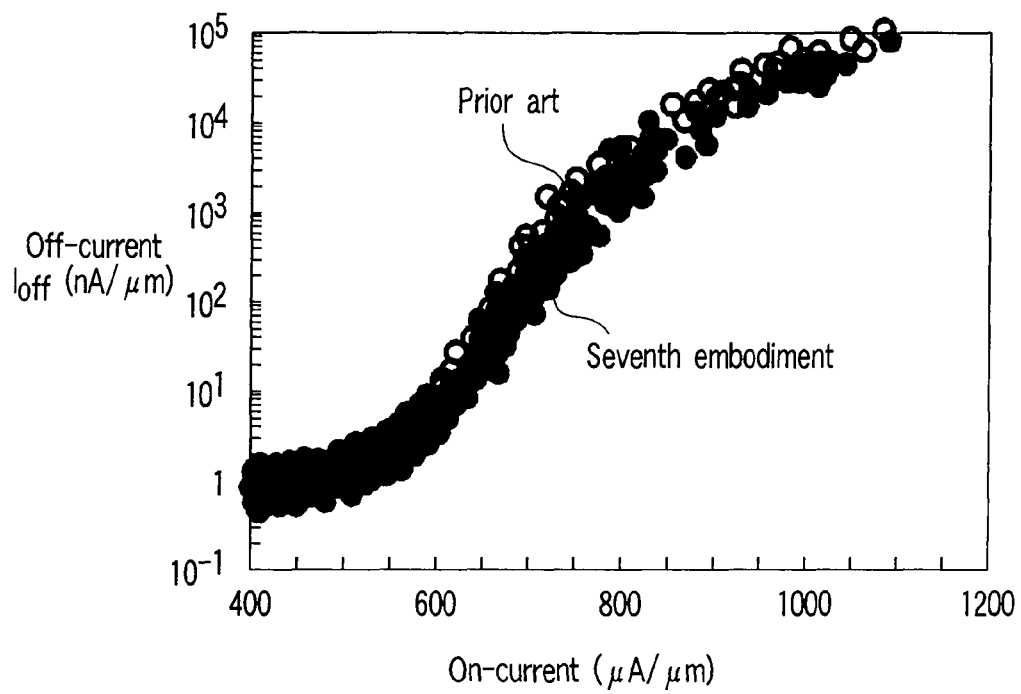
F I G. 107
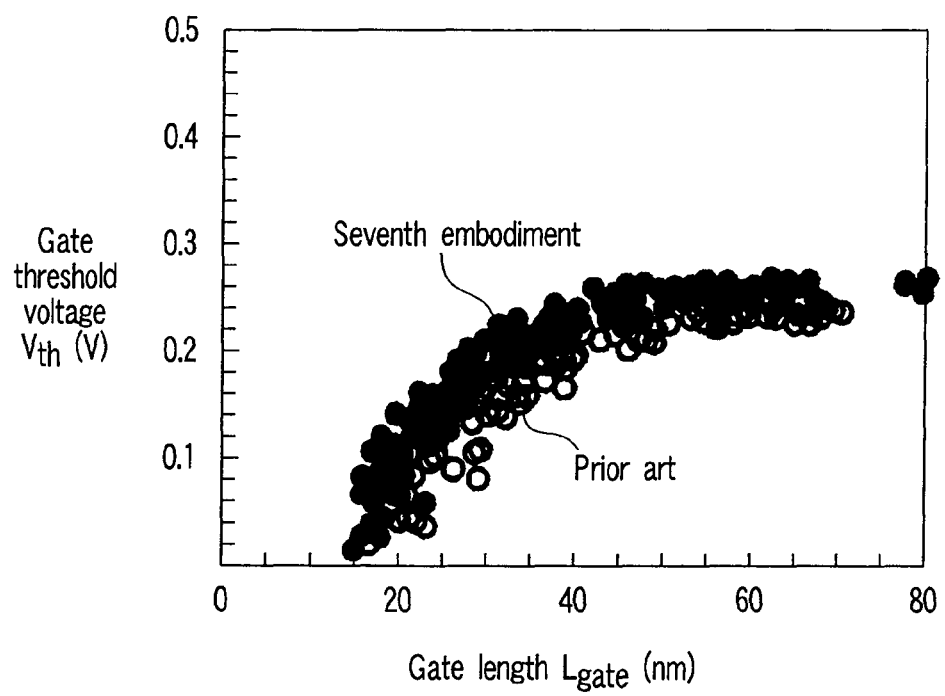
F I G. 108

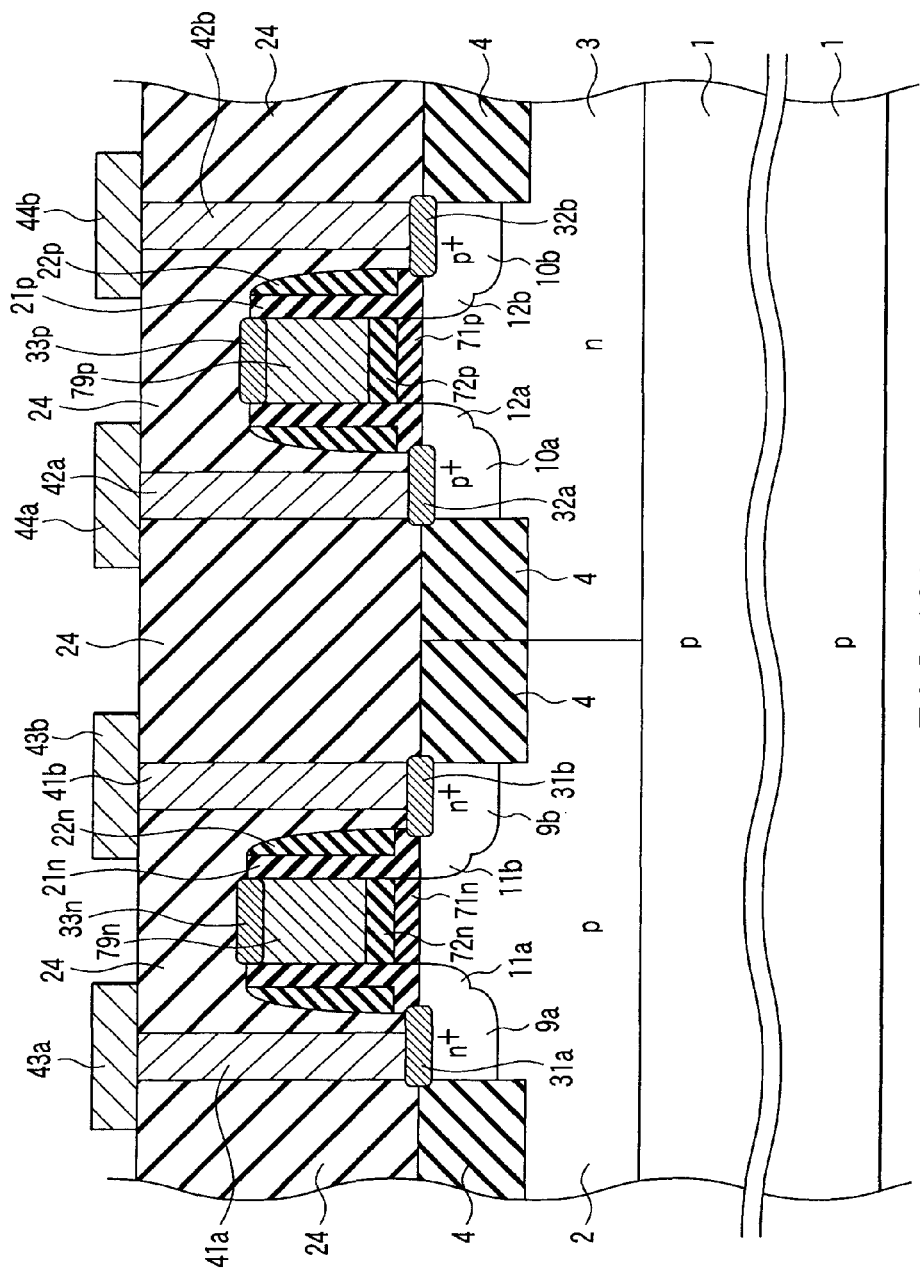
F I G. 121

SEMICONDUCTOR DEVICE WITH EXTENSION STRUCTURE AND METHOD FOR FABRICATING THE SAME

CROSS-REFERENCE TO RELATED APPLICATIONS

This application is a continuation of application Ser. No. 11/704,924, filed Feb. 12, 2007 now U.S. Pat. No. 7,781,848, which is based upon and claims the benefit of priority from prior Japanese Patent Application No. 2006-037107, filed Feb. 14, 2006, the entire contents of both of which are incorporated herein by reference.

BACKGROUND OF THE INVENTION

1. Field of the Invention

The present invention relates to a semiconductor device with reduced dimensions and a method for fabricating the semiconductor device. The invention relates, for example, to an insulated-gate transistor including a semiconductor gate electrode which is formed of, e.g., polycrystalline silicon (Si). In addition, the invention relates to a semiconductor device with a very fine structure, which includes an array of a great number of basic elements each formed of the above-mentioned insulated-gate transistor, and to a method for fabricating the semiconductor device.

2. Description of the Related Art

In a MOS integrated circuit, for instance, insulated-gate transistors are employed as basic elements. In a semiconductor device in which such basic elements are integrated at high density on a semiconductor chip, a parasitic resistance and a short-channel effect in each insulated-gate transistor increase as the basic elements become smaller in size. It is thus important to form the source/drain region of the insulated-gate transistor so that the source/drain region may have a low resistance and be shallow. In order to lower the resistance of an impurity diffusion region, it is necessary to sufficiently activate the impurity elements that are doped in the impurity diffusion region by, e.g., ion implantation. On the other hand, the impurity elements are diffused in the semiconductor region by annealing for activation (hereinafter referred to as an "activation annealing process"). It is thus necessary to perform the activation annealing process at high temperatures and at high speed.

As a method for instantaneously supplying thermal energy necessary for activating impurity elements, an optical annealing technique has been studied which employs a flashtube in which a rare gas such as xenon (Xe) is sealed, or a laser. Since the light source, which is used in the optical annealing technique, can emit light with a pulse width on the order of milliseconds, it is possible to activate the doped impurity ions with little diffusion. In the optical annealing technique, by increasing the irradiation light energy, the sheet resistance of the impurity diffusion layer can greatly be reduced and the defects due to ion implantation can be remedied. As a result, an enhancement in driving power of the insulated-gate transistor can be expected.

However, in the optical annealing technique, since high thermal energy is supplied instantaneously, heat tends not to escape from the polycrystalline Si on the gate insulation film and the temperature of the polycrystalline Si tends to increase. In particular, the following problem arises with an n-channel type insulated-gate transistor such as an nMOSFET. That is, in the activation annealing process using the optical annealing technique, the withstand voltage of the gate insulation film deteriorates before sufficient thermal energy is supplied to a single-crystal Si substrate. As a result, gate leakage current of the nMOSFET increases.

In order to solve this problem, Jpn. Pat. Appln. KOKAI Publication No. 2004-63574, for instance, discloses a method in which the dosage of impurities, which are ion-implanted in the polycrystalline Si layer, is reduced, or the kind of impurities is changed. According to this method, however, a capacitance forms due to depletion in a bottom part of the gate electrode that is formed of polycrystalline Si. As a result, the driving performance of the insulated-gate transistor deteriorates.

In short, there is a trade-off between the increase in impurity density (high concentration activation) in the source/drain region and gate electrode of the insulated-gate transistor, which includes the gate electrode formed of polycrystalline Si, and the suppression of the gate leakage current. Hence, in the activation annealing process using the conventional optical annealing technique, it has been difficult to secure a process window relating to the heat treatment step in the fabrication of the semiconductor device with the very fine structure, for which a shallow junction is required.

BRIEF SUMMARY OF THE INVENTION

A semiconductor device according to an aspect of the present invention includes:
 a semiconductor region of a first conductivity type;
 a source region of a second conductivity type which is formed in a surface portion of the semiconductor region;
 a drain region of the second conductivity type which is formed in a surface portion of the semiconductor region and is apart from the source region;
 a source extension region of the second conductivity type which is formed in a surface portion of the semiconductor region between the source region and the drain region, is in contact with the source region and is apart from the drain region, the source extension region having a depth from a surface of the semiconductor region, which is less than a depth of the source region from the surface of the semiconductor region;
 a drain extension region of the second conductivity type which is formed in a surface portion of the semiconductor region between the source extension region and the drain region, is in contact with the drain region and is apart from the source extension region, the drain extension region having a depth from the surface of the semiconductor region, which is less than a depth of the drain region from the surface of the semiconductor region;
 a first gate insulation film which is formed on the semiconductor region between the source extension region and the drain extension region and is formed of a silicon oxide film or a silicon oxynitride film having a nitrogen concentration of 15 atomic % or less;
 a second gate insulation film which is formed on the first gate insulation film and contains nitrogen at a concentration of between 20 atomic % and 57 atomic %; and
 a gate electrode which is formed of a semiconductor material of the second conductivity type on the second gate insulation film.

A method for fabricating a semiconductor device according to an aspect of the present invention includes:
 forming a gate insulation film on a semiconductor region of a first conductivity type;
 forming a semiconductor layer on the gate insulation film;
 forming a gate electrode by selecting etching the semiconductor layer;

doping a first impurity element of a second conductivity type in the semiconductor region in a self-alignment manner, by using the gate electrode as a mask;

performing a first annealing process for activating the first impurity element and forming a source region of the second conductivity type and a drain region of the second conductivity type, between which a part of the semiconductor region is interposed;

forming sidewall spacers on side walls of the gate electrode;

doping a second impurity element of the second conductivity type in the semiconductor region in a self-alignment manner, by using the gate electrode and the sidewall spacers as a mask; and performing a second annealing process for activating the second impurity element and forming, in the semiconductor region between the source region and the drain region, a source extension region of the second conductivity type having a depth from a surface of the semiconductor region, which is smaller than a depth of the source region from the surface of the semiconductor region, and a drain extension region of the second conductivity type having a depth from the surface of the semiconductor region, which is smaller than a depth of the drain region from the surface of the semiconductor region, the first annealing process and the second annealing process being performed in a temperature range of 1273 K to 1600 K for a heat treatment time which is specified in a range in a double-logarithmic graph with an upper limit expressed by $t=3\times10^{-15}$ exp (49000/T) and a lower limit expressed by $t=3\times10^{-17}$ exp (49000/T), where t is a heat treatment time and T is a heat treatment temperature (K).

BRIEF DESCRIPTION OF THE SEVERAL VIEWS OF THE DRAWING

FIG. 1 is a cross-sectional view that schematically shows a part of the structure of a semiconductor device according to a first embodiment of the present invention;

FIGS. 7 to 18 are cross-sectional views illustrating fourth to 15th fabrication steps of the semiconductor device according to the first embodiment of the invention;

FIG. 25 is a graph showing the relationship between gate leakage current and sheet resistance of the extension region, with an auxiliary heating temperature of the silicon substrate being used as a parameter;

FIG. 35 is an enlarged view of an insulated-gate transistor, and illustrates the function of an offset spacer;

FIG. 36 is an enlarged view of FIG. 34, and illustrates the function of the offset spacer;

FIGS. 37 to 47 are cross-sectional views illustrating first to eleventh fabrication steps of the semiconductor device according to the second embodiment of the invention;

FIG. 50 is a graph showing the relationship between gate leakage current and gate overlap capacitance in the n-channel insulated-gate transistor;

FIG. 51 is a graph showing the relationship between drain voltage and drain current in n-channel insulated-gate transistors according to the second embodiment and a comparative example;

FIGS. 53 to 59 are cross-sectional views illustrating first to seventh fabrication steps of a semiconductor device according to a modification of the second embodiment of the invention;

FIG. 60 is a cross-sectional view that schematically shows a part of the structure of a semiconductor device according to a third embodiment of the present invention;

FIG. 63 is a graph showing the relationship between gate length and gate threshold voltage in the n-channel insulated-gate transistors according to the third embodiment of the invention;

FIG. 64 is a graph showing the relationship between gate length and gate threshold voltage in the p-channel insulated-gate transistors according to the third embodiment of the invention;

FIG. 82 is a cross-sectional view that schematically shows a part of the structure of a semiconductor device according to a fourth embodiment of the present invention;

FIG. 102 is a graph showing the relationship between gate leakage current and gate depletion ratio in the n-channel insulated-gate transistors according to the sixth embodiment of the invention and conventional n-channel insulated-gate transistors;

FIG. 103 is a cross-sectional view that schematically shows a part of the structure of a semiconductor device according to a seventh embodiment of the present invention;

FIG. 104 is a diagram showing covalent bond radii of Group III to Group V elements;

FIG. 105 is a graph showing variations in gate depletion ratio and gate leakage current when the ratio of impurities of an opposite conductivity type (p-type) to impurities of a major conductivity type (n-type) is varied;

FIG. 107 is a graph showing the relationship between on-current and off-current in the n-channel insulated-gate transistors according to the seventh embodiment of the invention and conventional n-channel insulated-gate transistors;

FIG. 108 is a graph showing the relationship between gate length and gate threshold voltage in the n-channel insulated-gate transistors according to the seventh embodiment of the invention and conventional n-channel insulated-gate transistors;

FIG. 121 is a cross-sectional view of a semiconductor device according to a fourth modification of the seventh embodiment of the invention.

DETAILED DESCRIPTION OF THE INVENTION

Figure 2:
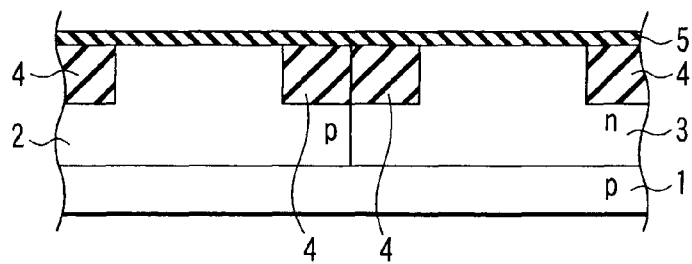
FIGS. 2 to 5 are cross-sectional views illustrating first to fourth fabrication steps of the semiconductor device according to the first embodiment of the invention.

First to seventh embodiments of the present invention will now be described with reference to the accompanying drawings. In the drawings, the same or similar parts are denoted by the same or like reference numerals. It should be noted, however, that the drawings are schematic ones, and the relationship between thickness and plan-view dimensions, the ratio of thicknesses of respective layers, etc., are different from actual ones. The specific thicknesses, dimensions, etc., should be determined in consideration of the descriptions below. Needless to say, the relationship or ratio in dimensions is partly different between the drawings. First to seventh embodiments, which will be described below, are mere examples of devices and methods which embody the technical concept of the present invention, and the materials, shapes, structures and arrangements of the structural parts, for instance, are not limited to those in the embodiments below.

First Embodiment

In the description below of a first embodiment of the invention, a first conductivity type and a second conductivity type are mutually opposite conductivity types. In the description of the first embodiment and modifications thereof, it is assumed that the first conductivity type is p-type and the second conductivity type is n-type. Alternatively, the first conductivity type may be n-type and the second conductivity type may be p-type. FIG. 1 is a cross-sectional view of a semiconductor device according to the first embodiment of the invention.

As shown in FIG. 1, the semiconductor device has a CMOS structure including an nMOSFET and a pMOSFET. Specifically, a semiconductor region (p-well region) 2 of a first conductivity type (p-type) and a semiconductor region (n-well region) 3 of a second conductivity type (n-type), which are adjacent to each other, are formed on an upper surface portion of a silicon (Si) substrate 1 of the first conductivity type (p-type). An nMOSFET is formed on the p-well region 2 and a pMOSFET is formed on the n-well region 3.

The CMOS structure becomes, for example, a basic device of a semiconductor integrated circuit such as an LSI. Although not shown, the p-well region 2 and n-well region 3 are so formed as to extend in a direction perpendicular to the sheet surface of FIG. 1. In other words, the p-well region 2 and n-well region 3 are formed such that their plan-view patterns have stripe shapes. For example, a cyclic structure, such as a gate array, is formed. Regardless of the cyclic arrangement or non-cyclic arrangement, various plan-view layouts can be adopted.

Device isolation regions 4 are formed in surface portions of the n-well region 3 and p-well region. The device isolation regions 4 are so formed as to surround the n-well region 3 and p-well region 2 in such a fashion that their upper surfaces (plan-view patterns) have rectangular ring shapes (picture-frame shapes). Regions surrounded by the device isolation regions 4 become insular active regions AA. The nMOSFET and pMOSFET are formed on the active regions AA of the p-well region 2 and n-well region 3, respectively. The active regions, which appear on the cross section of FIG. 1, are electrically insulated by the device isolation regions 4 from other active regions AA which neighbor in a direction perpendicular to the sheet surface of FIG. 1.

Next, the structures of the nMOSFET and pMOSFET are described. To begin with, the nMOSFET is described. As shown in FIG. 1, a source region 9a and a drain region 9b, which are of the second conductivity type (n-type), are formed in upper surface portions of the p-well region 2 and are opposed to each other so as to sandwich an upper surface portion of the p-well region 2, which becomes a channel region. The source region 9a and drain region 9b extend in the direction perpendicular to the sheet surface of FIG. 1. A source extension region 11a and a drain extension region 11b, which are of the second conductivity type (n-type) and have shallower junctions than the source region 9a and drain region 9b, are formed at front faces of the source region 9a and drain region 9b, which are opposed to the channel region. Thereby, a lightly doped drain (LDD) structure is formed. In the LDD structure, the effective gate length of the nMOSFET is defined by the length of the p-well region 2 between the source extension region 11a and drain extension region 11b. The source extension region 11a and drain extension region 11b extend in the direction perpendicular to the sheet surface of FIG. 1. The gate width of the nMOSFET is defined by the lengths of the source extension region 11a and drain extension region 11b which extend in the direction perpendicular to the sheet surface of FIG. 1. The junction depth of each of the source extension region 11a and drain extension region 11b is set at 20 nm or less.

A gate insulation film 5n of the nMOSFET is formed on the surface of the p-well region 2 which becomes the channel region between the source extension region 11a and drain extension region 11b. A gate electrode 7n, which is formed of a polycrystalline Si film or a polycrystalline SiGe (Ge concentration: 10 to 30 atomic %) film, is formed on the gate insulation film 5n. In the description below, the term "semiconductor polycrystalline film" is used to refer to the concept including a polycrystalline Si film and a polycrystalline SiGe film. The semiconductor polycrystalline film may include a composite film of the polycrystalline Si film and polycrystalline SiGe film, and may further include polycrystalline films of other semiconductors such as SiC and SiSn. Phosphorus (P) is doped in the gate electrode 7n at an impurity density of about $1 \times 10^{20}$ cm$^{-3}$ to $5 \times 10^{20}$ cm$^{-3}$. Preferably, P is doped in the gate electrode 7n at an impurity density of about $1 \times 10^{20}$ cm$^{-3}$ to $4 \times 10^{20}$ cm$^{-3}$. More preferably, P, together with arsenic (As) or antimony (Sb), is doped in the gate electrode 7n which is formed of a semiconductor polycrystalline film, and the total dosage is, in terms of impurity density, about $1 \times 10^{20}$ cm$^{-3}$ to $5 \times 10^{20}$ cm$^{-3}$, and more preferably about $1 \times 10^{20}$ cm$^{-3}$ to $4 \times 10^{20}$ cm$^{-3}$. In addition, it is preferable that the impurity density of As or Sb be higher than that of P so that As or Sb may become a major component in the gate electrode 7n. Sidewall spacers 21n are formed of silicon oxide films on the side surfaces of the gate electrode 7n and gate insulation film 5n of the nMOSFET so as to sandwich the gate electrode 7n and gate insulation film 5n. Further, sidewall spacers 22n are formed of silicon nitride films on the side surfaces of the sidewall spacers 21n so as to sandwich the sidewall spacers 21n.

Next, the structure of the pMOSFET is described. As shown in FIG. 1, a drain region 10a and a source region 10b, which are of the first conductivity type (p-type), are formed in upper surface portions of the n-well region 3 and are opposed to each other so as to sandwich an upper surface portion of the n-well region 3, which becomes a channel region. The drain region 10a and source region 10b extend in the direction perpendicular to the sheet surface of FIG. 1. A drain extension region 12a and a source extension region 12b, which are of the first conductivity type (p-type) and have shallower junctions than the drain region 10a and source region 10b, are formed at front faces of the drain region 10a and source region 10b, which are opposed to the channel region. Thereby, an LDD structure is formed. In the LDD structure, the effective gate length of the pMOSFET is defined by the length of the n-well region 3 between the drain extension region 12a and source extension region 12b. The drain extension region 12a and source extension region 12b extend in the direction perpendicular to the sheet surface of FIG. 1. The gate width of the pMOSFET is defined by the lengths of the drain extension region 12a and source extension region 12b which extend in the direction perpendicular to the sheet surface of FIG. 1. The junction depth of each of the drain extension region 12a and source extension region 12b is also set at 20 nm or less.

A gate insulation film 5p is formed on the surface of the n-well region 3 which becomes the channel region between the drain extension region 12a and source extension region 12b of the pMOSFET. A gate electrode 7p is formed of a semiconductor polycrystalline film on the gate insulation film 5p. Boron (B) is doped in the gate electrode 7p, which is formed of the semiconductor polycrystalline film, at an impurity density of about $1 \times 10^{20}$ cm$^3$ to $5 \times 10^{20}$ cm$^{-3}$, and more preferably at an impurity density of about $1 \times 10^{20}$ cm$^{-3}$ to $4 \times 10^{20}$ cm$^{-3}$. A pair of sidewall spacers 21p are formed of silicon oxide films on the side surfaces of the gate electrode 7p and gate insulation film 5p of the pMOSFET so as to sandwich the gate electrode 7p and gate insulation film 5p. Further, sidewall spacers 22p are formed so as to sandwich the outer surfaces of the pair of opposed sidewall spacers 21p.

In the above-described nMOSFET and pMOSFET, the sidewall spacers of the stacked structure including the silicon oxide film 21n, 21p and silicon nitride film 22n, 22p may be replaced with sidewall spacers of a single-layer structure including only the silicon oxide film or the silicon nitride film. The thickness of the insulation film, which becomes the sidewall spacer, is set at 20 to 40 nm as a total thickness of the silicon oxide film and silicon nitride film combined. The sidewall spacers 21n, 21p, 21p, 22p function to prevent a metal silicide reaction in a saliciding process.

Further, in the above-described nMOSFET and pMOSFET, a silicide (NiSi$_x$, CoSi$_x$, PtSi$_x$, PdSi$_x$, WSi$_x$, TiSi$_x$, MoSi$_x$) layer 31a of a high-melting-point metal, such as nickel (Ni), cobalt (Co), platinum (Pt), palladium (Pd), tungsten (W), titanium (Ti) or molybdenum (Mo), is formed on the surface of the source region 9a, and a similar metal silicide layer 31b is formed on the surface of the drain region 9b. In like manner, a metal silicide layer 32a is formed on the surface of the drain region 10a, and a metal silicide layer 32b is formed on the surface of the source region 10b. Moreover, a metal silicide layer 33n is formed on top of the gate electrode 7n of the nMOSFET, and a metal silicide layer 33p is formed on top of the gate electrode 7p of the pMOSFET. Thereby, each of the nMOSFET and pMOSFET forms a salicide structure.

An interlayer insulation film 24 is formed over the silicon substrate 1 so as to cover the nMOSFET and pMOSFET having the above-described structures. A wiring 43a for the nMOSFET is connected to the metal silicide layer 31a via a contact plug 41a which is buried in a contact hole that is made in the interlayer insulation film 24. To be more specific, the wiring 43a for the nMOSFET is electrically connected to the source region 9a of the nMOSFET. In addition, a wiring 43b for the nMOSFET is connected to the metal silicide layer 31b via a contact plug 41b which is buried in a contact hole that is made in the interlayer insulation film 24. To be more specific, the wiring 43b for the nMOSFET is electrically connected to the drain region 9b of the nMOSFET.

Besides, a wiring 44a for the pMOSFET is connected to the metal silicide layer 32a via a contact plug 42a which is buried in a contact hole that is made in the interlayer insulation film 24. To be more specific, the wiring 44a for the pMOSFET is electrically connected to the drain region 10a of the pMOSFET. In addition, a wiring 44b for the pMOSFET is connected to the metal silicide layer 32b via a contact plug 42b which is buried in a contact hole that is made in the interlayer insulation film 24. To be more specific, the wiring 44b for the pMOSFET is electrically connected to the source region 10b of the pMOSFET.

Although not shown, on the far side of the sheet surface of FIG. 1, a gate wiring is connected to the metal silicide layer 33n, 33p on top of the gate electrode 7n, 7p via a contact plug which is buried in a contact hole formed in the interlayer insulation film 24.

In the semiconductor device according to the first embodiment of the present invention, the dosage of P in the gate electrode 7n of the semiconductor polycrystalline film of the nMOSFET is reduced to about $5 \times 10^{20}$ cm$^{-3}$ or less, preferably about $4 \times 10^{20}$ cm$^{-3}$. Thus, pile-up or punch-through of P to the gate insulation film 5n can be suppressed. Hence, in a method for fabricating the semiconductor device according to the first embodiment of the invention, as will be described later, the irradiation energy of very rapid optical annealing can be increased. As a result, it becomes possible to perform, while suppressing gate leakage current, high-concentration activation and defect remedy in the source extension region 11a, 12b and the drain extension region 11b, 12a. Therefore, the process window relating to the heat treatment step in the method for fabricating the semiconductor device according to the first embodiment is increased, and the high-performance, fine-structure semiconductor device can easily be provided.

Next, referring to FIGS. 2 to 18, a method for fabricating the semiconductor device according to the first embodiment of the invention is described. FIGS. 2 to 18, excluding FIG. 6, are cross-sectional views which successively illustrate fabrication steps of the semiconductor device shown in FIG. 1. The method for fabricating the semiconductor device, which will be described below, is merely an example, and the semiconductor device may also be fabricated by other various fabrication methods including modifications of this method. For example, in the description below, a salicide (self-aligned silicide) structure is realized by using Ni silicide (Ni$_2$Si, NiSi$_x$) as an example of a silicide of a high-melting-point metal. Needless to say, other silicides, such as CoSi$_x$, PtSi$_x$, PdSi$_x$, WSi$_x$, TiSi$_x$, MoSi$_x$, may be used. In the description below, the gate electrode 7n, 7p is formed of a polycrystalline Si film by way of example. The gate electrode 7n, 7p may be formed of a polycrystalline SiGe (Ge concentration: 10 to 30 atomic %) film, a polycrystalline SiSn (Sn concentration: 2 to 10 atomic %) film, etc. Needless to say, the gate electrode may be a single-crystal semiconductor layer, or a metal gate. Besides, the gate electrode may be an amorphous semiconductor layer.

To start with, as shown in FIG. 2, a p-well region 2 is formed in an nMOSFET region of a p-type Si substrate 1, and an n-well region 3 is formed in a pMOSFET region which neighbors the nMOSFET region. Device isolation insulation films are buried in device isolation trenches, which are formed in the Si substrate 1, and thus device isolation regions 4 are formed around the p-well region 2 and n-well region 3 (the p-well region 2 and n-well region 3 may be formed after the device isolation regions 4 are formed). A silicon oxide film, which becomes a gate insulation film 5, is formed on the surface of the Si substrate 1.

Figure 3:
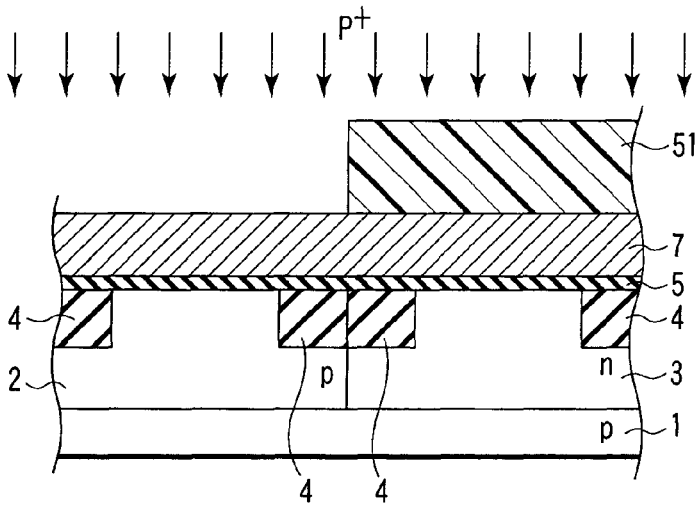

Subsequently, as shown in FIG. 3, a polycrystalline Si film 7 with a thickness of 100 nm, which becomes gate electrodes, is formed on the gate insulation film 5. Using a photoresist film 51 as a mask, atoms of Group V, e.g., phosphorus (P), which become n-type impurities, are ion-implanted in the nMOSFET region at a concentration of $1 \times 10^{20}$ cm$^{-3}$ or more.

Figure 4:
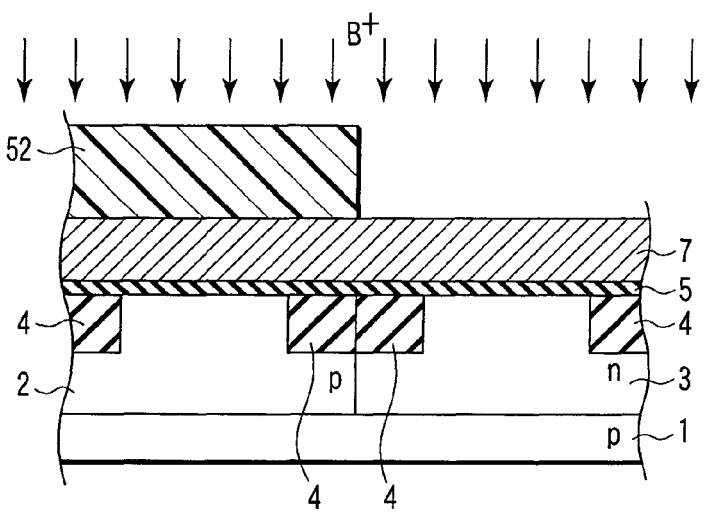

Then, using a photoresist film 52 as a mask, as shown in FIG. 4, atoms of Group III, e.g., boron (B), which become p-type impurities, are ion-implanted in the pMOSFET at a concentration of $1 \times 10^{20}$ cm$^{-3}$ or more.

Figure 5:
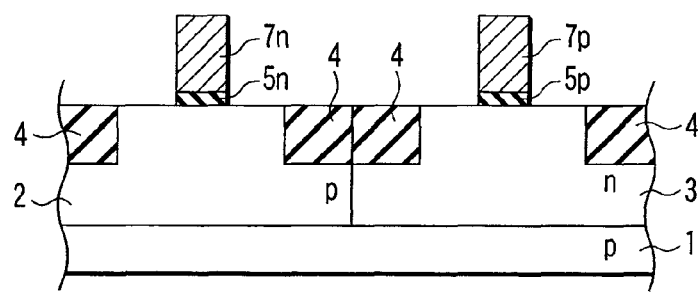
Figure 6:
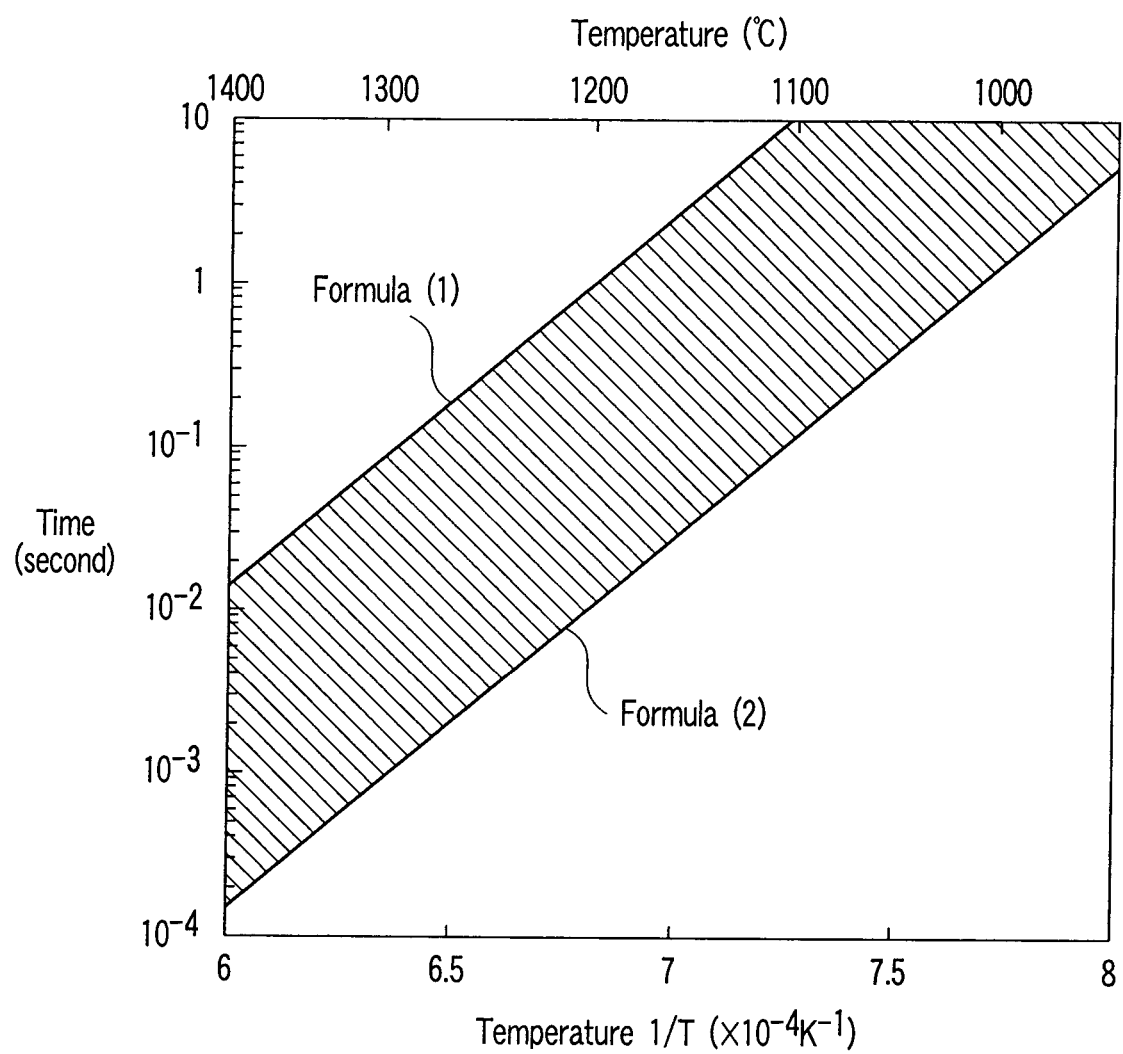
FIG. 6 is a graph showing the relationship between heat treatment temperature and heat treatment time, which are suitable for activation annealing in the first embodiment of the invention.

As shown in FIG. 5, the polycrystalline Si film 7 and gate insulation film 5 are selectively processed (patterned) by successive reactive ion etching (RIE) in the same vacuum chamber (reaction chamber). Thereby, a gate electrode 7n for an nMOSFET, a gate insulation film 5n lying under the gate electrode 7n or the nMOSFET, a gate electrode 7p for a pMOSFET and a gate insulation film 5p lying under the gate electrode 7p for the pMOSFET are formed.

Following the above step, the impurities which have been implanted in the steps of FIGS. 3 and 4 are diffused. The conditions for the heat treatment are explained with reference to FIG. 6. FIG. 6 is a double-logarithmic graph in which a heat treatment temperature is plotted on the abscissa and a heat treatment time is plotted on the ordinate. In this step, the heat treatment is performed so as to meet conditions in a region indicated by hatching in FIG. 6. For example, rapid thermal annealing (RTA) is conducted in a retention time of 10 seconds or less under the condition of 1100° C. or below, e.g., 1000° C. to 1050° C. Alternatively, heat treatment is conducted by spike RTA at 1000° C. to 1050° C. Thereby, the impurities, which are ion-implanted in the steps of FIGS. 3 and 4, are diffused uniformly in the entire polycrystalline Si layer, of which the gate electrode 7n for the nMOSFET and the gate electrode 7p for the pMOSFET are formed, so that the diffusion may reach the interface with the gate insulation films 5n, 5p. The region indicated by hatching in FIG. 6 is a region in a range having an upper limit expressed by the following equation (1) and a lower limit expressed by the following equation (2):

$$t = 3 \times 10^{-15} \exp(49000/T) \tag{1}$$

$$t = 3 \times 10^{-17} \exp(49000/T) \tag{2}$$

where t is the heat treatment time, and T (K) is the heat treatment temperature expressed by an absolute temperature.

Figure 7:
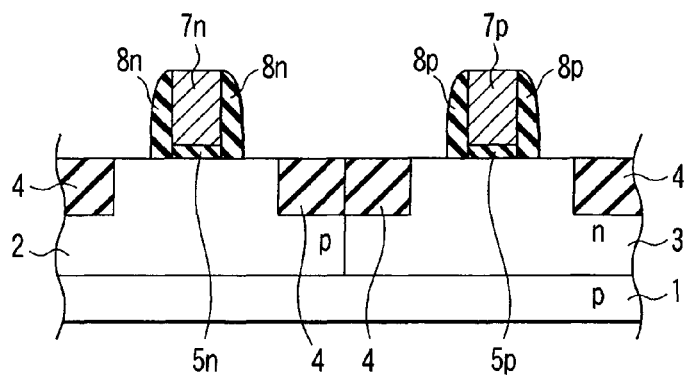

Subsequently, as shown in FIG. 7, a silicon nitride ($Si_3N_4$) film is deposited on the gate electrode 7n for the nMOSFET and gate electrode 7p for the pMOSFET by low-pressure chemical vapor deposition (LPCVD). The silicon nitride film is then etched by RIE and selectively left on side surfaces of the gate electrode 7n and gate insulation film 5n and on side surfaces of the gate electrode 7p and gate insulation film 5p. Thereby, sidewall spacers 8n and 8p, which are formed of the silicon nitride film, are formed, as shown in FIG. 7.

Figure 8:
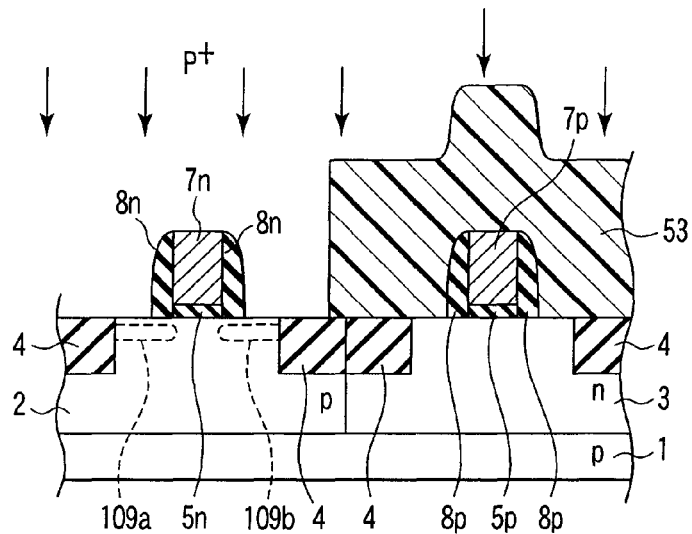

In the next fabrication step, as shown in FIG. 8, a photoresist film 53 is formed on the surface of the n-well region 3. Using the photoresist 53, gate electrode 7n and sidewall spacers 8n as a mask, atoms of Group V, e.g., phosphorus (P), which become n-type impurities, are ion-implanted in the surface of the p-well region 2. By this ion implantation, the impurity ions of Group V atoms are also implanted in the gate electrode 7n. The conditions for the ion implantation are an acceleration energy of 5 keV and a dosage of $3 \times 10^{15}$ $cm^{-2}$. As Group V atoms to be implanted, arsenic (As) is also usable. However, in the case of using P, defects due to ion implantation can be remedied more easily by activation heat treatment, and a pn junction leakage current can be suppressed.

Figure 9:
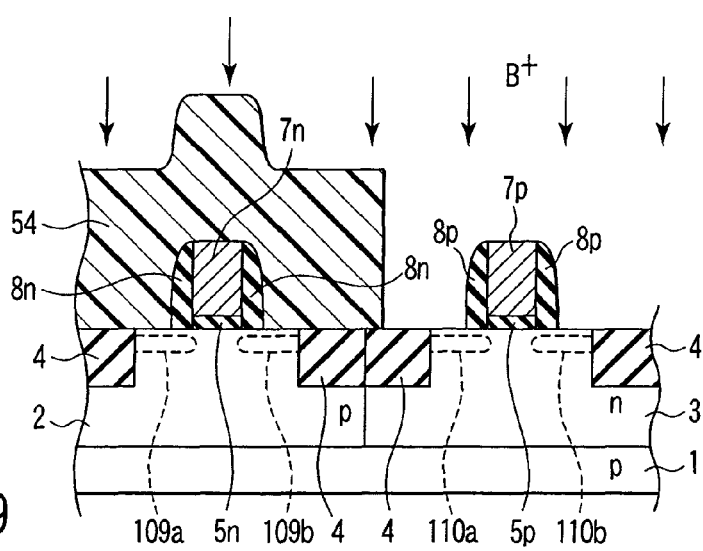

Next, as shown in FIG. 9, after the photoresist 53 is removed, a photoresist 54 is similarly formed on the p-well region 2. Using the photoresist 54, gate electrode 7p and sidewall spacers 8p as a mask, atoms of Group III, e.g., boron (B), which become p-type impurities, are ion-implanted in the surface of the n-well region 3. By this ion implantation, the impurity ions of Group III atoms are also implanted in the gate electrode 7p. The conditions for the ion implantation are an acceleration energy of 2 keV and a dosage of $3 \times 10^{15}$ $cm^{-2}$.

In the state immediately after the end of the ion implantation in steps of FIGS. 8 and 9, inactive source/drain regions 109a, 109b, 110a and 110b are formed in regions in the Si substrate 1, which neighbor the gate electrodes 7n and 7p and the device isolation regions 4. Then, an activation annealing process for the inactive source/drain regions 109a, 109b, 110a and 110b is performed by using a halogen lamp as a heat source. The condition for the activation annealing process is a heat treatment condition (annealing condition) in the hatched region in the double-logarithmic graph of FIG. 6 and, for example, RTA is conducted within 10 seconds at 1000° C. or spike RTA is conducted with a peak temperature set at 1000° C. By this activation annealing process, as shown in FIG. 10, source/drain regions 9a, 9b, 10a and 10b, which are apart from the gate electrodes 7n, 7p and are in contact with the device isolation regions 4, are formed in the Si substrate 1. By this activation annealing process, the impurities, which are doped in the gate electrode 7n, 7p, can be diffused to the interface with the gate insulation film 5n, 5p, and crystal defects occurring in the Si substrate 1 due to ion implantation can be eliminated.

Thereafter, as shown in FIG. 11, the sidewall spacers 8n and 8p, which are formed of silicon nitride, are removed by using hot phosphoric acid.

In the next step illustrated in FIG. 12, a photoresist film 55 is formed on the pMOSFET region. Using the photoresist 55 and the gate electrode 7n of the nMOSFET region as a mask, atoms of Group V, e.g., arsenic (As), which become n-type impurities, are ion-implanted in the surface of the p-well region 2 of the Si substrate 1. The conditions for the ion implantation are an acceleration energy of 1.5 keV and a dosage of $1 \times 10^{15}$ $cm^{-2}$.

As shown in FIG. 13, after the photoresist 55 is removed, a photoresist film 56 is similarly formed on the surface of the p-well region 2. Using the photoresist 56 and the gate electrode 7p as a mask, atoms of Group III, e.g., boron (B), which become p-type impurities, are ion-implanted in the surface of the n-well region 3. The conditions for the ion implantation are an acceleration energy of 0.3 keV and a dosage of $1 \times 10^{15}$ $cm^{-2}$.

FIG. 14 shows the state immediately after the ion implantation. In this state, inactive shallow extension regions 111a, 111b, 112a and 112b are formed in regions in the Si substrate 1, which neighbor the gate electrodes 7n and 7p and the device isolation regions 4.

Subsequently, as shown in FIG. 15, a silicon oxide ($SiO_2$) film 13 is deposited by LPCVD at film formation temperatures of 600° C. or less.

Figure 16:
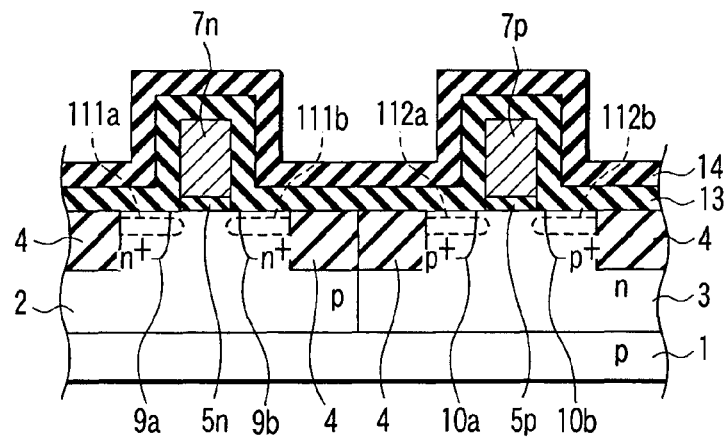

Further, as shown in FIG. 16, a silicon nitride ($Si_3N_4$) film 14 is deposited on the silicon oxide ($SiO_2$) film 13 by LPCVD at film formation temperatures of 600° C. or less.

Figure 17:
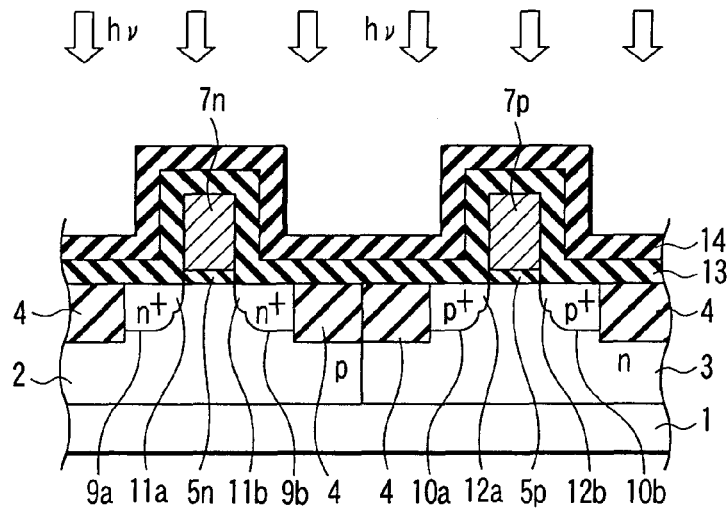

Following the above step, as shown in FIG. 17, using a flashtube as a heat source, an activation annealing process is performed. For the activation annealing process, the relationship between the heat treatment temperature and heat treatment time, which is indicated in the hatched region in the double-logarithmic graph of FIG. 6, is preferable. In particular, the condition of the temperature range of 1100° C. or above is preferable. In this case, the Si substrate 1 is placed on a hot plate. In the state in which the Si substrate 1 is heated (auxiliary heating) from the back side, the upper surface of the Si substrate 1 should preferably be heated by heat emitted from the flashtube light source. In this case, the temperature for the auxiliary heating of the Si substrate 1 should preferably be set in the range of about 400° C. to 900° C. If the auxiliary heating temperature is excessively low, a high light intensity is required for heating from the upper surface. As a result, the thermal stress occurring in the Si substrate increases, leading to crystal defects such as slip and dislocation. Thus, the excessively low temperature for auxiliary heating is undesirable. On the other hand, if the auxiliary heating temperature is excessively high, the impurities would diffuse and so this is also undesirable. Although the possibility is low that damage, such as slip or dislocation, occurs in the Si substrate due to auxiliary heating, the rate of temperature rise in the auxiliary heating should preferably be made as low as possible, thereby to prevent deformation of the Si substrate. For example, it is desirable that the rate of temperature rise be set at 20° C./s or less. If the rate of temperature rise is higher than this value, warpage tends to occur in the Si substrate. If flashtube light is radiated in the state in which the Si substrate warps, the Si substrate would easily be damaged. As the auxiliary heating means, the hot plate may be replaced with other heating means such as a halogen lamp which is a kind of infrared lamp. In FIG. 17, hv indicates the energy of light, wherein h is Planck's constant and v is a wave number ($1/\lambda$, $\lambda$: wavelength of light). By the activation annealing process, shallow-junction source extension regions 11a and 12b and shallow-junction drain extension regions 11b and 12a are formed in those portions of the Si substrate 1, which neighbor the gate electrodes 7n, 7p and device isolation regions 4. In the description below, the source extension regions 11a and 12b and drain extension regions 11b and 12a are referred to simply as "extension region 11a, 11b; 12a, 12b".

Figure 18:
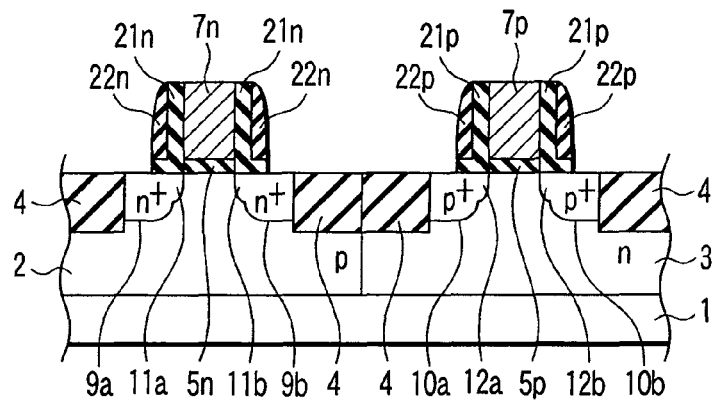

In a subsequently step illustrated in FIG. 18, the silicon nitride film 14 and silicon oxide film 13 are etched by RIE and selectively left on the side surfaces of the gate electrode 7n and gate insulation film 5n and on the side surfaces of the gate electrode 7p and gate insulation film 5p. Alternatively, after the silicon nitride film 14 and silicon oxide film 13 are completely removed by hot phosphoric acid and hydrofluoric acid or after the uppermost-layer silicon nitride film 14 is removed by hot phosphoric acid, a silicon nitride film and a silicon oxide film, for instance, may newly be formed and selectively left by RIE on the side surfaces of the gate electrode 7n, 7p and gate insulation film 5n, 5p. Thereby, as shown in FIG. 18, sidewall spacers having the stacked structure comprising the silicon oxide film 21n, 21p and silicon nitride film 22n, 22p or sidewall spacers having the single-layer structure comprising the silicon oxide film or silicon nitride film are formed. The thickness of the insulation film, which becomes the sidewall spacer, is set at 20 to 40 nm as the thickness of the silicon oxide film and silicon nitride film combined. The sidewall spacer functions to prevent a Ni silicide reaction in a later fabrication step, and thus the basic structure of the semiconductor device according to the first embodiment is completed.

Although the subsequent fabrication steps are not illustrated in the drawings, an Ni film is formed on the gate electrodes 7n and 7p and source/drain regions 9a, 9b, 10a and 10b, and Ni silicide ($Ni_2Si$, $NiSi_x$) layers 33n, 33p, 31a, 31b, 32a and 32b are formed by RTA on the upper parts of the gate electrodes 7n and 7p and the surfaces of the source/drain regions 9a, 9b, 10a and 10b. After the siliciding step, Ni that was not reacted in the siliciding step is removed by using sulfuric peroxide mixture (SPM), and a silicon oxide film which becomes an interlayer insulation film 24 is deposited. Contact holes are made in the interlayer insulation film 24, thereby exposing parts of the Ni silicide layers 31a, 31b, 32a and 32b on the surfaces of the source/drain regions 9a, 9b, 10a and 10b. Although not shown, on the far side of the sheet surface of FIG. 1, contact holes, which expose parts of the Ni silicide layers 33n, 33p on top of the gate electrode 7n, 7p, are also formed in the interlayer insulation film 24. Contact plugs 41a, 41b, 42a and 42b are buried in the contact holes formed in the interlayer insulation film 24. Wiring lines 43a and 43b for the nMOSFET are connected to the source/drain regions 9a and 9b of the nMOSFET via the Ni silicide layers 31a, 31b and contact plugs 41a, 41b. Wiring lines 44a and 44b for the pMOSFET are connected to the source/drain regions 10a and 10b of the pMOSFET via the Ni silicide layers 32a, 32b and contact plugs 42a, 42b. At this time, though not shown, on the far side of the sheet surface of FIG. 1, gate wiring lines are connected to the Ni silicide layers 33n, 33p on top of the gate electrodes 7n, 7p via contact plugs buried in the contact holes which are formed in the interlayer insulation film 24.

By the above-described process, the semiconductor device with the CMOS structure, as shown in the cross section of FIG. 1, which includes the extension regions 11a, 11b, 12a, 12b each having a junction depth of 20 nm or less, is completed.

The radiation of flashtube light in the activation annealing process illustrated in FIG. 17 is, in typical cases, executed by a single light emission (1 pulse) with use of, e.g., a xenon flashtube. The light energy density of 1 pulse depends on the pulse width and the temperature of auxiliary heating of the substrate. For example, in the case of a pulse width of 1 ms, the light energy density is in the range of about 25 $J/cm^2$ to 35 $J/cm^2$ and in the range of 5 $J/cm^2$ to 15 $J/cm^2$ in relation to the auxiliary heating temperatures 400° C. and 900° C. of the Si substrate 1, respectively. If the radiation energy is too low, the activation becomes insufficient and this is undesirable. If the radiation energy is too high, the thermal stress occurring in the Si substrate increases and this is also undesirable. As regards the pulse duration time, it is desirable that the half-value width (the period in which at least ½ of the peak intensity is kept) be in the range of about 0.1 ms to 100 ms. If the pulse width is less than this value, heating is executed more instantaneously, and the thermal stress occurring in the surface portion of the Si substrate 1 would increase and this is undesirable. If the pulse width is too large, the impurities would diffuse and this is also undesirable. In the fabrication method of the semiconductor device according to the first embodiment, the activation annealing process is carried out under the condition that the substrate auxiliary heating temperature is 400° C. and the radiation energy density is 28 $J/cm^2$.

The xenon flashtube light, which is radiated from above the surface of the Si substrate 1, passes through the insulation film comprising the silicon oxide film 13 and silicon nitride film 14 and is absorbed by the gate electrodes 7n and 7p and the extension regions 111a, 111b, 112a and 112b and the source/drain regions 9a, 9b, 10a and 10b in the Si substrate 1. The temperature rises in the gate electrodes 7n and 7p, the extension regions 111a, 111b, 112a and 112b and the source/drain regions 9a, 9b, 10a and 10b, which have absorbed the xenon flashtube light. It is considered that the temperature of the gate electrodes 7n and 7p, the extension regions 111a, 111b, 112a and 112b and the source/drain regions 9a, 9b, 10a and 10b instantaneously exceeds 1200° C. By this temperature, the impurities, which are doped in the gate electrodes 7n and 7p, the extension regions 111a, 111b, 112a and 112b and the source/drain regions 9a, 9b, 10a and 10b, are electrically activated.

The resistance in the gate electrodes 7n and 7p, the extension regions 111a, 111b, 112a and 112b and the source/drain regions 9a, 9b, 10a and 10b is decreased by the activation annealing process illustrated in FIG. 17. The annealing using the lash lamp is carried out via the silicon oxide film 13 and silicon nitride film 14, and thus the difference in refractive index between the atmospheric layer and the Si substrate 1 can be decreased. By adjusting the thicknesses of the respective insulation films, the reflectance at the interface of the Si substrate can be reduced. Thereby, the reflectance which varies depending on dense/non-dense parts of patterns can be made uniform, and the dependency on patterns can be eliminated. Moreover, since both the silicon oxide film and silicon nitride film are optically transparent films, the heating efficiency is not lowered. By the degree corresponding to the decrease in reflectance, the heating temperature can be increased with less radiation energy.

<Experimental Comparison>
[Gate Leakage Current]

Figure 19:
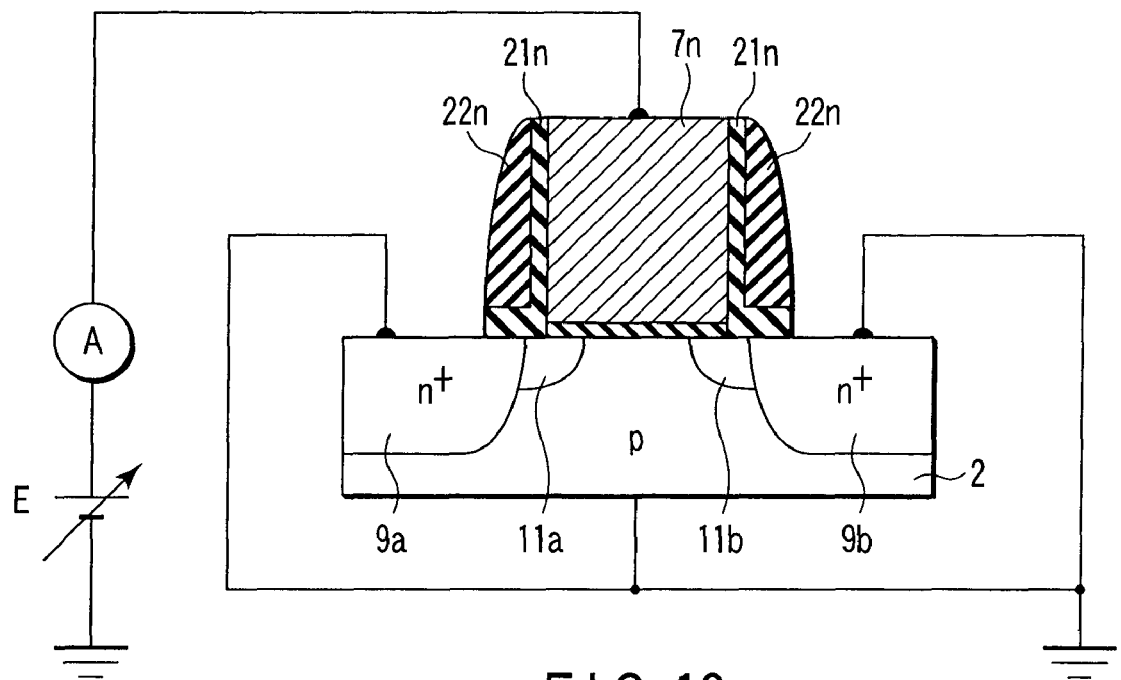
FIG. 19 is a circuit diagram showing a measuring circuit of a gate leakage current in an n-channel insulated-gate transistor.
Figure 20:
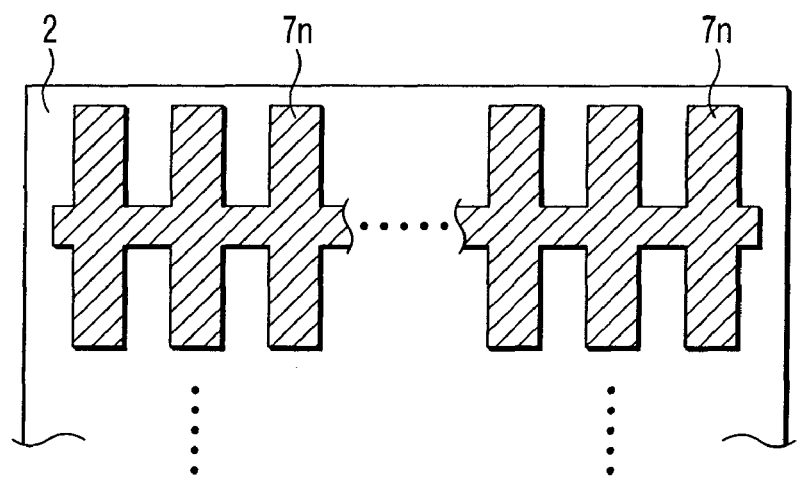
FIG. 20 is a plan view of a gate electrode of the n-channel insulated-gate transistor which is the object of measurement by the measuring circuit shown in FIG. 19.
Figure 21:
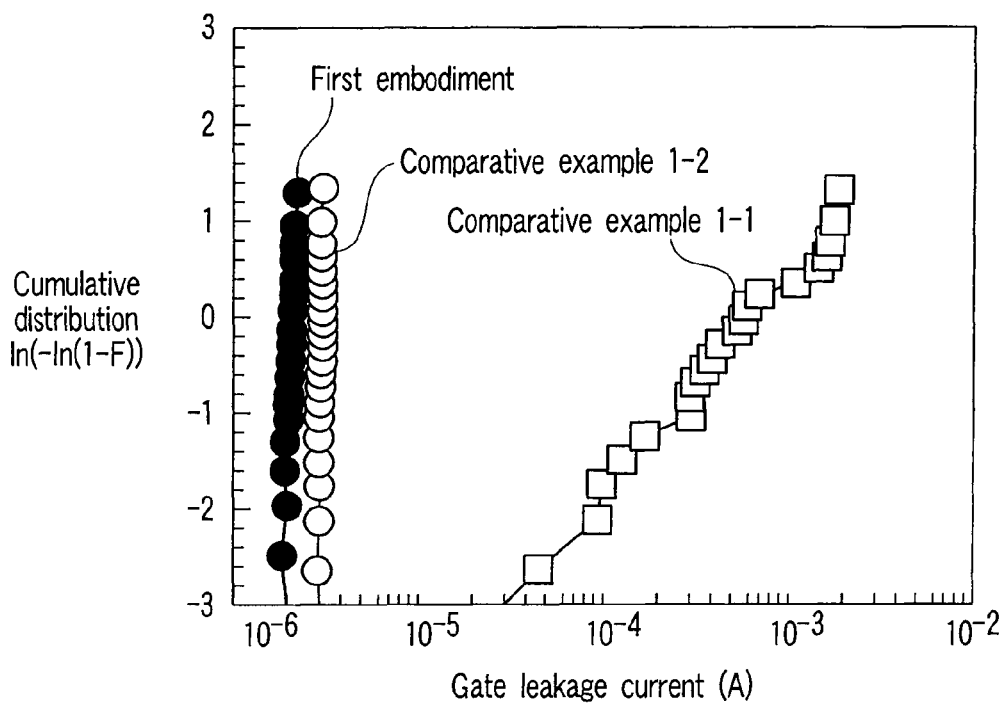
FIG. 21 is a graph showing the relationship between gate leakage currents and cumulative distributions of devices in connection with n-channel insulated-gate transistors according to the first embodiment and comparative examples.

As regards the nMOSFET according to the first embodiment, after the nMOSFET was completed, gate leakage current was measured by providing wiring as shown in FIG. 19. FIG. 19 shows a cross section of the nMOSFET according to the present embodiment and a measuring circuit for measuring a gate leakage current of the nMOSFET. FIG. 20 is a plan view of the gate electrode 7n of the nMOSFET shown in FIG. 19. FIG. 21 is a characteristic graph in which the structure of the first embodiment and the structures of a first comparative example (comparative example 1-1) and a second comparative example (comparative example 1-2) are compared with respect to in-plane variations of gate leakage currents in nMOSFETs. In FIG. 21, the ordinate indicates a cumulative distribution $\ln(-\ln(1-F))$ according to Weibull distribution, and the abscissa indicates a gate leakage current. In this comparison, in the structure according to the first embodiment, an nMOSFET with a gate length of 30 nm was fabricated under the condition that arsenic (As) is doped in the ion-implantation step of FIG. 3 with an acceleration energy of 20 keV and a dosage of $5 \times 10^{15}$ $cm^{-2}$. On the other hand, in the first comparative example (comparative example 1-1), an nMOSFET with a gate length of 30 nm was fabricated under the condition that phosphorus (P) is doped in the ion-implantation step of FIG. 3 with an acceleration energy of 5 keV and a dosage of $5 \times 10^{15}$ $cm^{-2}$. In the second comparative example (comparative example 1-2), an nMOSFET with a gate length of 30 nm was fabricated under the condition that phosphorus (P) is doped in the ion-implantation step of FIG. 3 with an acceleration energy of 5 keV and a dosage of $5\times10^{15}$ cm$^{-2}$, following which a spike RTA process, instead of flashtube annealing, is carried out at 1030° C. in the activation annealing step of FIG. 17 with use of a conventional halogen lamp.

As shown in FIG. 21, in the first embodiment, as in the second comparative example (comparative example 1-2) in which the flashtube is not used, the value of gate leakage current was low in all chips in the plane, and there was no defective chip. In the first comparative example (comparative example 1-1), however, it was confirmed that the gate leakage current increased by one to three orders of magnitude and the gate withstand voltage greatly deteriorated.

[Junction Depth of Extension Region]

Figure 22:
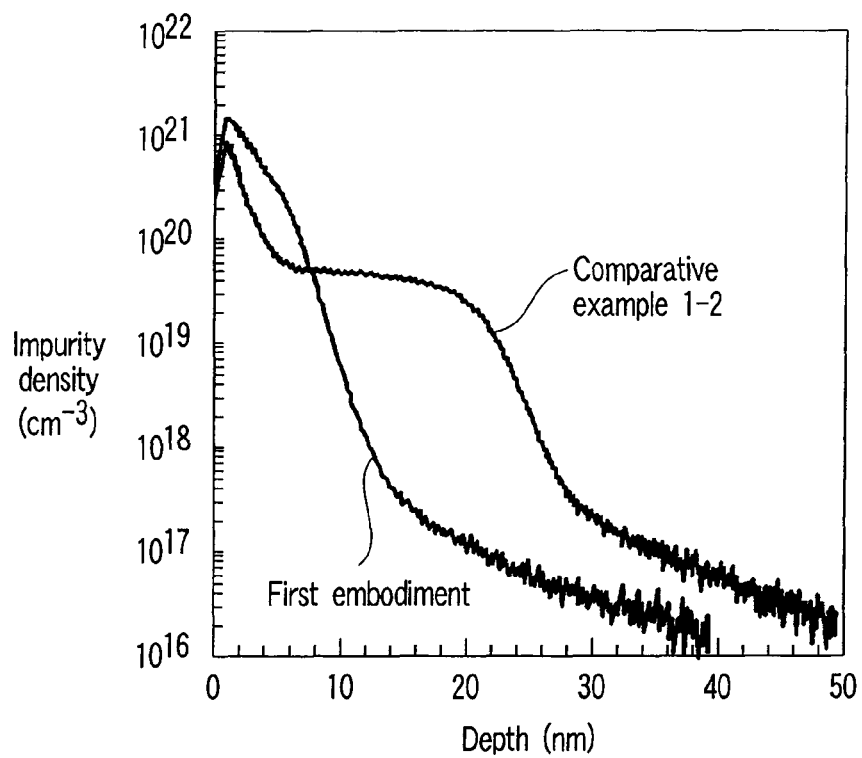
FIG. 22 is a graph showing impurity profiles in extension regions of the n-channel insulated-gate transistors according to the first embodiment and a comparative example.

FIG. 22 is a graph showing the relationship between the depth from the surface of the silicon substrate and the impurity concentration in the structure according to the present embodiment and the structure according to the second comparative example (comparative example 1-2). In this graph, the impurity profile in the extension region 11a, 11b, 12a, 12b was measured by secondary ion mass spectrometry (SIMS).

As shown in FIG. 22, in the first embodiment, the depth of the diffusion layer was kept at 20 nm or less, and a steep impurity profile was obtained. By contrast, in the second comparative example (comparative example 1-2), the impurities were diffused to a great degree.

As is understood from the above result, in the first comparative example (comparative example 1-1), the gate withstand voltage deteriorates, and it is difficult to fabricate a transistor with a fine structure. In the second comparative example (comparative example 1-2), no deterioration is observed in gate withstand voltage, but a shallow diffusion layer cannot be formed. It is thus understood that a transistor with a fine structure cannot be fabricated. Further, it was confirmed by SIMS and C-V measurement that in the first embodiment, arsenic (As) with a lower diffusion coefficient than phosphorus (P) is used as a dopant, but the dopant is sufficiently diffused in the gate polycrystalline Si in the subsequent RTA process. In short, the gate current is not suppressed because the apparent thickness of the gate insulation film increases due to gate depletion.

<Theoretical Comparison>

In the first comparative example (comparative example 1-1), the dosage of P in the gate electrode 7n that is formed of polycrystalline Si, as combined with the dosage at the time of formation of the source/drain regions 9a and 9b, is $8\times10^{15}$ cm$^{-2}$. The thickness of the gate electrode 7n is 100 nm, and since P is uniformly diffused by the heat treatment, the impurity density of P reaches as high as $8\times10^{20}$ cm$^{-3}$. Further, in the first comparative example (comparative example 1-1), flashtube annealing is performed as final activation annealing. In the very rapid annealing by flashtube annealing or laser annealing, the instantaneous maximum temperature of the surface of the Si substrate 1 reaches as high as 1200° C. to 1300° C. Since the thickness of the single-crystal Si substrate 1 is as great as 730 μm, the heat that is absorbed by the source/drain region 9a, 9b diffuses to the deep part of the Si substrate. However, since the gate electrode 7n is formed on the insulation film, the heat does not easily escape from the gate electrode 7n. It is considered that since the heat concentrates in the gate electrode 7n with the thickness of 100 nm, the temperature of the gate electrode 7n rises up to about 1300° C. to 1400° C.

In other words, despite the radiation being performed with the same optical energy, the temperature of the gate electrode 7n is higher than that of the Si substrate 1. Phosphorus (P), which is doped in the abnormally heated gate electrode 7n that is formed of polycrystalline Si, diffuses and piles up at the interface of the gate insulation film. The phosphorus (P), the concentration of which is further increased at the interface, permeates into the gate insulation film 5n and stays in the gate insulation film 5n, thus locally forming phosphorus silicate glass (PSG). It is considered that the gate insulation film 5n is fluidized due to the drop in melting point, which results from the formation of PSG, and a leakage path is formed. Similarly, in the second comparative example (comparative example 1-2), the impurity density of P in the gate electrode 7n reaches as high as $8\times10^{20}$ cm$^{-3}$. However, since the conventional RTA is performed, abnormal heating up to 1300° C. or more does not occur in the gate electrode 7n that is formed of polycrystalline Si. Hence, even if the impurity density of P is high, the gate leakage current does not increase. On the other hand, in the first embodiment, arsenic (As) is doped at $5\times10^{15}$ cm$^{-2}$ prior to the processing of the gate, and P is doped at $3\times10^{15}$ cm$^{-2}$ at the time of forming the source/drain regions 9a, 9b, and the maximum concentration of P is $3\times10^{20}$ cm$^{-3}$ at most. It is thus considered that even if the activation process is performed by flashtube annealing, the PSG does not easily form since the diffusion efficiency of As is lower than that of P and the impurity density of P that permeates into the gate insulation film 5n is low even if P piles up at the interface of the gate insulation film 5n.

Figure 23:
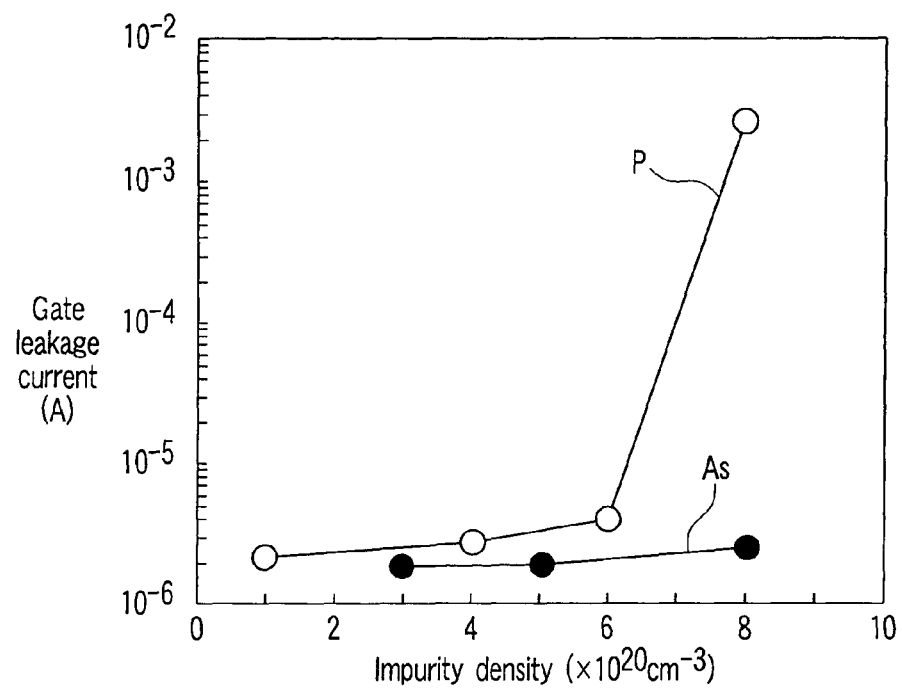
FIG. 23 is a graph showing the relationship between impurity densities of As and P and gate leakage current in an n-channel insulated-gate transistor.

FIG. 23 shows, with attention paid to the nMOSFET, the relationship between the impurity density of As and the impurity density of P in the gate electrode 7n formed of polycrystalline Si and the gate leakage current in the case where the flashtube annealing is applied. As shown in FIG. 23, simply by reducing the impurity density of P, most of P is trapped in lattice positions of Si and contributes to activation, and the amount of excess P that is not used for activation is decreased. It is thus considered that P does not easily pile up at the interface of the insulation film. However, if the concentration of the dopant in the polycrystalline Si is too low, the activation density decreases and gate depletion occurs. As a result, the driving power of the transistor is not enhanced. It is necessary to secure the activation density of at least $1\times10^{20}$ cm$^{-3}$ or more.

Figure 24:
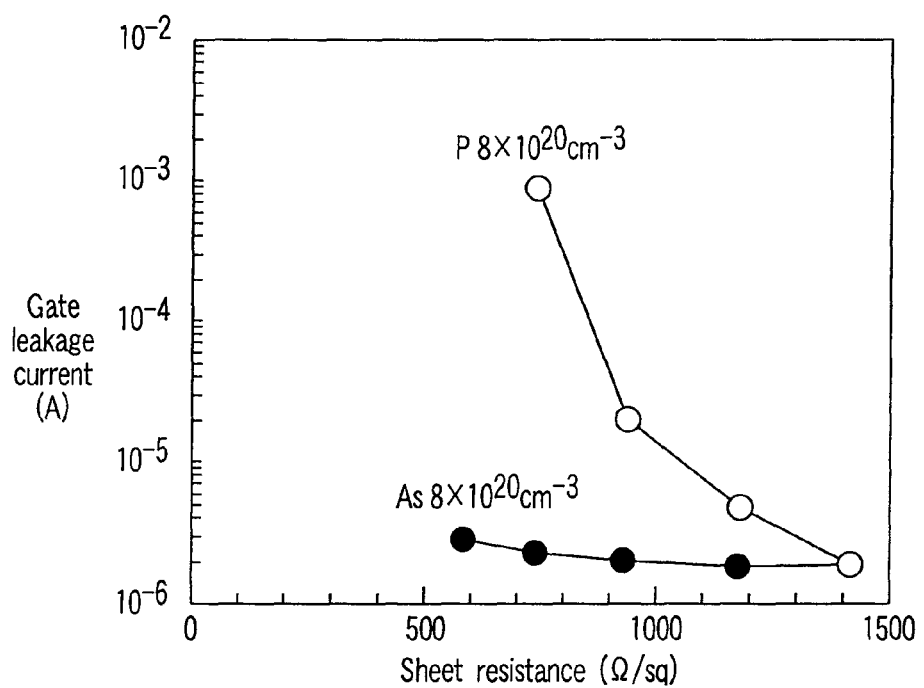
FIG. 24 is a graph showing the relationship between gate leakage current and sheet resistance in the extension region in the n-channel insulated-gate transistor in the case where P and As are used as dopants in the gate electrode.

FIG. 24 shows the relationship between the gate leakage current and the diffusion layer sheet resistance due to P and As (acceleration energy: 1.5 keV; dosage: $1\times10^{15}$ cm$^{-2}$) doped in the shallow-junction extension region 11a, 11b, in the case where P is used and in the case where As is used as the dopant in the gate electrode 7n that is formed of polycrystalline Si. As shown in FIG. 24, it is understood that even in the case where the impurity density is the same, the use of As, compared to the use of P, can more reduce the sheet resistance of the extension region 11a, 11b within such a range as not to increase the gate leakage current. In other words, it is understood that the use of As can more suppress the gate leakage current even if the radiation optical energy is increased at the time of flashtube annealing, and the process window relating to the heat treatment process is increased.

First Modification of First Embodiment

Next, a description is given of a first modification of the first embodiment with attention paid to the nMOSFET, in which the nMOSFET is fabricated under the following conditions. In the ion-implantation step of FIG. 3, P is doped with an acceleration energy of 5 keV and a dosage of $5\times10^{15}$ cm$^{-2}$. In addition, the activation annealing process step of FIG. 17 is carried out under the flashtube annealing condition that the auxiliary heating temperature of the Si substrate 1 is 750° C. and the radiation energy density is 18 J/cm².

The above-described first comparative example (comparative example 1-1) and the first modification of the first embodiment are different with respect to the flashtube annealing condition. In the first modification of the first embodiment, the auxiliary heating temperature of the Si substrate 1 is higher but the radiation energy density is lower. However, the sheet resistance of the extension region 11a, 11b is 730 Ω/sq (sq: unit area (square)) in the first comparative example (comparative example 1-1), while this sheet resistance is 610 Ω/sq in the first modification of the first embodiment and is low. In other words, it is understood that the temperature is higher in the first modification of the first embodiment than in the first comparative example (comparative example 1-1). Despite this, it is understood that in the first modification of the first embodiment the gate leakage current is successfully suppressed to the same degree as in the first embodiment.

FIG. 25 is a graph showing the relationship between the sheet resistance and gate leakage current, with the auxiliary heating temperature of the silicon substrate being used as a parameter. FIG. 25 indicates the dependence of the gate leakage current and the sheet resistance of the extension region 11a, 11b upon the auxiliary heating of the Si substrate 1. From FIG. 25, it is understood that although the impurity density of P in the gate electrode 7n that is formed of polycrystalline Si is unchanged, the sheet resistance of the extension region 11a, 11b can be reduced within such a range as not to increase the gate leakage current if the auxiliary heating temperature of the Si substrate 1 is raised. It is understood that the process window relating to the heat treatment step, as a result, is increased. It is considered that the result shown in FIG. 25 was obtained because in the first modification of the first embodiment the high-concentration activation of the diffusion layer was realized with a radiation energy which is less by a degree corresponding to the increase in auxiliary heating temperature of the Si substrate 1. It is also considered that since the contribution of very rapid flashtube heating is decreased, the abnormal high heating of polycrystalline Si can be suppressed and PSG is not easily formed due to permeation of P into the gate insulation film 5n.

As has been described in connection with the first embodiment and the first modification of the first embodiment with attention paid to the nMOSFET, both the reduction in diffusion layer sheet resistance and the suppression of gate leakage current can be realized by decreasing the impurity density of P in the gate electrode 7n that is formed of polycrystalline Si, or by forming the gate electrode that is formed of polycrystalline Si including As as a main component. In short, according to the semiconductor device fabrication methods of the first embodiment and the first modification, the activation process of the extension region 11a, 11b with a wide process window relating to the heat treatment step can be realized, and nMOSFETs with fine structures can easily be fabricated.

In the above descriptions of the semiconductor device and fabrication method, attention has been paid to the nMOSFET. Needless to say, the same advantageous effects can be obtained by applying the same techniques to the pMOSFET.

Second Modification of First Embodiment

In the methods for fabricating the semiconductor devices according to the first embodiment and the first modification thereof, the annealing device was described as employing the xenon flashtube as the light source for light radiation. However, the semiconductor device fabrication method is not limited to this example, and the light source may be, for instance, any one of flashtubes using other rare gases, mercury and hydrogen, an arc discharge lamp, an excimer laser, an Ar laser, an N2 laser, a YAG laser, a titanium-sapphire laser, a CO laser, and a $CO_2$ laser.

In the above-described methods, the shallow-junction extension regions 11a and 11b are formed after the deep-junction source/drain regions 9a and 9b are formed. However, as shown in FIGS. 26 to 33, the shallow-junction extension regions 11a and 11b may first be formed, following which the deep-junction source/drain regions 9a and 9b may be formed.

This fabrication method will now be described with reference to FIGS. 26 to 33. FIGS. 26 to 33 are cross-sectional views successively illustrating fabrication steps of a semiconductor device according to a second modification of the first embodiment. In this second modification, the fabrication steps of FIGS. 2 to 5, which have been described in connection with the semiconductor device fabrication method of the first embodiment, are similarly applied.

Figure 26:
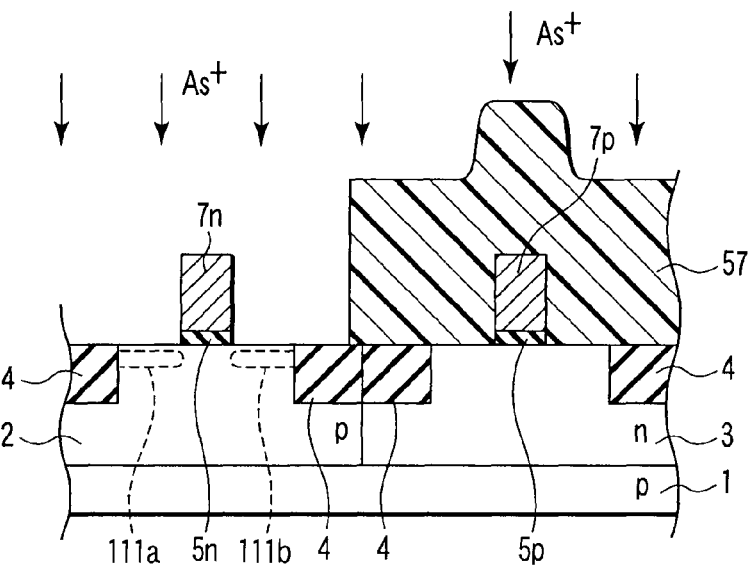
FIGS. 26 to 33 are cross-sectional views illustrating first to eighth fabrication steps of a semiconductor device according to a second modification of the first embodiment of the invention.

In the present modification, following the step of FIG. 5, a photoresist film 57 is formed on the pMOSFET region, as shown in FIG. 26, without forming sidewall spacers 8n and 8p. Using the photoresist 57 and gate electrode 7n as a mask, atoms of Group V, e.g., arsenic (As), which become n-type impurities, are ion-implanted in the surface of the p-well region 2 on the surface of the Si substrate 1. The conditions for the ion implantation are, as in the first embodiment, an acceleration energy of 1.5 keV and a dosage of $1 \times 10^{15}$ cm$^{-2}$.

Figure 27:
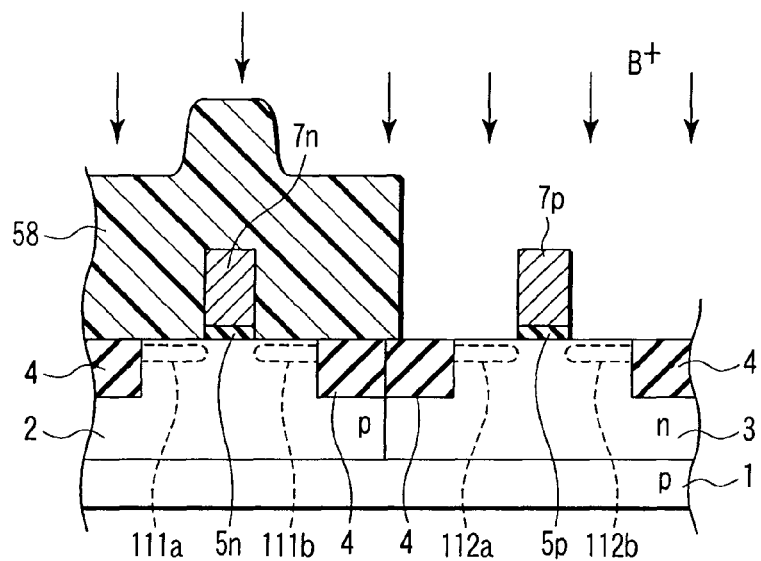

Next, as shown in FIG. 27, after the photoresist 57 is removed, a photoresist 58 is similarly formed on the p-well region 2. Using the photoresist 58 and gate electrode 7p as a mask, atoms of Group III, e.g., boron (B), which become p-type impurities, are ion-implanted in the surface of the n-well region 3. The conditions for the ion implantation are, as in the first embodiment, an acceleration energy of 0.3 keV and a dosage of $1 \times 10^{15}$ cm$^{-2}$. In the state immediately after the end of this fabrication step, inactive shallow extension regions 111a, 111b, 112a and 112b are formed in regions in the Si substrate 1, which neighbor the gate electrodes 7n and 7p and the device isolation regions 4.

Figure 28:
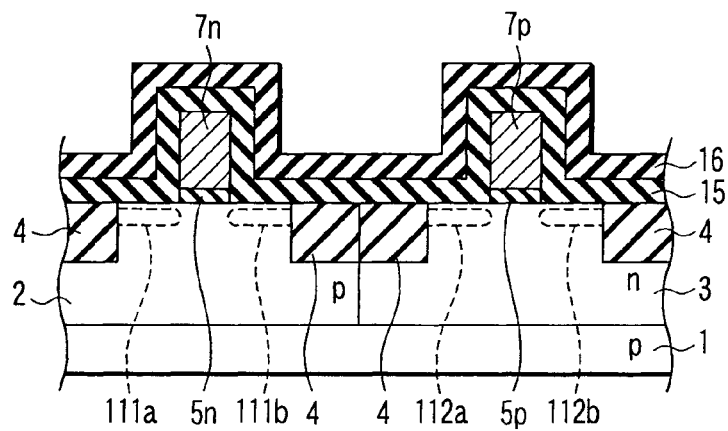

Subsequently, as shown in FIG. 28, a silicon oxide ($SiO_2$) film 15 is deposited by LPCVD at film formation temperatures of 600° C. or less. Further, as shown in FIG. 28, a silicon nitride ($Si_3N_4$) film 16 is deposited on the silicon oxide ($SiO_2$) film 15 by LPCVD at film formation temperatures of 600° C. or less.

Figure 29:
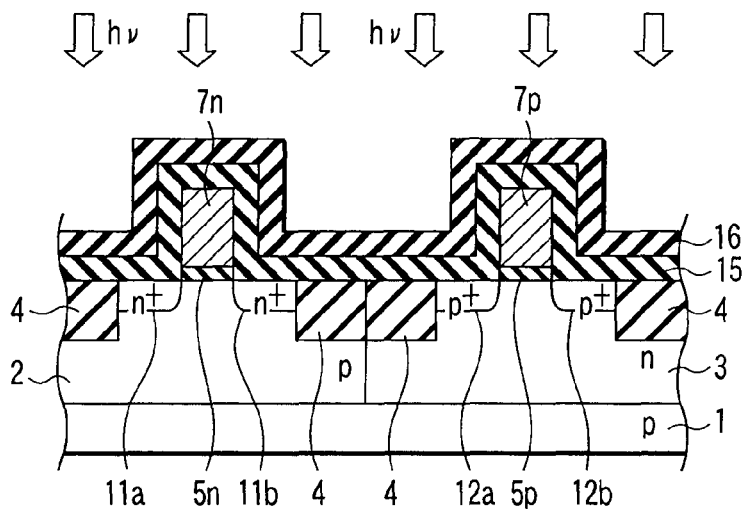

Following the above step, as shown in FIG. 29, using a flashtube as a heat source, an activation annealing process is performed under the heat treatment condition indicated in the hatched region in the double-logarithmic graph of FIG. 6 (in particular, the condition of the temperature range of 1100° C. or above is preferable). In this activation annealing process, the Si substrate 1 is placed on a hot plate. In the state in which the Si substrate 1 is heated (auxiliary heating) from the back side, the upper surface of the Si substrate 1 is heated by heat emitted from the flashtube light source. In this case, the temperature for the auxiliary heating of the Si substrate 1 should preferably be set in the range of about 400° C. to 900° C. This step is the same as the step of FIG. 17, which has been described in connection with the first embodiment. By this step, shallow extension regions 11a, 11b, 12a and 12b are formed in regions in the Si substrate 1, which neighbor the gate electrodes 7n and 7p and the device isolation regions 4.

Figure 30:
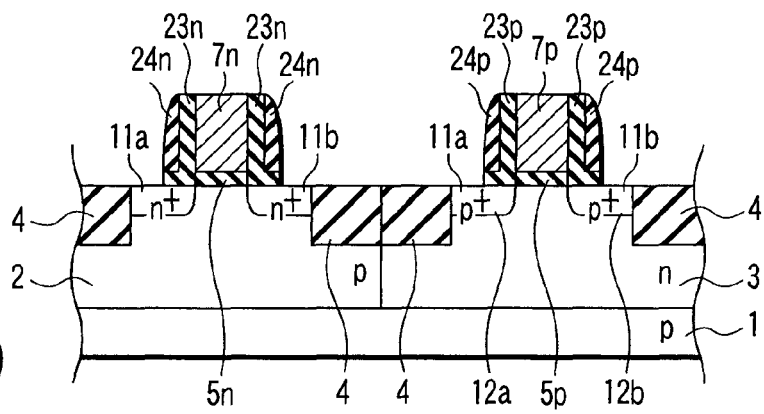

In a subsequently step illustrated in FIG. 30, the silicon nitride film 16 and silicon oxide film 15 are etched by RIE and selectively left on the side surfaces of the gate electrode 7n and gate insulation film 5n and on the side surfaces of the gate electrode 7p and gate insulation film 5p. Alternatively, after the silicon nitride film 16 and silicon oxide film 15 are completely removed by hot phosphoric acid and hydrofluoric acid or after the uppermost-layer silicon nitride film 16 is removed by hot phosphoric acid, a silicon nitride film and a silicon oxide film, for instance, may newly be formed and selectively left by RIE on the side surfaces of the gate electrode 7n, 7p and gate insulation film 5n, 5p. Thereby, as shown in FIG. 30, sidewall spacers having the stacked structure comprising silicon oxide film 23n, 23p and silicon nitride film 24n, 24p are formed on the side surfaces of the gate electrode 7n and gate insulation film 5n and on the side surfaces of the gate electrode 7p and gate insulation film 5p.

Figure 31:
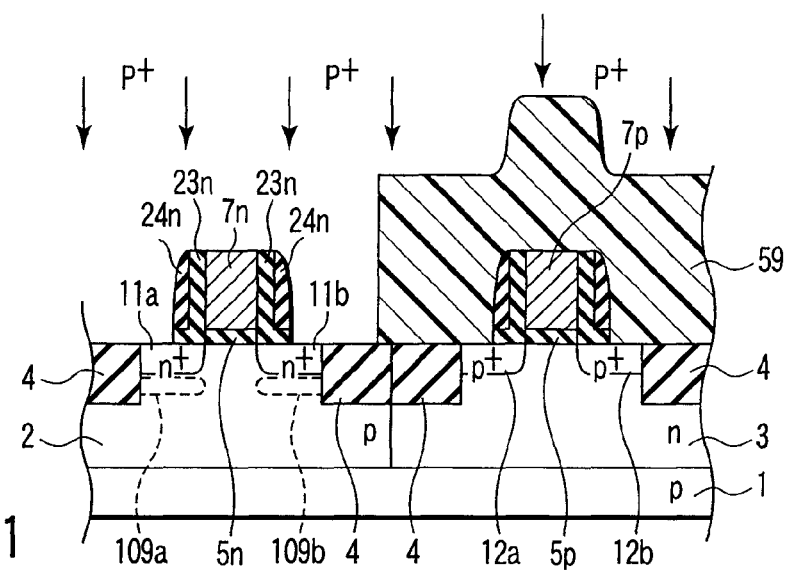
Figure 32:
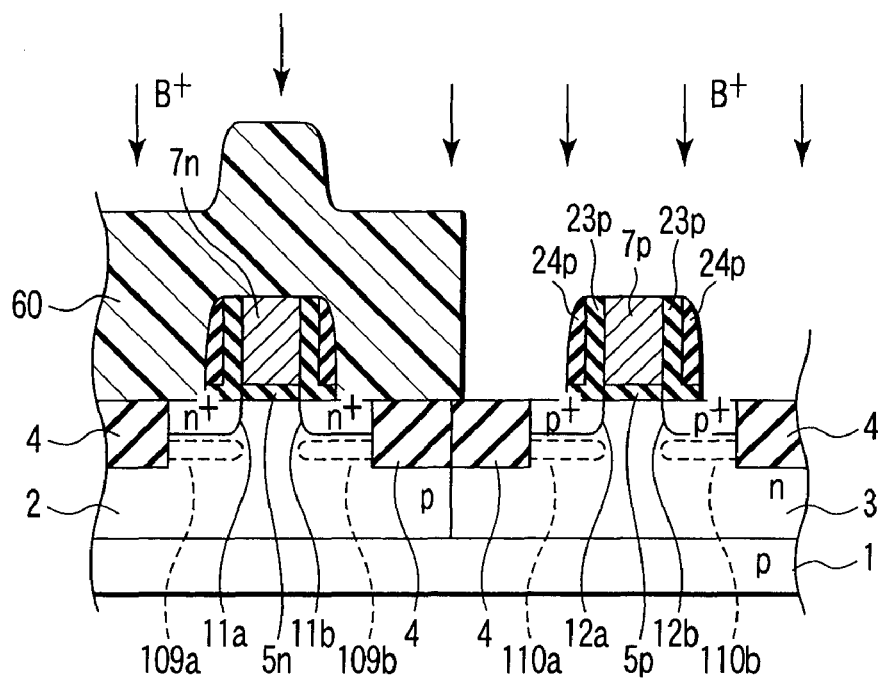

In the next step illustrated in FIG. 31, a photoresist film 59 is formed on the surface of the n-well region 3. Using the photoresist 59, gate electrode 7n and sidewall spacers 23n and 24n as a mask, atoms of Group V, e.g., phosphorus (P) ions, which become n-type impurities, are ion-implanted in the surface of the p-well region 2. By this ion implantation, the impurity ions of Group V atoms are also implanted in the gate electrode 7n. The conditions for the ion implantation are, as in the first embodiment, an acceleration energy of 5 keV and a dosage of $3\times10^{15}$ cm$^{-2}$. As Group V atoms to be implanted, arsenic (As) is also usable. However, in the case of using P, defects due to ion implantation can be remedied more easily by activation heat treatment, and a pn junction leakage current can be suppressed. After the photoresist 59 is removed, a photoresist 60 is similarly formed on the p-well region 2. Using the photoresist 60, gate electrode 7p and sidewall spacers 23p and 24p as a mask, atoms of Group III, e.g., boron (B) ions, which become p-type impurities, are ion-implanted in the surface of the n-well region 3, as shown in FIG. 32. By this ion implantation, the impurity ions of Group III atoms are also doped in the gate electrode 7p. The conditions for the ion implantation are an acceleration energy of 2 keV and a dosage of $3\times10^{15}$ cm$^{-2}$, as in the semiconductor device fabrication method according to the first embodiment. In the state immediately after the end of this fabrication step, inactive source/drain regions 109a, 109b, 110a and 110b are formed in regions in the Si substrate 1, which neighbor the gate electrodes 7n and 7p and the device isolation regions 4.

Figure 33:
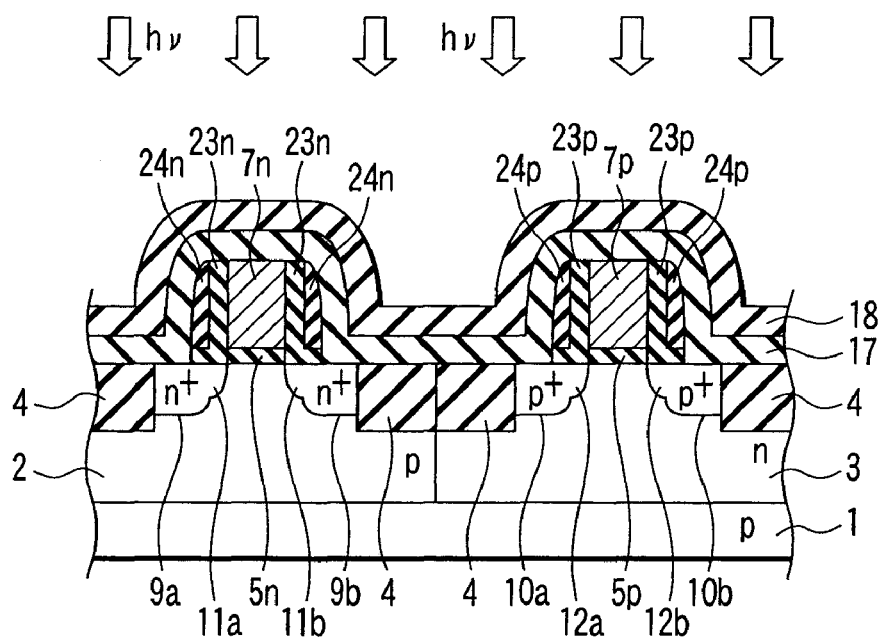

Subsequently, as shown in FIG. 33, a silicon oxide (SiO$_2$) film 17 is deposited by LPCVD at film formation temperatures of 600° C. or less. Further, a silicon nitride (Si$_3$N$_4$) film 18 is deposited the silicon oxide (SiO$_2$) film 17 by LPCVD at film formation temperatures of 600° C. or less. Using a halogen lamp as a heat source, an activation annealing process for the Si substrate 1 is carried out. The condition for the activation annealing process is a heat treatment condition in the hatched region in the double-logarithmic graph of FIG. 6 and, for example, RTA is conducted within 10 seconds at 1000° C. or spike RTA is conducted with a peak temperature set at 1000° C. By this activation annealing process, source/drain regions 9a, 9b, 10a and 10b, which are apart from the gate electrodes 7n, 7p and are in contact with the device isolation regions 4, are formed in the Si substrate 1. By this activation annealing process, the impurities, which are doped in the gate electrode 7n, 7p, can be diffused to the interface with the gate insulation film 5n, 5p, and crystal defects occurring in the Si substrate 1 due to ion implantation can be eliminated.

Thereafter, the sidewall spacers 23n, 24n, 23p and 24p are left so as to function to prevent a Ni silicide reaction in a later fabrication step. Thus, the basic structure of the semiconductor device according to the present modification is completed. The fabrication steps following the step of FIG. 33 are the same as those in the semiconductor device fabrication method according to the first embodiment, so a description thereof is omitted here. By the above-described semiconductor device fabrication method according to the second embodiment of the first embodiment, too, the semiconductor device with the CMOS structure, as shown in the cross section of FIG. 1, which includes the extension regions 11a, 11b, 12a and 12b each having a junction depth of 20 nm or less, can be completed.

Second Embodiment

Figure 34:
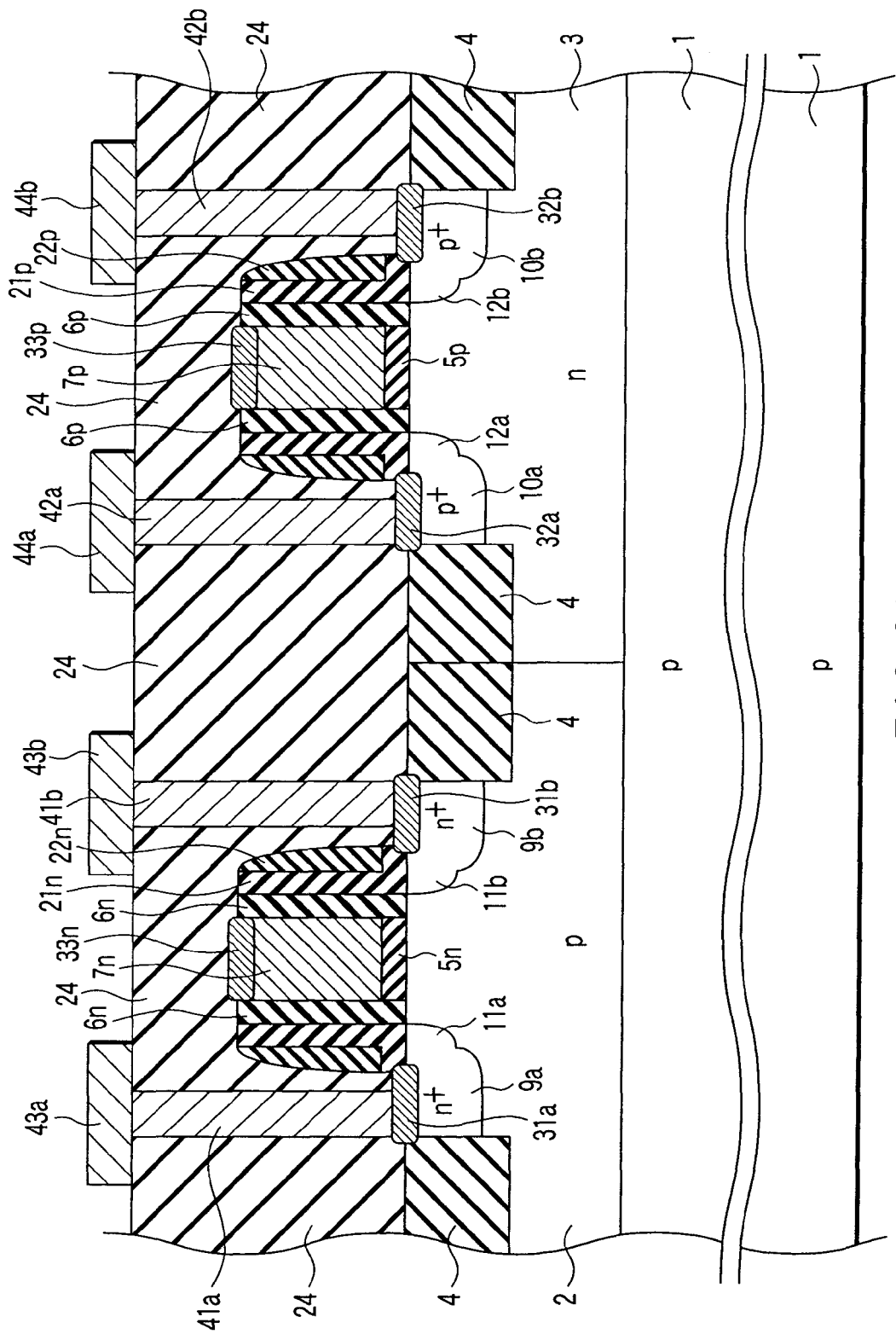
FIG. 34 is a cross-sectional view that schematically shows a part of the structure of a semiconductor device according to a second embodiment of the present invention.

Next, a semiconductor device and a method for fabricating the semiconductor device, according to a second embodiment of the invention, are described. In the second embodiment, as in the description of the first embodiment, a first conductivity type and a second conductivity type are mutually opposite conductivity types. In the description of the second embodiment and a modification thereof, it is assumed that the first conductivity type is p-type and the second conductivity type is n-type. Alternatively, the first conductivity type may be n-type and the second conductivity type may be p-type. FIG. 34 is a cross-sectional view of a semiconductor device according to the second embodiment of the invention.

As shown in FIG. 34, the semiconductor device according to the second embodiment, as in the first embodiment, has a CMOS structure. In the second embodiment, offset spacers 6n and 6p, which are formed of silicon oxide films, are newly provided in the structure that has been described with reference to FIG. 1 in connection with the first embodiment.

The offset spacers 6n are formed on side walls of the gate electrode 7n and gate insulation film 5n of the nMOSFET. Specifically, in the structure shown in FIG. 1, each offset spacer 6n is newly formed between the gate electrode 7n and gate insulation film 5n, on the one hand, and the sidewall spacer 21n, on the other hand.

The offset spacers 6p are formed on side walls of the gate electrode 7p and gate insulation film 5p of the pMOSFET. Specifically, in the structure shown in FIG. 1, each offset spacer 6p is newly formed between the gate electrode 7p and gate insulation film 5p, on the one hand, and the sidewall spacer 21p, on the other hand.

The surface concentration of the extension region 11a, 11b of the nMOSFET is set at an impurity density of about $5\times10^{19}$ cm$^3$ to $1\times10^{21}$ cm$^{-3}$, preferably at an impurity density of about $1\times10^{20}$ cm$^{-3}$ to $8\times10^{20}$ cm$^{-3}$. The junction depth of the extension region 11a, 11b of the nMOSFET is set at 20 nm or less. The surface concentration of the extension region 12a, 12b of the pMOSFET is set at an impurity density of about $5\times10^{19}$ cm$^3$ to $1\times10^{21}$ cm$^{-3}$, preferably at an impurity density of about $1\times10^{20}$ cm$^3$ to $8\times10^{20}$ cm$^{-3}$. The junction depth of the extension region 12a, 12b of the pMOSFET is also set at 20 nm or less.

In the other structural aspects, the second embodiment is the same as the first embodiment. FIG. 35 is an enlarged cross-sectional view of a part of the nMOSFET in which the offset spacer 6n is not provided, and FIG. 36 is an enlarged cross-sectional view of a part of the nMOSFET according to the present embodiment.

As is shown in FIG. 36, the offset spacer 6n, which is provided on the right side of the gate electrode 7n, has the function that is to be described below. A gate offset region with a dimension of Δd in the gate length direction is provided between an end portion of the extension region 11b and the gate electrode 7n in the structure shown in FIG. 35. This gate offset region functions to reduce an overlap capacitance Cov between the gate electrode 7n and the extension region 11b.

Although not shown, the offset spacer 6n, which is provided on the left side of the gate electrode 7n, similarly forms a gate offset region with a dimension of Δd between an end portion of the extension region 11a and the gate electrode 7n. Thereby, this gate offset region functions to reduce an overlap capacitance Cov between the gate electrode 7n and the extension region 11a. By choosing the film thickness Δd of the offset spacer 6n in the range of about 1 to 10 nm, the gate overlap capacitance Cov per unit gate width can be set at about $1\times10^{-15}$ F/μm to $1\times10^{-16}$ F/μm. Representatively, the film thickness Δd of about 4 nm can be adopted.

The above description with reference to FIGS. 35 and 36 is also applicable to the pMOSFET. Specifically, by providing the offset spacers 6p on the side walls of the gate electrode 7p, the gate overlap capacitance Cov per unit gate width of the pMOSFET can be set at about $1\times10^{-15}$ F/μm to $1\times10^{-16}$ F/μm. Typically, the film thickness of the offset spacer 6p can be set at, e.g., about 4 nm.

Next, a method for fabricating the semiconductor device according to the present embodiment is described with reference to FIGS. 37 to 47. FIGS. 37 to 47 are cross-sectional views successively illustrating fabrication steps of the semiconductor device shown in FIG. 34. The semiconductor device fabrication method to be described below is merely an example, and the semiconductor device of this embodiment may, needless to say, be fabricated by other various methods including modifications of the method described below. For example, in the description below, the gate electrodes 7n, 7p are formed of polycrystalline Si films. However, this is merely an example, and the gate electrodes 7n, 7p may be formed of, e.g., polycrystalline SiGe (Ge concentration: 10 to 30 atomic %), a single-crystal semiconductor layer, or a metal layer.

To start with, the fabrication steps of FIGS. 2 to 5, as described in connection with the first embodiment, are carried out. In the first embodiment, immediately after the step of FIG. 5, sidewall spacers 8n, 8p are formed of silicon nitride films, as shown in FIG. 7. However, in the second embodiment, prior to the formation of the sidewall spacers 8n, 8p, a silicon oxide (SiO$_2$) film is deposited by LPCVD at film formation temperatures of 600° C. or less within the range of film thickness of about 2 to 10 nm, for example, with a film thickness of 4 nm. The silicon oxide film is etched by a method of leaving sidewall parts thereof using RIE, and thus the silicon oxide film is selectively left on the side surfaces of the gate electrode 7n, 7p and gate insulation film 5n, 5p. As a result, offset spacers 6n, 6p, as shown in FIG. 37, which are formed of silicon oxide films, are completed. The offset spacer 6n, 6p provides a gate offset region between an end portion of the impurity diffusion region formed in the Si substrate (to be described later) and the gate electrode. The film thickness of the offset spacer 6n, 6p determines the degree of reduction in overlap capacitance Cov with the gate electrode.

Subsequently, fabrication steps similar to those of FIGS. 7 to 18, which have been described in connection with the first embodiment, are performed. Specifically, as shown in FIG. 38, a silicon nitride (Si$_3$N$_4$) film is deposited by LPCVD at 600° C. or less, and selectively left on side surfaces of the offset spacers 6n, 6p. Thereby, sidewall spacers 8n and 8p are formed. Alternatively, the offset spacers 6n, 6p may be formed of silicon nitride films, and the sidewall spacers 8n, 8p may be formed of silicon oxide films.

In the next fabrication step, as shown in FIG. 39, a photoresist film 61 is formed on the surface of the n-well region 3. Using the gate electrode 7n, offset spacers 6n, sidewall spacers 8n and photoresist 61 as a mask, atoms of Group V, e.g., phosphorus (P), which become n-type impurities, are ion-implanted in the surface of the p-well region 2. At this time, the ions of Group V atoms are also implanted in the gate electrode 7n. The conditions for the ion implantation are an acceleration energy of 5 keV and a dosage of $3\times10^{15}$ cm$^{-2}$. As Group V atoms to be implanted, arsenic (As) is also usable. However, in the case of using P, defects due to ion implantation can be remedied more easily by activation heat treatment, and a pn junction leakage current can be suppressed.

Next, as shown in FIG. 40, a photoresist 62 is formed on the surface of the p-well region 2. Using the gate electrode 7p, offset spacers 6p, sidewall spacers 8p and photoresist 62 as a mask, atoms of Group III, e.g., boron (B), which become p-type impurities, are ionized and implanted in the surface of the n-well region 3, as shown in FIG. 40. At this time, the impurity ions of Group III atoms are also implanted in the gate electrode 7p. The conditions for the ion implantation are an acceleration energy of 2 keV and a dosage of $3\times10^{15}$ cm$^{-2}$.

In the state immediately after the end of the ion implantation in steps of FIGS. 39 and 40, inactive source/drain regions 109a, 109b, 110a and 110b are formed in regions in the Si substrate 1, which neighbor the offset spacers 6n and 6p and the device isolation regions 4. Then, an activation annealing process for the inactive source/drain regions 109a, 109b, 110a and 110b is performed by using a halogen lamp as a heat source. The condition for the activation annealing process is a heat treatment condition in the hatched region in the double-logarithmic graph of FIG. 6 and, for example, RTA is conducted within 10 seconds at 1000° C. to 1050° C. or spike RTA is conducted with a peak temperature set at 1000° C. to 1050° C. This step corresponds to the step of FIG. 10 which has been described in connection with the first embodiment. By this activation annealing process, as shown in FIG. 41, source/drain regions 9a, 9b, 10a and 10b, which are apart from end portions of the gate electrodes 7n, 7p and are in contact with the device isolation regions 4, are formed in the Si substrate 1. By this activation annealing process, the impurities, which are doped in the gate electrode 7n, 7p, can be diffused to the interface with the gate insulation film 5n, 5p, and crystal defects occurring in the Si substrate 1 due to ion implantation can be eliminated.

Thereafter, as shown in FIG. 42, the sidewall spacers 8n and 8p, which are formed of silicon nitride, are removed by using hot phosphoric acid.

Figure 43:
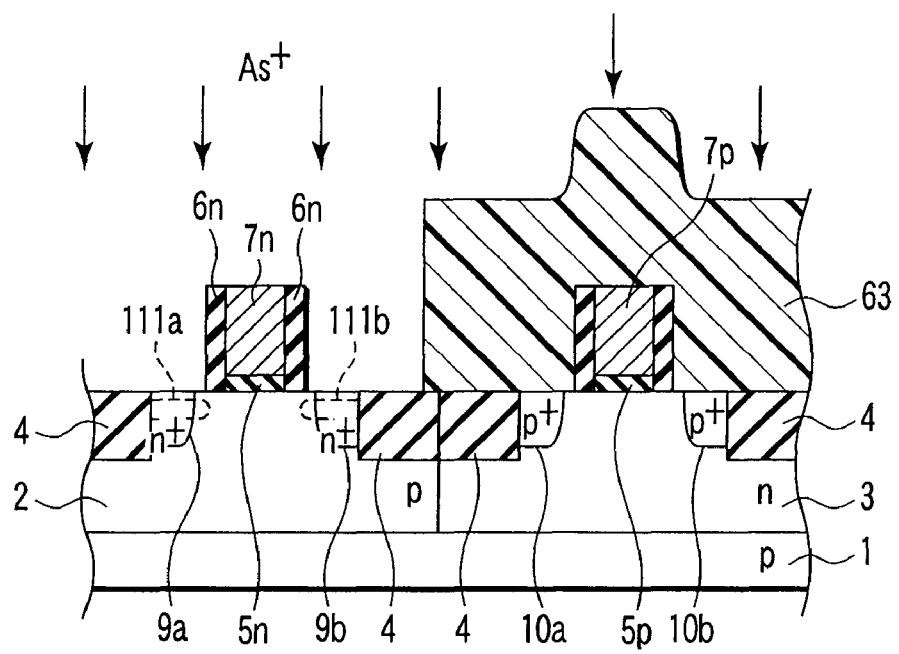

In the next step illustrated in FIG. 43, a photoresist film 63 is formed on the pMOSFET region. Using the gate electrode 7n, offset spacers 6n and photoresist 63 of the nMOSFET region as a mask, atoms of Group V, e.g., arsenic (As), which become n-type impurities, are ion-implanted in the surface of the p-well region 2 on the surface of the Si substrate 1. The conditions for the ion implantation are an acceleration energy of 5 keV and a dosage of $2\times10^{14}$ cm$^{-2}$.

Figure 44:
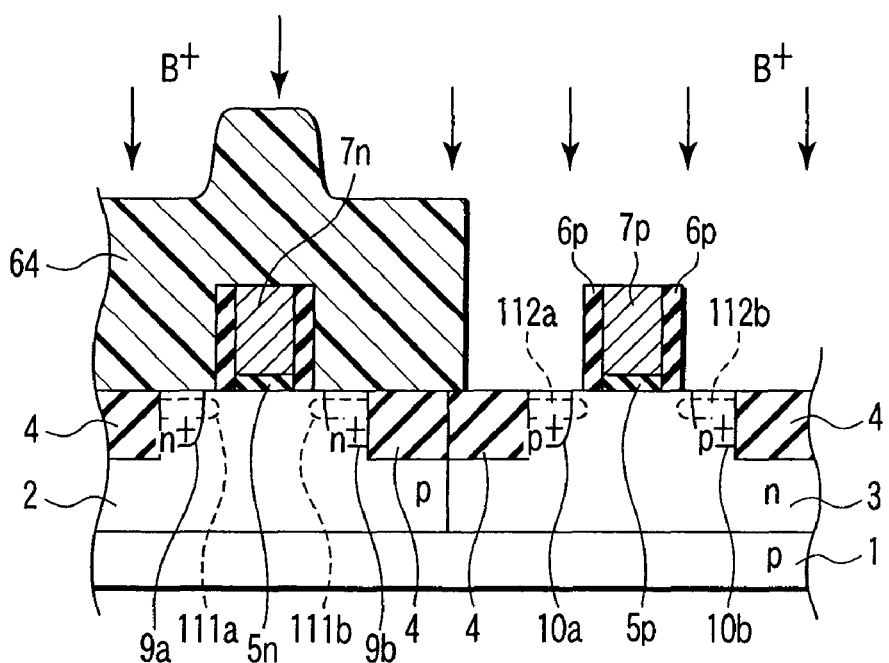

As shown in FIG. 44, after the photoresist 63 is removed, a photoresist film 64 is similarly formed on the surface of the p-well region 2. Using the gate electrode 7p, offset spacers 6p and photoresist 64 as a mask, atoms of Group III, e.g., boron (B), which become p-type impurities, are ion-implanted in the surface of the n-well region 3. The conditions for the ion implantation are an acceleration energy of 0.9 keV and a dosage of $2\times10^{14}$ cm$^{-2}$. In the state shown in FIG. 44, inactive shallow extension regions 111a, 111b, 112a and 112b are formed in regions of the Si substrate 1, which neighbor the gate electrodes 7n, 7p and device isolation regions 4.

Figure 45:
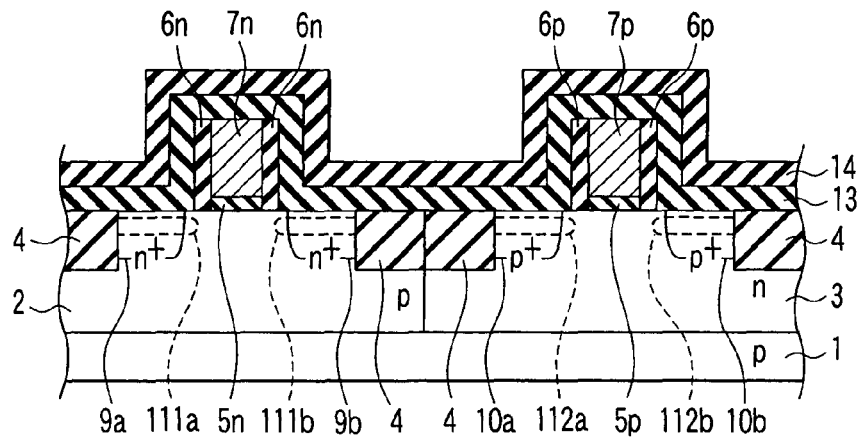

Subsequently, as shown in FIG. 45, a silicon oxide (SiO$_2$) film 13 is deposited by LPCVD at film formation temperatures of 600° C. or less, and then a silicon nitride (Si$_3$N$_4$) film 14 is deposited on the silicon oxide (SiO$_2$) film 13 by LPCVD at film formation temperatures of 600° C. or less.

Figure 46:
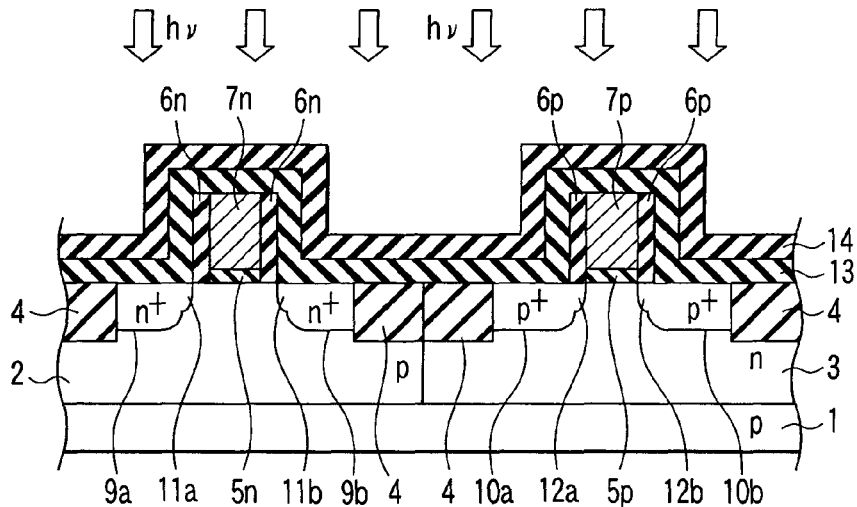

Following the above step, as shown in FIG. 46, using a flashtube as a heat source, an activation annealing process is performed. This step is the same as the step of FIG. 17 which has been described in connection with the first embodiment. The activation annealing process is performed under the heat treatment condition indicated in the hatched region in the double-logarithmic graph of FIG. 6. By the activation annealing process, shallow extension regions 11a, 11b, 12a and 12b, as shown in FIG. 46, are formed in those portions of the Si substrate 1, which neighbor the offset spacers 6n and 6p and device isolation regions 4.

Figure 47:
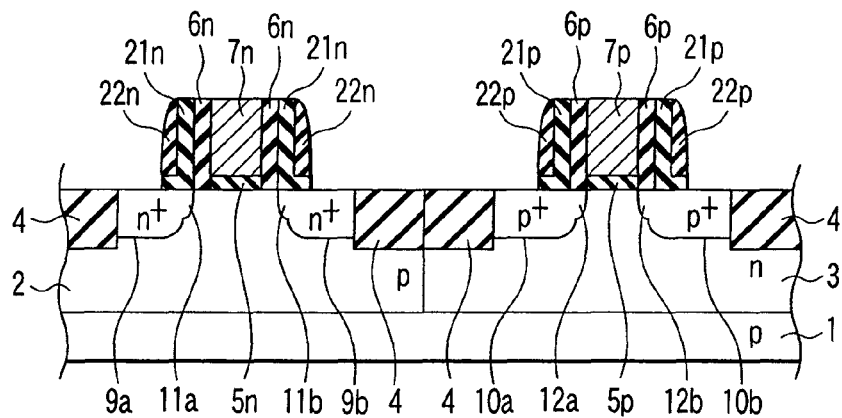

In a subsequently step illustrated in FIG. 47, the silicon nitride film 14 and silicon oxide film 13 are etched by RIE and selectively left on the side surfaces of the offset spacers 6n, 6p. Alternatively, after the silicon nitride film 14 and silicon oxide film 13 are completely removed by hot phosphoric acid and hydrofluoric acid or after the uppermost-layer silicon nitride film 14 is removed by hot phosphoric acid, a silicon nitride film and a silicon oxide film, for instance, may newly be formed and selectively left by RIE on the side surfaces of the offset spacers 6n, 6p. Thereby, sidewall spacers having the stacked structure comprising the silicon oxide film 21n, 21p and silicon nitride film 22n, 22p or sidewall spacers having the single-layer structure comprising the silicon oxide film or silicon nitride film are formed. The thickness of the insulation film excluding the offset spacer 6n, 6p, which finally becomes the sidewall spacer, is set at 20 to 40 nm as the thickness of the silicon oxide film 21n, 21p and silicon nitride film 22n, 22p combined. The sidewall spacer functions to prevent a Ni silicide reaction in a later fabrication step, and thus the basic structure of the semiconductor device according to the second embodiment is completed.

The subsequent fabrication steps are the same as those in the first embodiment, so a description thereof is omitted here. By the above-described process, the semiconductor device with the CMOS structure, as shown in the cross section of FIG. 34, which includes the extension regions 11a, 11b, 12a, 12b each having a junction depth of 20 nm or less, is completed.

The radiation of flashtube light in the activation annealing process illustrated in FIG. 46 is, in typical cases, executed by a single light emission (1 pulse) with use of, e.g., a xenon flashtube. This annealing process is the same as the step described with reference to FIG. 17 in connection with the first embodiment. Specifically, the light energy density of 1 pulse depends on the pulse width and the temperature of auxiliary heating of the substrate. For example, in the case of a pulse width of 1 ms, the light energy density is in the range of about 25 J/cm$^2$ to 35 J/cm$^2$ and in the range of 5 J/cm$^2$ to 15 J/cm$^2$ in relation to the auxiliary heating temperatures of 400° C. and 900° C. of the Si substrate 1, respectively. Thereby, the impurities, which are doped in the gate electrodes 7n and 7p, the extension regions 111a, 111b, 112a and 112b and the source/drain regions 9a, 9b, 10a and 10b, are electrically activated. By the activation, the resistance in the gate electrodes 7n and 7p, the extension regions 11a, 11b, 12a and 12b and the source/drain regions 9a, 9b, 10a and 10b is decreased. The annealing using the lash lamp is carried out via the silicon oxide film 13 and silicon nitride film 14, and thus the difference in refractive index between the atmospheric layer and the Si substrate 1 can be decreased. By adjusting the thicknesses of the respective insulation films, the reflectance at the interface of the Si substrate 1 can be reduced.

<Experimental Comparison>
[Gate Leakage Current]

Figure 48:
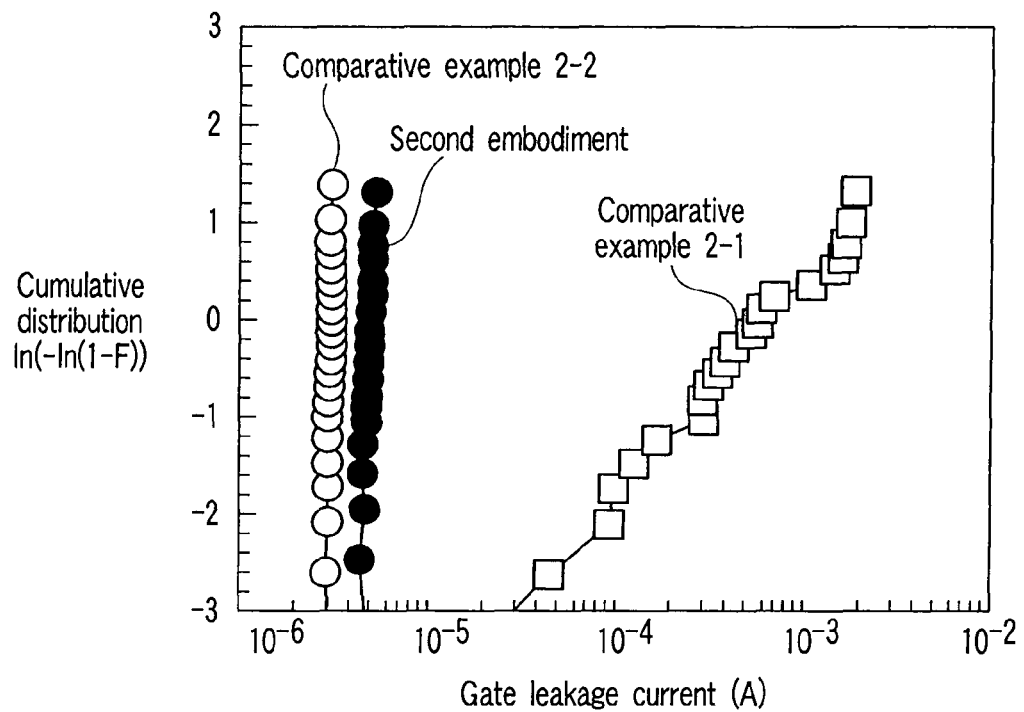
FIG. 48 is a graph showing the relationship between gate leakage currents and cumulative distributions of devices in connection with n-channel insulated-gate transistors according to the first embodiment and comparative examples.

FIG. 48 is a graph in which the semiconductor device fabrication method according to the second embodiment is compared with a first comparative example (comparative example 2-1) and a second comparative example (comparative example 2-2) with respect to in-plane variations of gate leakage currents in nMOSFETs. In FIG. 48, the ordinate indicates a cumulative distribution ln(-ln(1-F)) according to Weibull distribution, and the abscissa indicates a gate leakage current. The gate leakage current is measured by using the wiring shown in FIG. 19, which has been described in connection with the first embodiment. Symbol F in the Weibull distribution is a cumulative failure rate which is expressed by $F(t)=1-\exp(-(t/\eta)^m)$, where t is time, m is a Weibull coefficient, and η is a scale parameter.

The semiconductor according to this embodiment was fabricated under the following conditions. Specifically, in the offset spacer formation step of FIG. 37, the offset spacer 6n, 6p was formed with a thickness of 6 nm. In addition, arsenic (As) was doped in the ion-implantation step of FIG. 43 with an acceleration energy of 5 keV and a dosage of $2\times10^{14}$ cm$^{-2}$, and boron (B) was doped in the ion-implantation step of FIG. 44 with an acceleration energy of 0.9 keV and a dosage of $2\times10^{14}$ cm$^{-2}$. Thereby, an nMOSFET with a gate length of 30 nm was fabricated.

An nMOSFET according to the first comparative example (comparative example 2-1) was fabricated under the conditions that no offset spacer 6n, 6p was provided in the offset spacer formation step of FIG. 37, and arsenic (As) was doped in the ion-implantation step of FIG. 43 with an acceleration energy of 2 keV and a dosage of $1\times10^{15}$ cm$^{-2}$, and boron (B) was doped in the ion-implantation step of FIG. 44 with an acceleration energy of 0.3 keV and a dosage of $1\times10^{15}$ cm$^{-2}$. Thus, an nMOSFET with a gate length of 30 nm was fabricated.

An nMOSFET according to the second comparative example (comparative example 2-2) was fabricated under the following conditions. Specifically, no offset spacer 6n, 6p was provided in the offset spacer formation step of FIG. 37, and arsenic (As) was doped in the ion-implantation step of FIG. 43 with an acceleration energy of 2 keV and a dosage of $1\times10^{15}$ cm$^{-2}$, and boron (B) was doped in the ion-implantation step of FIG. 44 with an acceleration energy of 0.3 keV and a dosage of $1\times10^{15}$ cm$^{-2}$. Then, a spike RTA process, instead of flashtube annealing, was carried out at 1030° C. in the step of FIG. 46 with use of a conventional halogen lamp. Thereby, an nMOSFET with a gate length of 30 nm was fabricated.

As shown in FIG. 48, in the nMOSFET according to the present embodiment, as in the second comparative example (comparative example 2-2) in which the flashtube is not used, the value of gate leakage current was low in all chips in the plane, and there was no defective chip. In the comparative example 2-1, compared to the present embodiment, however, it was confirmed that the gate leakage current increased by one to three orders of magnitude and the gate withstand voltage greatly deteriorated.

[Junction Depth of Extension Region]

Figure 49:
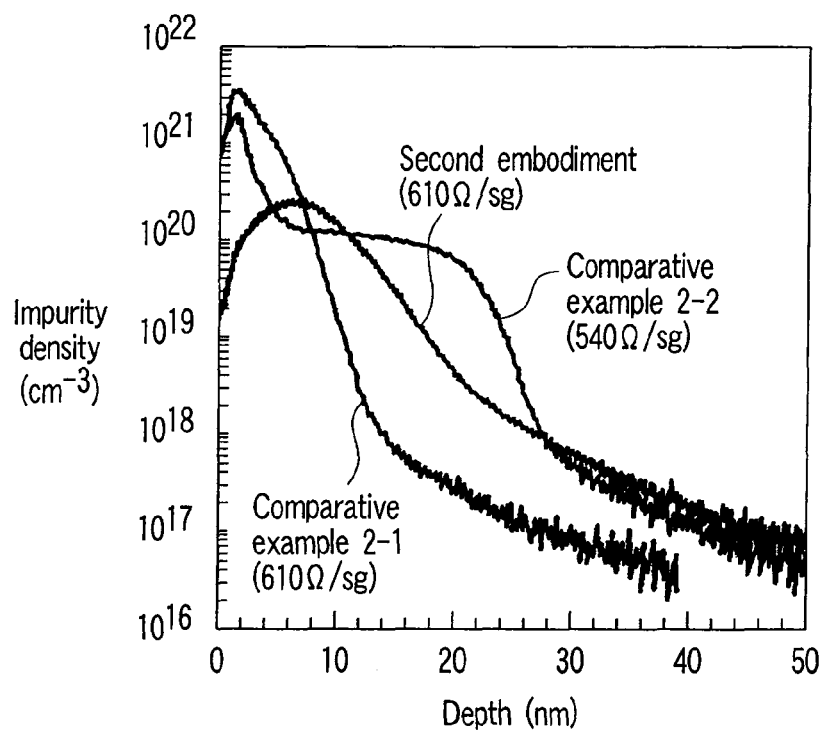
FIG. 49 is a graph showing impurity profiles in extension regions of the n-channel insulated-gate transistors according to the second embodiment and comparative examples.

FIG. 49 is a graph showing the relationship between the depth from the surface of the silicon substrate and the impurity concentration in the structure according to the present embodiment and the structures according to the first and second comparative examples. In this graph, the impurity profile in the extension region 11a, 11b of the nMOSFET was measured by secondary ion mass spectrometry (SIMS).

As shown in FIG. 49, in each case, the sheet resistance is suppressed to 700 Ω/sq. In the nMOSFETs according to the second embodiment and comparative example 2-1, the depth of the diffusion layer was kept at 20 nm or less, and a shallow impurity density profile was obtained. However, in the comparative example 2-2, the impurities were diffused to a deep region of the substrate.

As is understood from the above result, in the nMOSFET according to the comparative example 2-1, the gate withstand voltage deteriorates, and the characteristics of this nMOSFET are improper as those of an nMOSFET to be obtained. On the other hand, in the nMOSFET according to the comparative example 2-2, no deterioration is observed in gate withstand voltage, but a shallow diffusion layer cannot be formed. It is thus difficult to fabricate a transistor with a fine structure.

<Theoretical Comparison>

In the nMOSFET according to the comparative example 2-1, the impurity density in the substrate surface of the extension region $11a$, $11b$ becomes $1 \times 10^{21}$ cm$^{-3}$ or more. In addition, as shown in FIG. 35, the end portion of the extension region $11a$, $11b$ overlaps with the gate electrode $7n$, and the overlap capacitance Cov is as high as $2 \times 10^{-16}$ F/μm. Further, in the nMOSFET according to the comparative example 2-1, flashtube annealing is performed as final activation annealing. In the very rapid annealing by flashtube annealing or laser annealing, the instantaneous maximum temperature of the surface of the Si substrate 1 reaches as high as 1200° C. to 1400° C. The impurities, which are doped in the surface of the Si substrate 1 that is abnormally heated, diffuses and piles up at the interface of the gate insulation film $5n$. It is considered that the impurities, the concentration of which is further increased at the interface of the gate insulation film $5n$, permeates into the gate insulation film $5n$ and a leakage path is formed.

Similarly, in the nMOSFET according to the comparative example 2-2, the impurity density in the surface of the Si substrate 1 becomes $1 \times 10^{21}$ cm$^3$ or more. In addition, the overlap capacitance Cov between the end portion of the extension region $11a$, $11b$ and the gate electrode $7n$ further increases up to as high as $3 \times 10^{-16}$ F/μm. However, since the conventional RTA is performed, abnormal heating at 1200° C. or more does not occur in the surface of the Si substrate 1. Thus, despite the high surface impurity density of the Si substrate and the high overlap capacitance Cov, the permeation of impurities into the gate insulation film $5n$ is suppressed and the gate leakage current does not increase.

On the other hand, in the nMOSFET according to the second embodiment, the impurity density in the surface of the Si substrate 1 is suppressed to $3 \times 10^{20}$ cm$^{-3}$ or less. Further, as shown in FIG. 36, the overlap capacitance Cov between the extension region $11a$, $11b$ and the gate electrode $7n$ is suppressed, and it was confirmed that the overlap capacitance Cov decreased to $1 \times 10^{-16}$ F/μm.

It is thus considered that even if the instantaneous maximum temperature of the surface of the Si substrate 1 reached as high as 1200° C. to 1400° C. due to the very rapid annealing represented by flashtube annealing, the overlap capacitance Cov with the gate electrode $7n$ was low and hence the amount of impurities permeating into the gate insulation film $5n$ was suppressed and the gate leakage current did not increase.

FIG. 50 is a graph showing the relationship between the gate leakage current and the gate overlap capacitance Cov, with attention paid to the nMOSFET. The abscissa indicates the gate overlap capacitance, and the ordinate indicates the gate leakage current.

As shown in FIG. 50, it is understood that the gate leakage current decreases as the gate overlap capacitance Cov becomes smaller. However, in the case where the impurity density at the surface of the Si substrate 1 is $5 \times 10^{19}$ cm$^3$ or less, the parasitic resistance increases and the current driving power becomes deficient. The same applies to the case where the end portion of the extension region $11a$, $11b$ and the gate electrode $7n$ are extremely spaced apart and, as a result, the gate overlap capacitance Cov decreases to $5 \times 10^{-17}$ F/μm or less.

In the nMOSFETs according to the comparative example 2-1 and comparative example 2-2, high impurity density regions of the extension regions $11a$ and $11b$ are distributed in the vicinity of the channel region. Thus, the controllability of the gate electrode $7n$ decreases, and the short-channel effect considerably increases. On the other hand, in the nMOSFET according to the second embodiment, the extension regions $11a$, $11b$ are formed with an offset from the gate electrode $7n$ by using the diffusion regions having a steep impurity density distribution. Hence, the offset gate structure with no bias offset can be realized, and the parasitic resistance in the region immediately under the sidewall spacer $21n$, $22n$ can be decreased and a high current driving power can be obtained.

Figure 52:
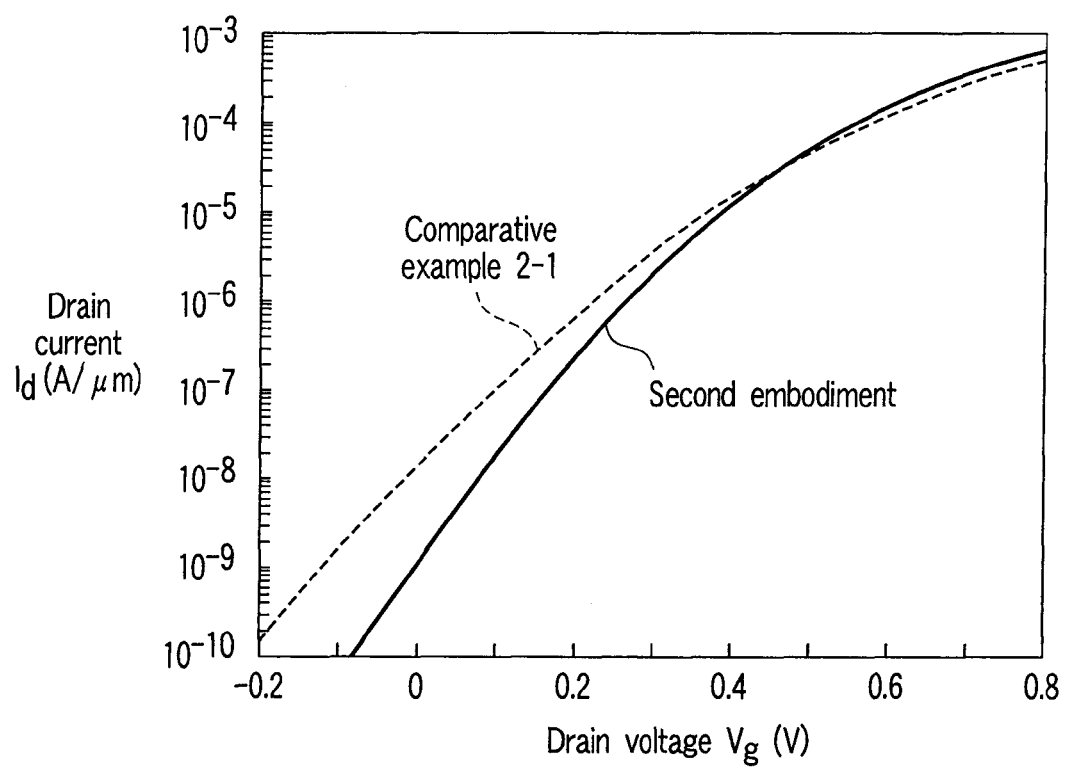
FIG. 52 is a graph showing the relationship between gate voltage and drain current in the n-channel insulated-gate transistors according to the second embodiment and the comparative example.

FIG. 51 is a graph showing a drain current versus a drain voltage, and FIG. 52 is a graph showing a drain current versus a gate voltage. FIGS. 51 and 52 show the cases in which the gate length of each of the nMOSFET according to the second embodiment and the nMOSFET according to the comparative example 2-1 is 30 nm.

As shown in FIGS. 51 and 52, in the second embodiment, no offset voltage occurs and a high drain current is obtained. In the second embodiment, even if the effective channel length is increased by the presence of the offset region, the channel mobility is high and thus the channel resistance is low. Hence, even in the case of the nMOSFET according to the comparative example 2-1, as compared with a MOSFET with a weaker short-channel effect and a greater channel length, it becomes possible to secure a high current driving power while reducing gate leakage current.

As has been described in connection with the semiconductor device fabrication method according to the second embodiment, when the very-rapid high-luminance optical heat treatment process is performed, the extension region $11a$, $11b$ is offset from the gate electrode $7n$ and the impurity density in the surface of the Si substrate 1 is decreased. Thereby, the permeation of impurities into the gate insulation film $5n$ can be suppressed. Thus, without an increase in gate leakage current, an increase in resistance of the extension region $11a$, $11b$ can be suppressed. As a result, the parasitic resistance can be reduced and kept at the reduced value, and the short-channel effect can be decreased. Hence, the controllability of the channel current by the gate electrode $7n$ can be enhanced, and a high driving power can be obtained. In short, according to the second embodiment, the activation process for the extension region $11a$, $11b$ with a wide process window relating to the heat treatment process can be realized, and a high-performance nMOSFET with a fine structure can easily be fabricated.

In the above description of the second embodiment, attention has been paid to the nMOSFET. Needless to say, the second embodiment is similarly applicable to the pMOSFET, and the same advantageous effect can be obtained.

Modification of Second Embodiment

In the above-described second embodiment, the annealing device was described as employing the xenon flashtube as the light source for light radiation. However, the second embodiment is not limited to this example, and the light source may be, for instance, any one of flashtubes using other rare gases, mercury and hydrogen, an arc discharge lamp, an excimer laser, an Ar laser, an N2 laser, a YAG laser, a titanium-sapphire laser, a CO laser, and a CO$_2$ laser.

In the above-described embodiment, the shallow-junction extension regions 11a and 11b are formed after the deep-junction source/drain regions 9a and 9b are formed. However, as shown in FIGS. 53 to 59, the shallow-junction extension regions 11a and 11b may first be formed, following which the deep-junction source/drain regions 9a and 9b may be formed. This fabrication method will now be described with reference to FIGS. 53 to 59. FIGS. 53 to 59 are cross-sectional views successively illustrating fabrication steps of a semiconductor device according to a modification of the second embodiment. FIGS. 53 to 59 correspond to FIGS. 26 to 33, with reference to which the first embodiment has been described.

To begin with, the above-described fabrication steps up to FIG. 37 are carried out, and the offset spacers 6n, 6p are formed of silicon oxide films.

Then, as shown in FIG. 53, using a photoresist 65 formed on the pMOSFET region, the gate electrode 7n on the nMOSFET region and the offset spacers 6n as a mask, atoms of Group V, e.g., arsenic (As) ions, which become n-type impurities, are implanted in the surface of the p-well region 2. The conditions for the ion implantation are, as in the second embodiment, an acceleration energy of 1.5 keV and a dosage of $1 \times 10^{15}$ cm$^{-2}$.

Next, as shown in FIG. 54, using a photoresist 66 formed on the p-well region 2, the gate electrode 7p and offset spacers 6p as a mask, atoms of Group III, e.g., boron (B) ions, which become p-type impurities, are implanted in the surface of the n-well region 3. The conditions for the ion implantation are, as in the second embodiment, an acceleration energy of 0.3 keV and a dosage of $1 \times 10^{15}$ cm$^{-2}$.

Figure 55:
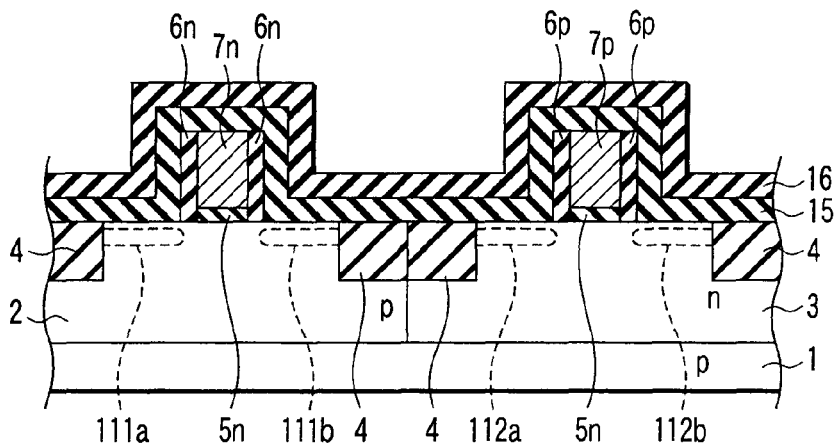

Subsequently, as shown in FIG. 55, a silicon oxide (SiO$_2$) film 15 is deposited by LPCVD at film formation temperatures of 600° C. or less. Further, a silicon nitride (Si$_3$N$_4$) film 16 is deposited on the silicon oxide (SiO$_2$) film 15 by LPCVD at film formation temperatures of 600° C. or less.

Figure 56:
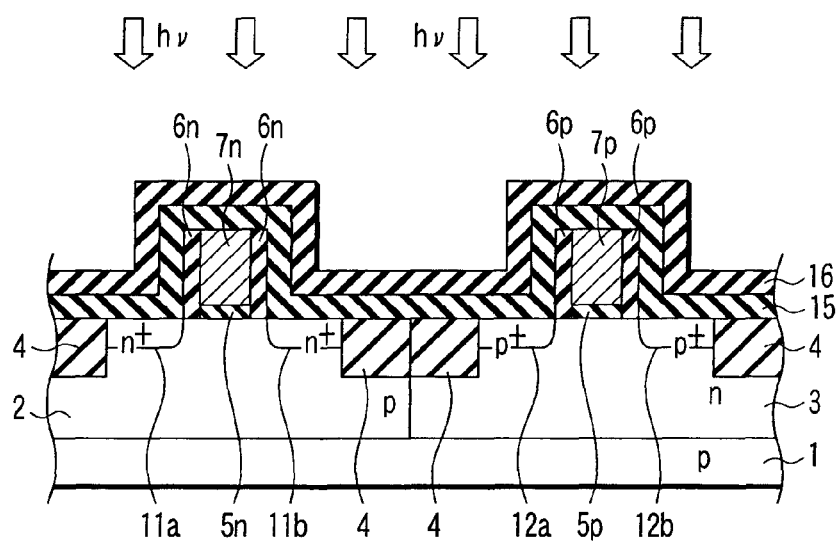

As shown in FIG. 56, using a flashtube as a heat source, an activation annealing process is performed. This step corresponds to the above-described step of FIG. 29. By this activation annealing process, shallow extension regions 11a, 11b, 12a and 12b are formed in regions in the Si substrate 1, which neighbor the gate electrodes 7n and 7p, offset spacers 6n and 6p and the device isolation regions 4.

Figure 57:
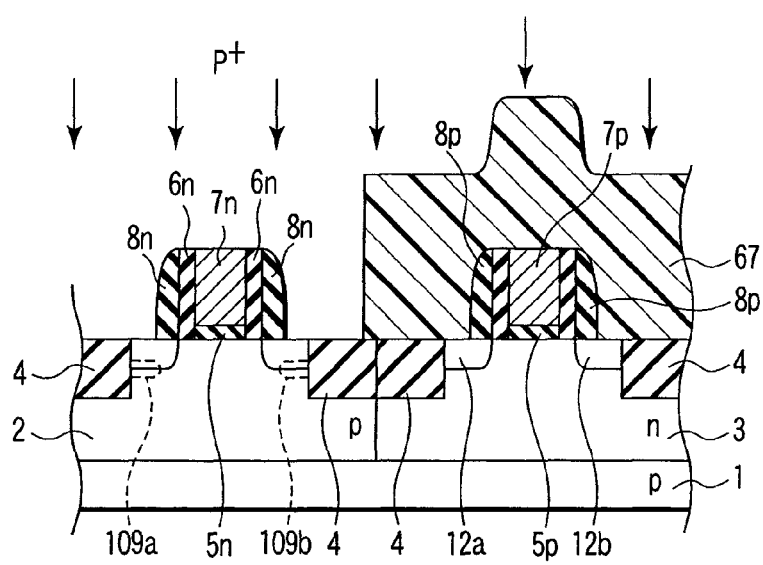

In a subsequently step illustrated in FIG. 57, the silicon nitride film 16 and silicon oxide film 15 are completely removed by hot phosphoric acid and hydrofluoric acid. Then, a silicon nitride (Si$_3$N$_4$) film is deposited by LPCVD at film formation temperatures of 600° C. or less. The silicon nitride film is etched by a method of leaving sidewall parts thereof using RIE, and thus the silicon nitride film is selectively left on the side surfaces of the offset spacers 6n, 6p. Thereby, sidewall spacers 8n, 8p are formed of silicon nitride films. The offset spacers 6n, 6p may be formed of silicon nitride films, and the sidewall spacers 8n, 8p may be formed of silicon oxide films. Subsequently, a photoresist 67 is formed on the surface of the n-well region 3. Using the photoresist 67, gate electrode 7n, offset spacers 6n and sidewall spacers 8n as a mask, atoms of Group V, e.g., phosphorus (P), which become n-type impurities, are ion-implanted in the surface of the p-well region 2. By this ion implantation, the impurity ions of Group V atoms are also implanted in the gate electrode 7n. The conditions for the ion implantation are, as in the second embodiment, an acceleration energy of 5 keV and a dosage of $3 \times 10^{15}$ cm$^{-2}$. As Group V atoms to be implanted, arsenic (As) is also usable. However, in the case of using P, defects due to ion implantation can be remedied more easily by activation heat treatment, and a pn junction leakage current can be suppressed.

Figure 58:
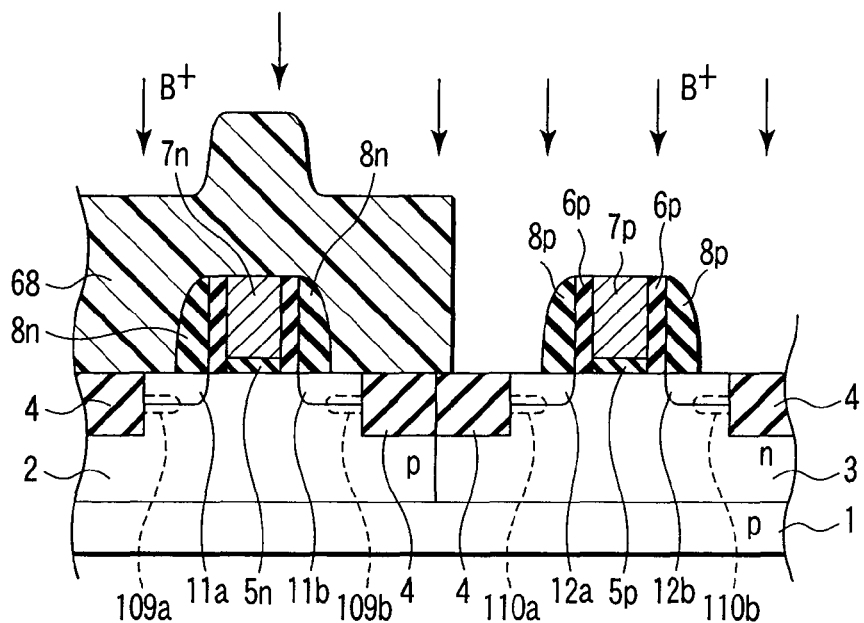

Subsequently, as shown in FIG. 58, using a photoresist 68 formed on the p-well region 2, gate electrode 7p, offset spacers 6p and sidewall spacers 8p as a mask, atoms of Group III, e.g., boron (B), which become p-type impurities, are ion-implanted in the surface of the n-well region 3. By this ion implantation, the impurity ions of Group III atoms are also implanted in the gate electrode 7p. The conditions for the ion implantation are, as in the second embodiment, an acceleration energy of 2 keV and a dosage of $3 \times 10^{15}$ cm$^{-2}$. In the state immediately after the end of the ion implantation illustrated in FIGS. 57 and 58, inactive source/drain regions 109a, 109b, 110a and 110b are formed in regions in the Si substrate 1, which neighbor the offset spacers 6n, 6p and the device isolation regions 4.

Figure 59:
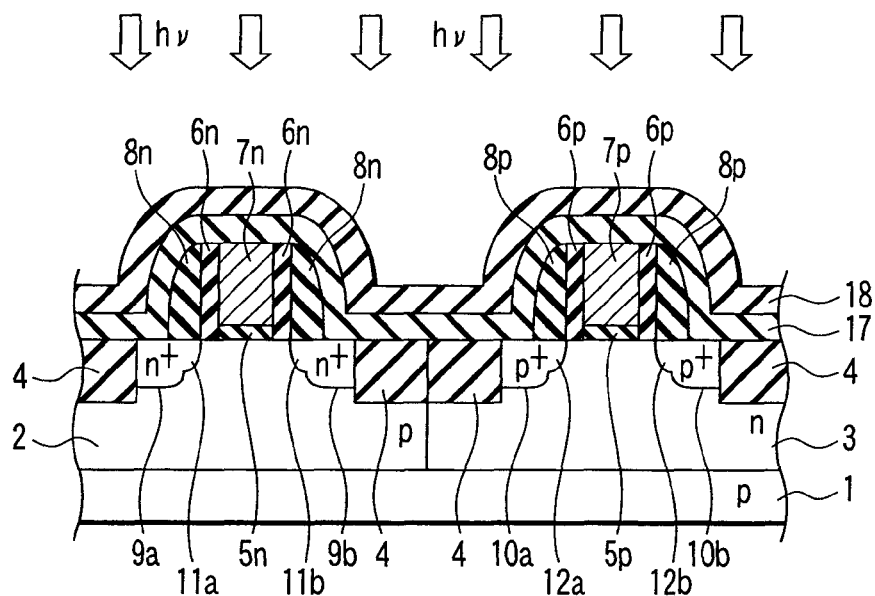

Subsequently, as shown in FIG. 59, a silicon oxide (SiO$_2$) film 17 is deposited by LPCVD at film formation temperatures of 600° C. or less. Further, a silicon nitride (Si$_3$N$_4$) film 18 is deposited the silicon oxide (SiO$_2$) film 17 by LPCVD at film formation temperatures of 600° C. or less. Using a halogen lamp as a heat source, an activation annealing process for the inactive source/drain regions 109a, 109b, 110a and 110b is carried out. The condition for the activation annealing process is a heat treatment condition in the hatched region in the double-logarithmic graph of FIG. 6 and, for example, RTA is conducted within 10 seconds at 1000° C. to 1050° C. or spike RTA is conducted with a peak temperature set at 1000° C. to 1050° C. By this activation annealing process, source/drain regions 9a, 9b, 10a and 10b, which are spaced apart from end portions of the gate electrodes 7n, 7p by a degree corresponding to the offset spacer 6n, 6p and sidewall spacer 8n, 8p and are in contact with the device isolation regions 4, are formed in the Si substrate 1. By this activation annealing process, the impurities, which are doped in the gate electrode 7n, 7p, can be diffused to the interface with the gate insulation film 5n, 5p, and crystal defects occurring in the Si substrate 1 due to ion implantation can be eliminated.

Thereafter, the sidewall spacers 23n, 24n, 23p and 24p are left so as to function to prevent a Ni silicide reaction in a later fabrication step. Thus, the basic structure of the semiconductor device according to the present modification is completed. The fabrication steps following the step of FIG. 59 are the same as those in the second embodiment, so a description thereof is omitted here. By the above-described fabrication method, too, the structure shown in FIG. 34 can be obtained.

Third Embodiment

Next, a semiconductor device and a method for fabricating the semiconductor device, according to a third embodiment of the invention, are described. FIG. 60 is a cross-sectional view of the semiconductor device according to the third embodiment.

As shown in FIG. 60, in the semiconductor device according to the third embodiment, the offset spacer 6p of the pMOSFET is removed from the structure shown in FIG. 34, which has been described in connection with the second embodiment. Specifically, the third embodiment is configured such that the offset spacer 6n, which has been described in connection with the second embodiment, is provided only in the nMOSFET in the structure shown in FIG. 1, which has been described in connection with the first embodiment.

As has been described in connection with the second embodiment, the presence of the offset spacer 6n in the nMOSFET reduces the overlap capacitance Cov. By choosing the film thickness of the offset spacer 6n in the range of about 1 to 10 nm, the gate overlap capacitance Cov per unit gate width can be set at about $1 \times 10^{-15}$ F/μm to $1 \times 10^{-16}$ F/μm.

Representatively, the film thickness Δd of about 4 nm can be adopted. By contrast, no offset spacer is provided in the pMOSFET. Accordingly, the overlap capacitance Cov between the extension region 11b and gate electrode 7n is less than the overlap capacitance Cov between the extension region 12a and the gate electrode 7p for the pMOSFET. In the other structural aspects, the third embodiment is the same as the first or second embodiment.

Figure 61:
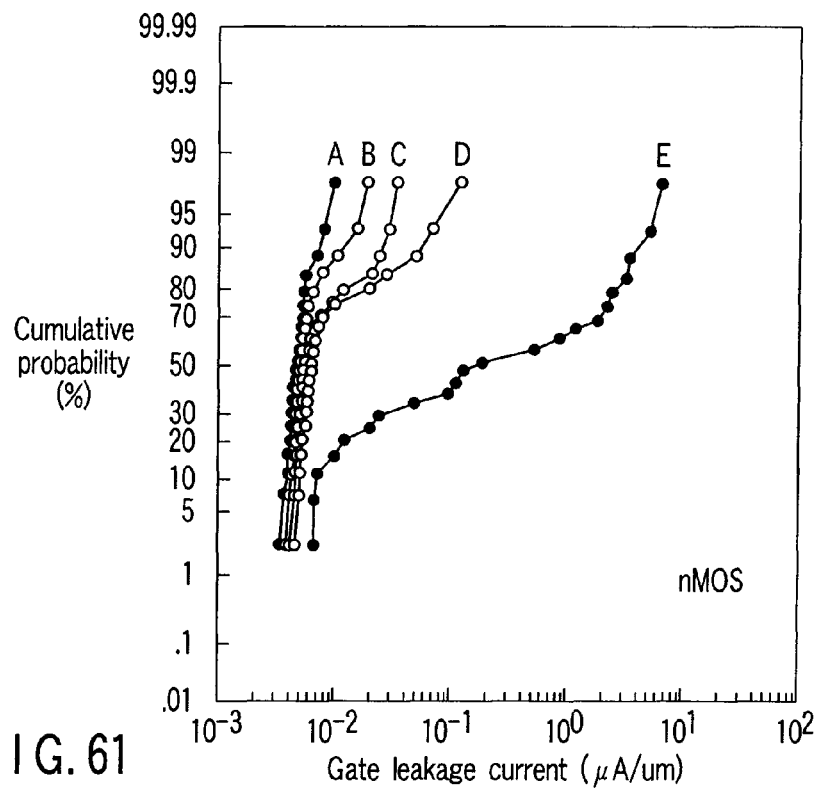
FIG. 61 is a graph showing the relationship between gate leakage currents and cumulative distributions of devices in connection with n-channel insulated-gate transistors according to the third embodiment and comparative examples.
Figure 62:
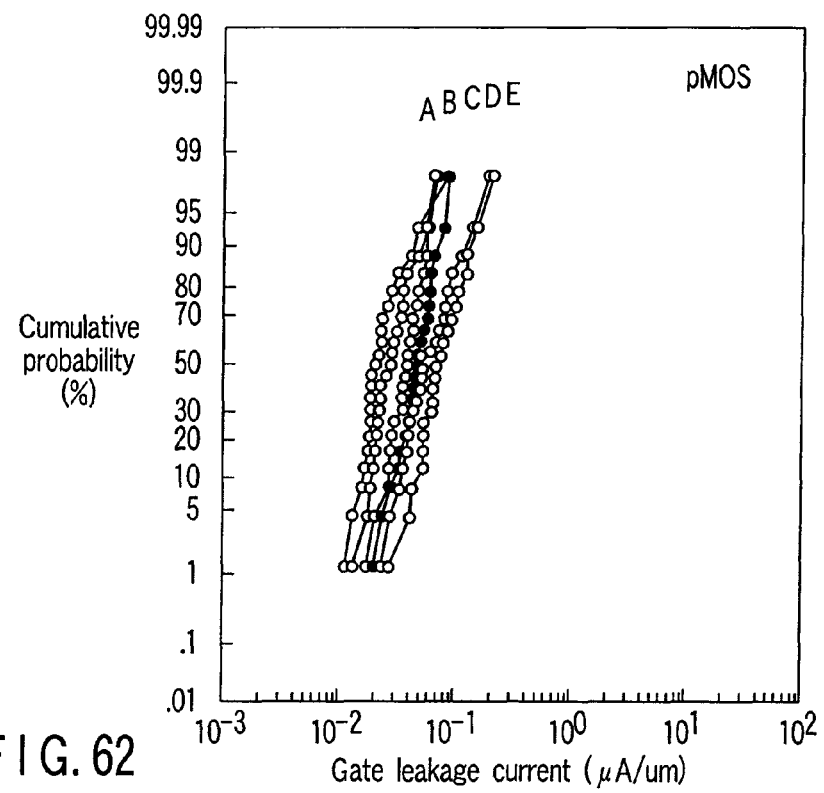
FIG. 62 is a graph showing the relationship between gate leakage currents and cumulative distributions of devices in connection with p-channel insulated-gate transistors according to the third embodiment and comparative examples.

FIG. 61 is a graph showing a cumulative probability of nMOSFETs versus a gate leakage current. In FIG. 61, respective curves are associated with wafers A to E each including a plurality of nMOSFETs. FIG. 61 shows a percentage (cumulative probability) of nMOSFETs, the gate leakage current of which is less than a certain value, in each wafer. FIG. 62 is a graph similar to the graph of FIG. 61, which relates to pMOSFETs. As is clear from the comparison between FIGS. 61 and 62, the nMOSFET has a higher gate leakage current than the pMOSFET, and the gate withstand voltage of the nMOSFET is worse.

FIGS. 63 and 64 are graphs (rolloff characteristics) showing gate threshold voltages Vth versus gate lengths $L_{gate}$ of nMOSFETs and pMOSFETs, respectively. In the characteristics shown, the diffusion layer depth $X_j$ of the extension region is set at $X_j$=15 n with respect to both the nMOSFET and pMOSFET. As is understood from FIGS. 63 and 64, the short-channel effect is worse in the nMOSFET than in the pMOSFET. In other words, in the case where the very rapid annealing is applied to the impurity activation step, the deterioration in characteristics becomes more conspicuous in the nMOSFET than in the pMOSFET, as the degree of microfabrication increases.

The reason why the gate withstand voltage of, the nMOSFET is worse than that of the pMOSFET is considered to be as follows. That is, in the nMOSFET, arsenic (As) or phosphorus (P), which has a great mass, is used as impurities for forming the diffusion layer. It is thus considered that in the nMOSFET, compared to the pMOSFET in which boron (B) is used, damage tends to easily occur due to impurity doping, and the light absorption ratio increases. As a result of the increase in light absorption ratio, it is considered that the annealing efficiency is enhanced, the impurities diffuse to the gate insulation film to form a leakage path, the gate withstand voltage deteriorates, and the impurities also diffuse in the lateral direction, leading to worsening in short-channel effect.

Next, a method for fabricating the semiconductor device according to the present embodiment is described with reference to FIGS. 65 to 81. FIGS. 65 to 81 are cross-sectional views successively illustrating fabrication steps of the semiconductor device according to this embodiment. The semiconductor device fabrication method to be described below is merely an example, and the semiconductor device of this embodiment may, needless to say, be fabricated by other various methods including modifications of the method described below. For example, in the description below, the gate electrodes 7n, 7p are formed of polycrystalline Si films according to the semiconductor device fabrication methods of the first and second embodiments. However, this is merely an example, and the gate electrodes 7n, 7p may be formed of polycrystalline SiGe (Ge concentration: 10 to 30 atomic %).

Figure 65:
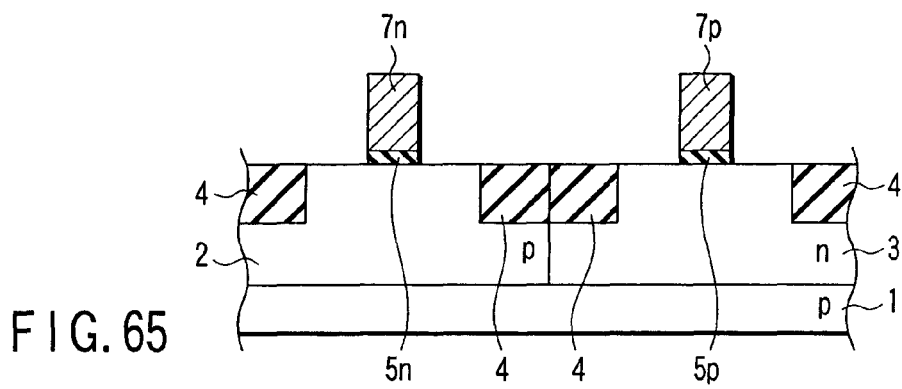
FIGS. 65 to 81 are cross-sectional views illustrating first to 17th fabrication steps of the semiconductor device according to the third embodiment of the invention.
Figure 66:
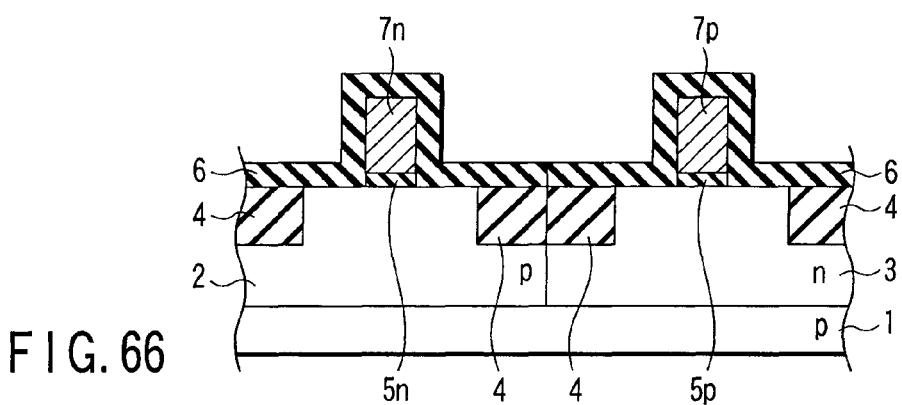

To start with, the fabrication steps of FIGS. 2 to 5, as described in connection with the first embodiment, are carried out. FIG. 65 is a cross-sectional view corresponding to the end of the fabrication step of FIG. 5. Subsequently, in this embodiment, offset spacers 6n for the nMOSFET are formed. Specifically, as shown in FIG. 66, a silicon oxide (SiO$_2$) film 6 is formed on the gate electrodes 7n, 7p, Si substrate 1 and device isolation regions 4 by LPCVD at 600° C. or less within the range of film thickness of about 2 to 10 nm, for example, with a film thickness of 4 nm. In place of the silicon oxide film 6, a silicon nitride (Si$_3$N$_4$) film may be formed within the range of film thickness of about 2 to 10 nm, for example, with a film thickness of 4 nm.

Figure 67:
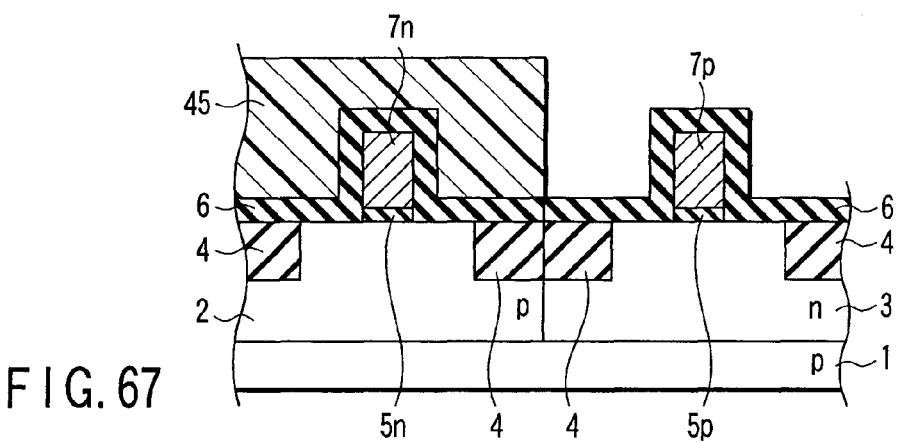

In a subsequent step shown in FIG. 67, a photoresist film 45 is formed on the surface of the p-well region 2.

Figure 68:
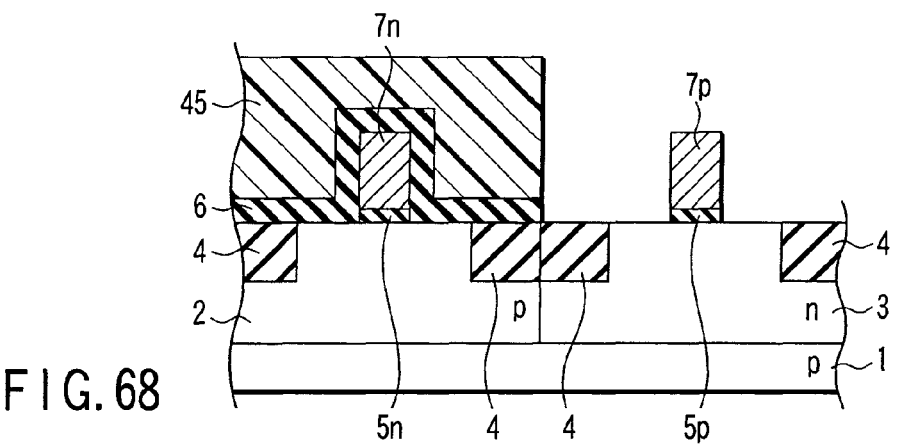
Figure 69:
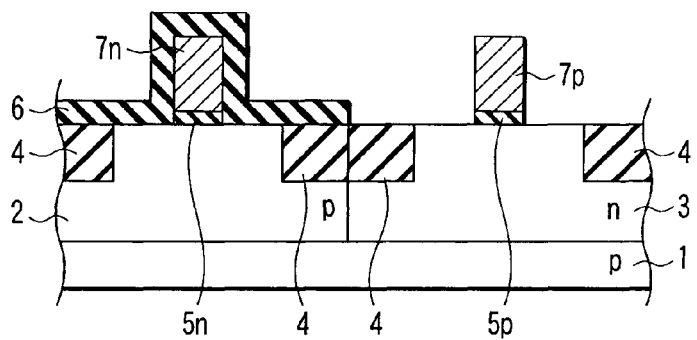

Then, as shown in FIG. 68, the silicon oxide film 6 on the pMOSFET region is etched away by diluted hydrofluoric acid. In the case where a silicon nitride film is used in place of the silicon oxide film 6, the silicon oxide film 6 on the pMOSFET region is etched away by hot phosphoric acid. Following this step, the photoresist 45 is removed, as shown in FIG. 69.

Figure 70:
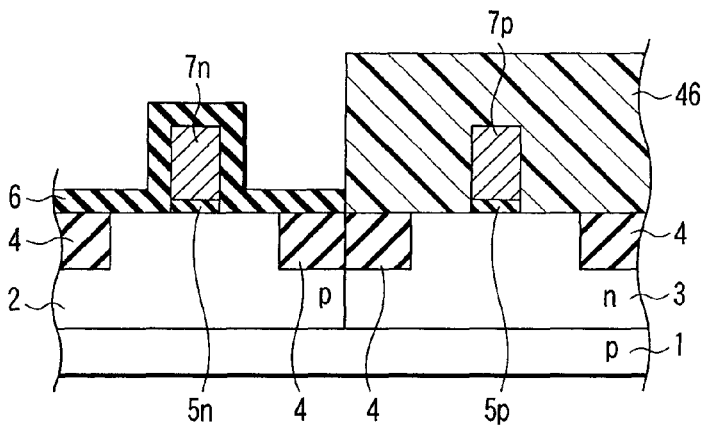

Next, as shown in FIG. 70, a photoresist film 46 is formed on the surface of the n-well region 3.

Figure 71:
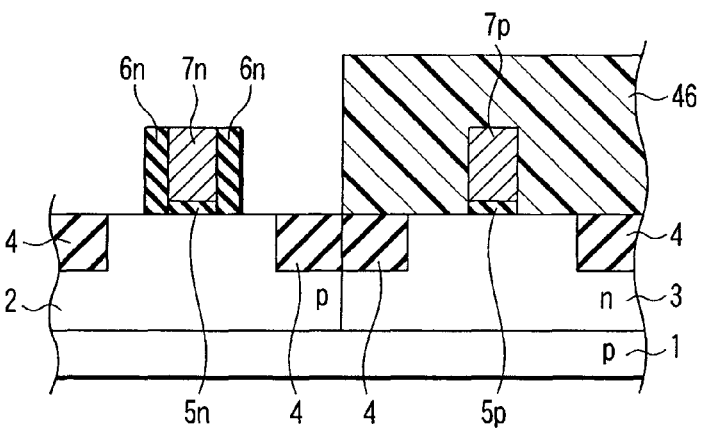

As shown in FIG. 71, the silicon oxide film 6 on the nMOSFET region is etched by RIE and selectively left on side surfaces of the gate electrode 7n and gate insulation film 5n. As a result, offset spacers 6n, as shown in FIG. 71, are completed.

Figure 72:
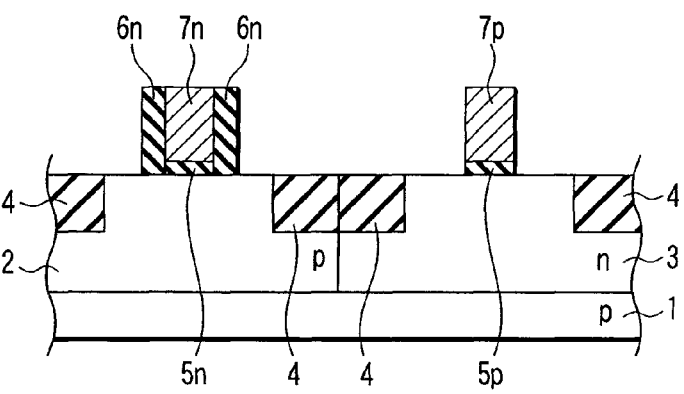

Following the above step, the photoresist film 46 is removed as shown in FIG. 72. As a result, a structure is realized wherein the offset spacers 6n are formed on the side surfaces of the gate electrode 7n and gate insulation film 5n of the nMOSFET region, and no offset spacer is formed on side surfaces of the gate electrode 7p and gate insulation film 5p of the pMOSFET region.

Figure 73:
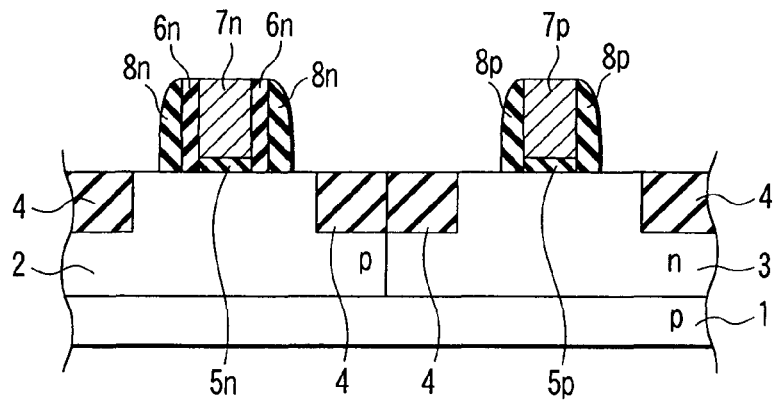

Subsequently, the fabrication steps of FIGS. 7 to 18 which have been described in connection with the first embodiment (i.e., fabrication steps of FIGS. 38 to 47 described in connection with the second embodiment) are performed. Specifically, a silicon nitride (Si$_3$N$_4$) film is deposited by LPCVD at 600° C. or less. The silicon nitride film is etched by a method of leaving sidewall parts thereof using RIE. As a result, as shown in FIG. 73, sidewall spacers 8n are formed on the side surfaces of the offset spacers 6n in the nMOSFET region, and sidewall spacers 8p are formed on the side surfaces of the gate electrode 7p and gate insulation film 5p in the pMOSFET region. Alternatively, the offset spacers 6n may be formed of silicon nitride films, and the sidewall spacers 8n, 8p may be formed of silicon oxide films.

Figure 74:
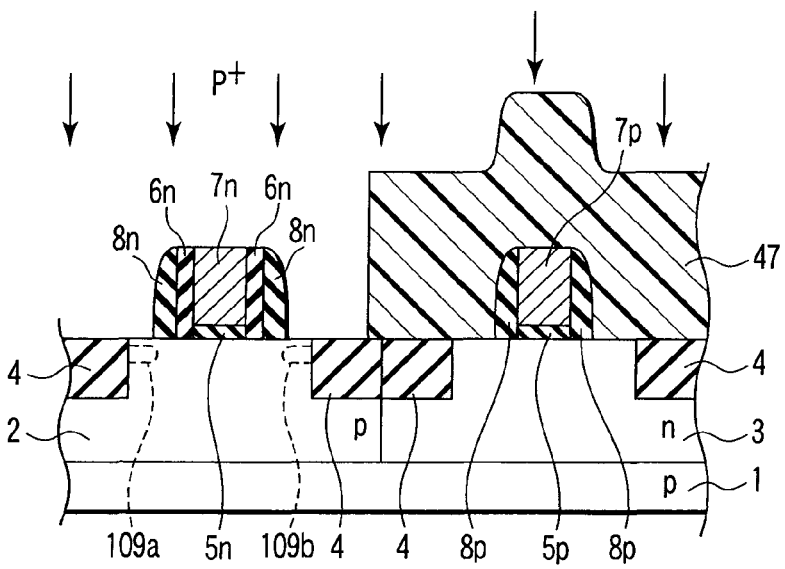

In the next fabrication step, as shown in FIG. 74, using a photoresist film 47 formed on the n-well region, the gate electrode 7n, offset spacers 6n and sidewall spacers 8n as a mask, atoms of Group V, e.g., phosphorus (P), which become n-type impurities, are ion-implanted in the surface of the p-well region 2. At this time, the ions of Group V atoms are also implanted in the gate electrode 7n. The conditions for the ion implantation are an acceleration energy of 5 keV and a dosage of $3 \times 10^{15}$ cm$^{-2}$. As Group V atoms to be implanted, arsenic (As) is also usable. However, in the case of using P, defects due to ion implantation can be remedied more easily by activation heat treatment, and a pn junction leakage current can be suppressed. The photoresist 47 is then removed.

Figure 75:
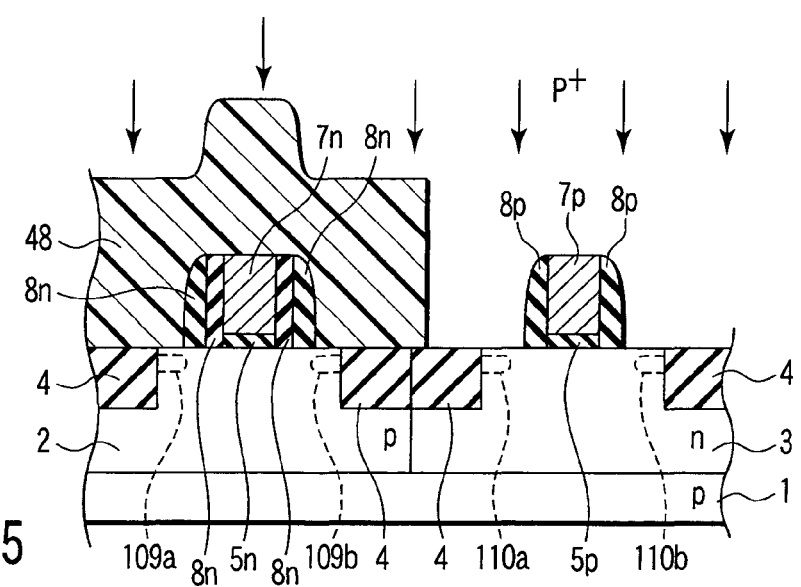

Next, as shown in FIG. 75, using a photoresist film 48 formed on the p-well region 2, the gate electrode 7p and sidewall spacers 8p as a mask, atoms of Group III, e.g., boron (B), which become p-type impurities, are ion-implanted in the surface of the n-well region 3. At this time, the impurity ions of Group III atoms are also implanted in the gate electrode 7p. The conditions for the ion implantation are an acceleration energy of 2 keV and a dosage of $3 \times 10^{15}$ cm$^{-2}$.

Figure 76:
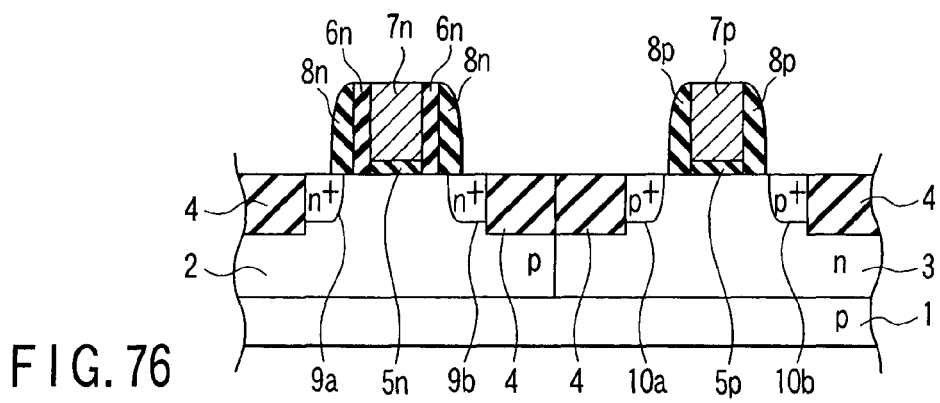

By the ion implantation in FIGS. 74 and 75, inactive source/drain regions 109a, 109b, 110a and 110b are formed in the Si substrate 1. Then, an activation annealing process for the inactive source/drain regions 109a, 109b, 110a and 110b is performed by using a halogen lamp as a heat source. The condition for the activation annealing process is a heat treatment condition in the hatched region in the double-logarithmic graph of FIG. 6 and, for example, RTA is conducted within 10 seconds at 1000° C. to 1050° C. or spike RTA is conducted with a peak temperature set at 1000° C. to 1050° C. By this activation annealing process, as shown in FIG. 76, a source/drain region 9a, 9b, which is spaced apart from an end portion of the gate electrode 7n by a degree corresponding to the total thickness of the offset spacer 6n and sidewall spacer 8n and is in contact with the device isolation region 4, is formed in the p-well region 2. In addition, a source/drain region 10a, 10b, which is spaced apart from an end portion of the gate electrode 7p by a degree corresponding to the thickness of the sidewall spacer 8p and is in contact with the device isolation region 4, is formed in the Si substrate 1. By this activation annealing process, the impurities, which are doped in the gate electrode 7n, 7p, can be diffused to the interface with the gate insulation film 5n, 5p, and crystal defects occurring in the Si substrate 1 due to ion implantation can be eliminated. This fabrication step corresponds to the step of FIG. 10 which has been described in connection with the first embodiment.

Figure 77:
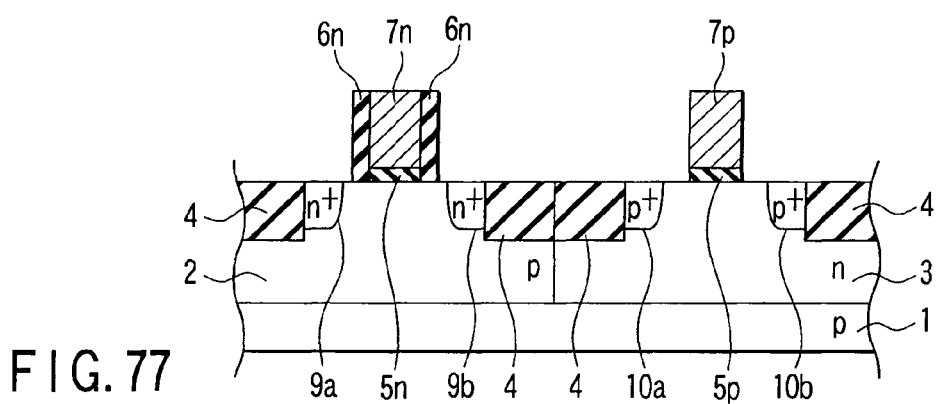

Thereafter, as shown in FIG. 77, the sidewall spacers 8n and 8p, which are formed of silicon nitride, are removed by using hot phosphoric acid.

Figure 78:
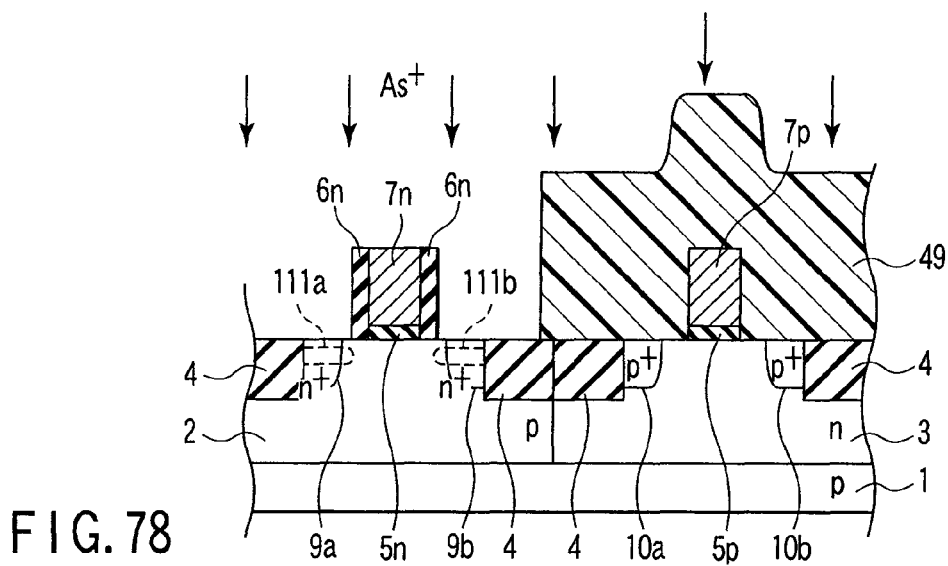

In the next step illustrated in FIG. 78, using a photoresist film 49 formed on the pMOSFET region, the gate electrode 7n and offset spacers 6n as a mask, atoms of Group V, e.g., arsenic (As), which become n-type impurities, are ion-implanted in the surface of the p-well region 2. The conditions for the ion implantation are an acceleration energy of 5 keV and a dosage of $2 \times 10^{14}$ cm$^{-2}$. The photoresist 49 is then removed.

Figure 79:
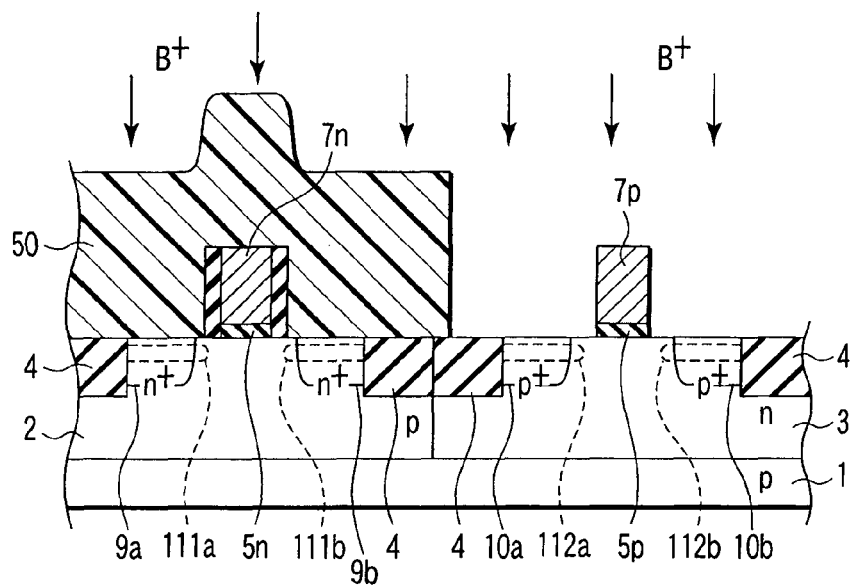

As shown in FIG. 79, using a photoresist film 50 formed on the p-well region 2 and the gate electrode 7p as a mask, atoms of Group III, e.g., boron (B), which become p-type impurities, are ion-implanted in the surface of the n-well region 3. The conditions for the ion implantation are an acceleration energy of 0.9 keV and a dosage of $2 \times 10^{14}$ cm$^{-2}$. The fabrication steps of FIGS. 78 and 79 correspond to the fabrication steps of FIG. 12 and FIG. 13 in the first embodiment.

By the steps of FIGS. 78 and 79, inactive shallow extension regions 111a, 111b are formed in the p-well region 2. In addition, inactive shallow extension regions 112a, 112b are formed in the n-well region 3.

Figure 80:
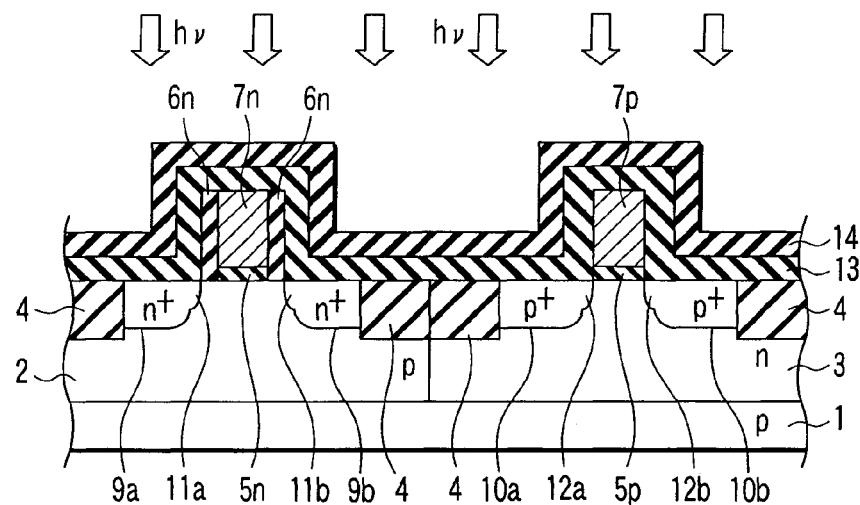

Subsequently, as shown in FIG. 80, a silicon oxide (SiO$_2$) film 13 and a silicon nitride (Si$_3$N$_4$) film 14 are successively deposited by LPCVD at 600° C. or less. Using a flashtube as a heat source, an activation annealing process is performed. As the condition for the activation annealing process, the relationship between the heat treatment temperature and heat treatment time, which is indicated in the hatched region in the double-logarithmic graph of FIG. 6, is preferable. In particular, the condition of the temperature range of 1100° C. or above is preferable. In this case, the Si substrate 1 is placed on a hot plate. In the state in which the Si substrate 1 is heated (auxiliary heating) from the back side, the upper surface of the Si substrate 1 should preferably be heated by heat emitted from the flashtube light source. This annealing process step is the same as the step of FIG. 17 which has been described in connection with the first embodiment. By the annealing process, shallow extension regions 11a and 11b are formed in the Si substrate 1 with an offset of a distance from an end portion of the gate electrode 7n, which corresponds to the thickness of the offset spacer 6n. In addition, shallow extension regions 12a and 12b are formed in the n-well region 3 with no intended offset from an end portion of the gate electrode 7p.

Figure 81:
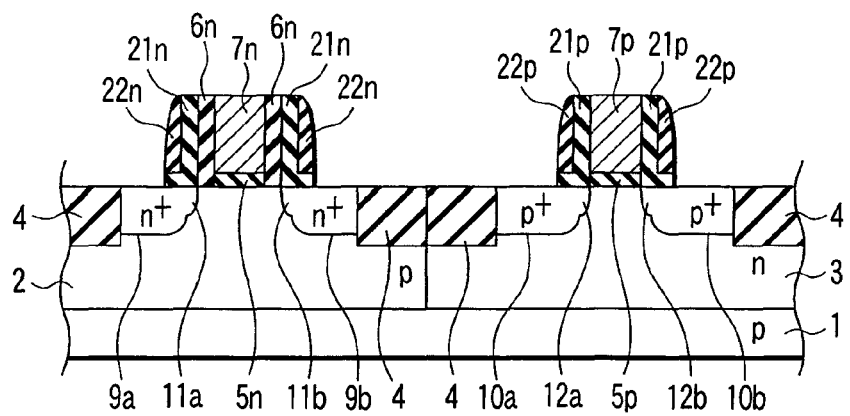

In a subsequently step illustrated in FIG. 81, the silicon nitride film 14 and silicon oxide film 13 are etched by RIE. Thereby, in the nMOSFET region, the silicon nitride film 14 and silicon oxide film 13 are selectively left on the side surfaces of the offset spacers 6n. In addition, in the pMOSFET region, the silicon nitride film 14 and silicon oxide film 13 are selectively left on the side surfaces of the gate electrode 7p and gate insulation film 5p. Alternatively, after the silicon nitride film 14 and silicon oxide film 13 are completely removed by hot phosphoric acid and hydrofluoric acid or after the uppermost-layer silicon nitride film 14 is removed by hot phosphoric acid, a silicon nitride film and silicon oxide film, for instance, may newly be formed. In this case, the silicon nitride film and silicon oxide film are etched by RIE and selectively left on the side surfaces of the offset spacer 6n in the nMOSFET region, and selectively left on the side surfaces of the side surfaces of the gate electrode 7p and gate insulation film 5p in the pMOSFET region. Thereby, sidewall spacers 21n, 21p, 22n and 22p are completed. This fabrication step corresponds to the step of FIG. 18 which has been described in connection with the first embodiment.

The subsequent fabrication steps are the same as those of the semiconductor device fabrication methods according to the first and second embodiments, and a description thereof is omitted here. By the above-described process, the semiconductor device with the CMOS structure, as shown in the cross section of FIG. 60, which includes the extension regions 11a, 11b, 12a, 12b each having a junction depth of 20 nm or less, is completed.

According to the semiconductor device fabrication method of the third embodiment of the invention, the gate overlap capacitance Cov can preferentially be reduced in the nMOSFET having a low gate withstand voltage and poor rolloff characteristics. Therefore, the characteristics of the nMOSFET can independently be enhanced without degrading the current driving power of the pMOSFET.

Fourth Embodiment

Next, a semiconductor device and a method for fabricating the semiconductor device, according to a fourth embodiment of the invention, are described. FIG. 82 is a cross-sectional view of the semiconductor device according to the fourth embodiment.

As shown in FIG. 82, in the semiconductor device according to the fourth embodiment, the thickness of the offset spacer 6p of the pMOSFET is made less than the thickness of the offset spacer 6n of the nMOSFET in the structure shown in FIG. 34, which has been described in connection with the second embodiment. In the description below, the offset spacers of the nMOSFET according to the present embodiment are referred to as "offset spacers 6na", and the offset spacers of the pMOSFET are referred to as "offset spacers 6pa".

The present embodiment is based on the following concept. As has been described in connection with the third embodiment, the gate withstand voltage of the nMOSFET is lower than that of the pMOSFET (see FIGS. 61 and 62) and the short-channel effect of the nMOSFET is worse than that of the pMOSFET (see FIGS. 63 and 64). In other words, in the case where the very rapid annealing technique is applied to the impurity activation step, the deterioration in characteristics becomes more conspicuous in the nMOSFET than in the pMOSFET, as the degree of microfabrication becomes higher. As a measure to cope with this problem, in the third embodiment, the offset spacers 6n are provided only in the nMOSFET. On the other hand, in the present fourth embodiment, the thickness of the offset spacer is made different between the nMOSFET and pMOSFET, and the thickness of the offset spacer 6na is made greater than that of the offset spacer 6pa.

Next, a method for fabricating the semiconductor device shown in FIG. 82 is described with reference to FIGS. 83 to 97. FIGS. 83 to 97 are cross-sectional views successively illustrating fabrication steps of the semiconductor device shown in FIG. 82. The semiconductor device fabrication method to be described below is merely an example, and the semiconductor device of this embodiment may be fabricated by other various methods. For example, in the description below, the gate electrodes 7n, 7p are formed of polycrystalline Si films according to the semiconductor device fabrication methods of the first and second embodiments. However, the gate electrodes 7n, 7p may be formed of polycrystalline SiGe (Ge concentration: 10 to 30 atomic %).

Figure 83:
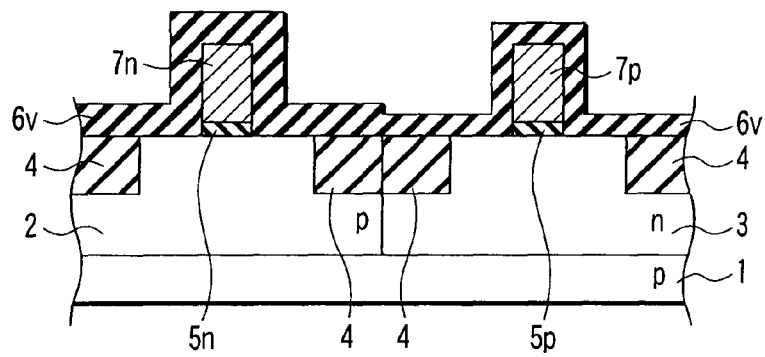
FIGS. 83 to 97 are cross-sectional views illustrating first to 15th fabrication steps of the semiconductor device according to the fourth embodiment of the invention.

To start with, the fabrication steps up to the step of FIG. 69, as described in connection with the third embodiment, are carried out, and a silicon oxide film 6 is formed on the p-well region 2. Subsequently, as shown in FIG. 83, a silicon oxide ($SiO_2$) film 6v with a thickness of about 1 to 5 nm is formed on the silicon oxide film 6 of the nMOSFET region and on the gate electrode 7n, Si substrate 1 and device isolation regions 4 in the pMOSFET region by LPCVD at 600° C. or less. In place of the silicon oxide film 6v, a silicon nitride ($Si_3N_4$) film may be deposited.

Assume now that the thickness of the silicon oxide film 6 that is deposited in the step of FIG. 66 is set at about 4 nm, and the thickness of the silicon oxide film 6v that is deposited in the step of FIG. 83 is set at 2 nm. In this case, in the nMOSFET region, the silicon oxide film with a thickness of 6 nm, which is the total thickness of the silicon oxide film 6 and silicon oxide film 6v, is formed. In the pMOSFET region, the silicon oxide film with a thickness of 2 nm, which is the thickness of only the silicon oxide film 6v, is formed. For the purpose of convenience, FIG. 83 depicts the composite film of the silicon oxide film 6 and silicon oxide film 6v in the nMOSFET region as if the silicon oxide film 6v was formed. Actually, however, the silicon oxide film 6v that is shown is a double-layer stacked film of the silicon oxide layers 6 and 6v. In the meantime, films with different dielectric constants may be deposited. For example, a silicon oxide film 6 may be deposited in the step of FIG. 66, and a silicon nitride film 6v may be deposited in the step of FIG. 83.

Figure 84:
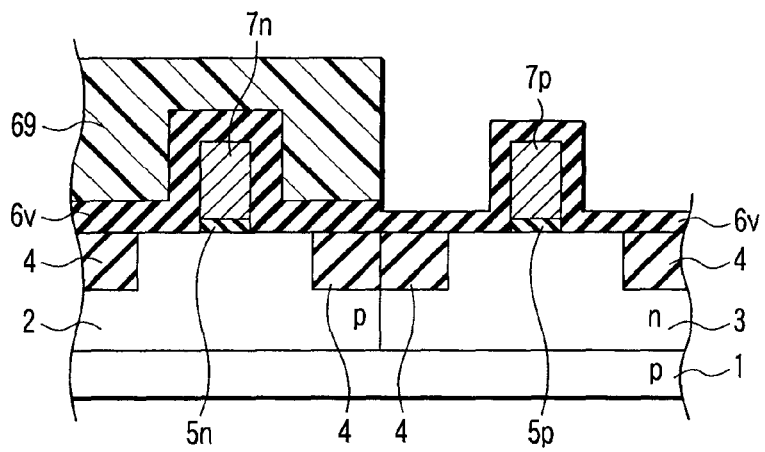

In a subsequent step shown in FIG. 84, a photoresist film 69 is formed on the surface of the p-well region 2.

Figure 85:
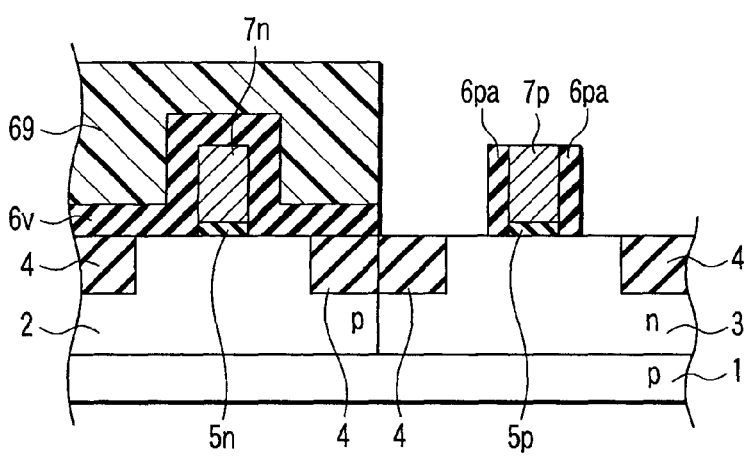

Then, as shown in FIG. 85, the silicon oxide film 6v on the pMOSFET region is etched by a method of leaving sidewall parts thereof using RIE, and thus the thin silicon oxide film 6v is subjected to directive etching. As a result, the thin silicon oxide film 6v is selectively left on the side surfaces of the gate electrode 7p and gate insulation film 5p, and offset spacers 6pa are completed. Then, the photoresist 69 is removed.

Figure 86:
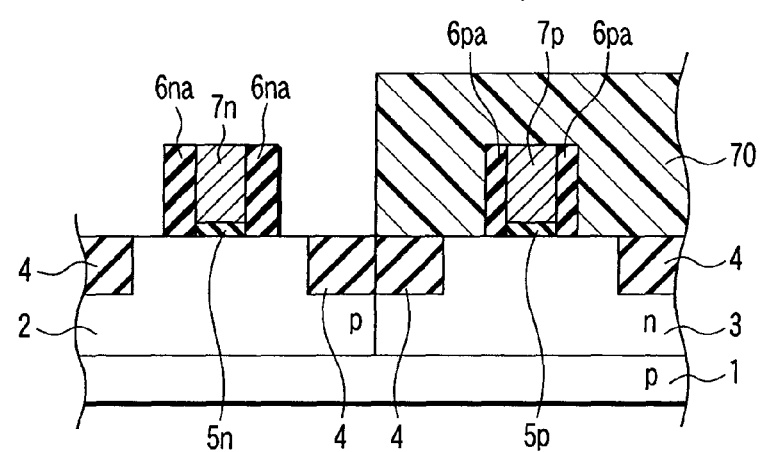

Next, as shown in FIG. 86, a photoresist film 70 is formed on the n-well region 3.

Figure 87:
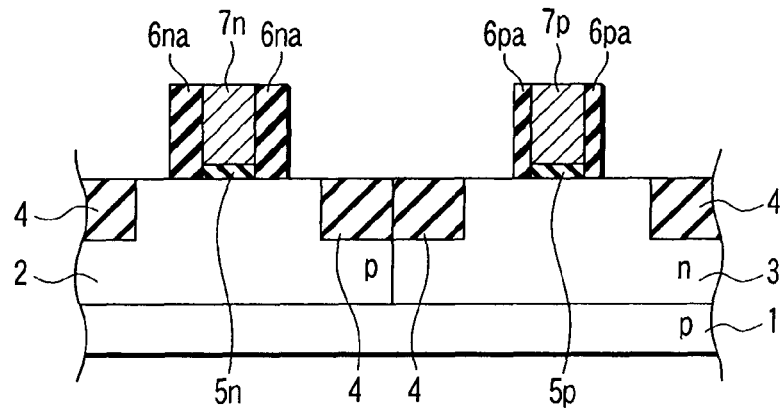

As shown in FIG. 87, the silicon oxide film 6v on the nMOSFET region is etched by a method of leaving sidewall parts thereof using RIE, and thus the thick silicon oxide film 6v is subjected to directive etching. As a result, the thick silicon oxide film 6v is selectively left on the side surfaces of the gate electrode 7n and gate insulation film 5n, and offset spacers 6na are completed. Then, the photoresist 70 is removed. As a result, the offset spacers 6na with a thickness of 6 nm are formed in the nMOSFET region, and the offset spacers 6pa with a thickness of 2 mm are formed in the pMOSFET region.

Figure 88:
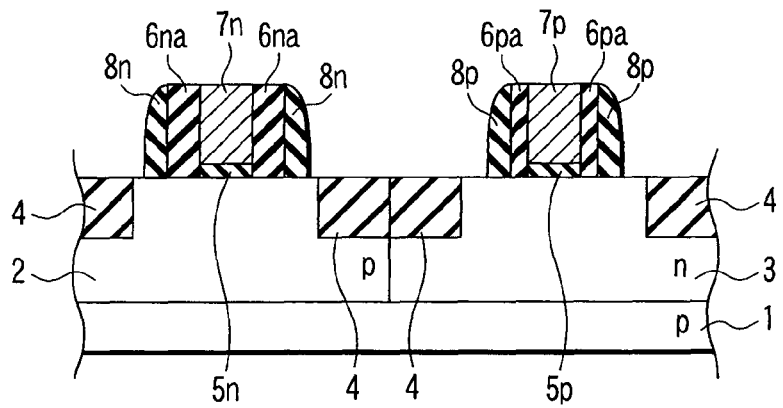

Subsequently, the fabrication steps of FIGS. 7 to 18 which have been described in connection with the first embodiment (i.e., fabrication steps of FIGS. 38 to 47 described in connection with the second embodiment; or fabrication steps of FIGS. 73 to 81 described in connection with the third embodiment) are performed. Specifically, a silicon nitride ($Si_3N_4$) film is deposited by LPCVD at 600° C. or less. The silicon nitride film is etched by a method of leaving sidewall parts thereof using RIE, and is selectively left on side surfaces of the offset spacers 6na, 6pa. As a result, as shown in FIG. 88, sidewall spacers 8n, 8p are formed on the side surfaces of the offset spacers 6na, 6pa. Alternatively, the offset spacers 6na, 6pa may be formed of silicon nitride films, and the sidewall spacers 8n, 8p may be formed of silicon oxide film.

Figure 89:
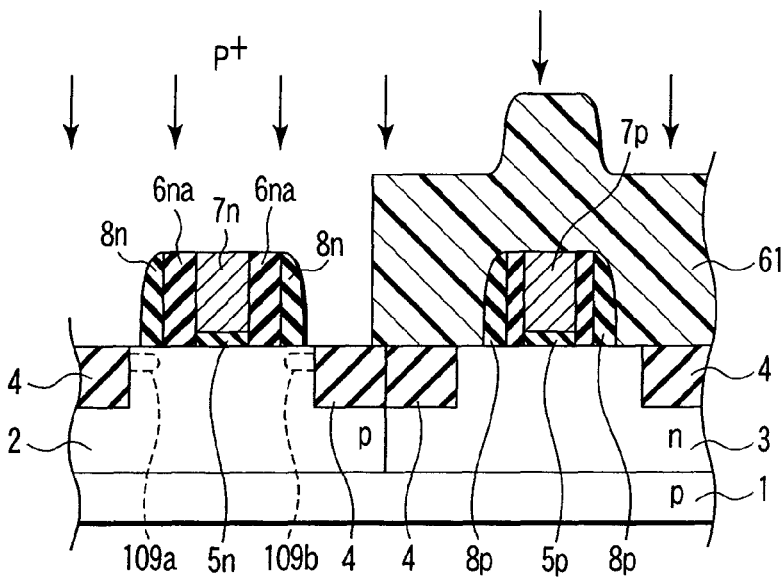

In the next fabrication step, as shown in FIG. 89, using a photoresist film 61 formed on the n-well region 3, the gate electrode 7n, offset spacers 6na and sidewall spacers 8n as a mask, atoms of Group V, e.g., phosphorus (P), which become n-type impurities, are ion-implanted in the surface of the p-well region 2. At this time, the ions of Group V atoms are also implanted in the gate electrode 7n. The conditions for the ion implantation are the same as has been described with reference to FIG. 8 in connection with the first embodiment. The photoresist 61 is then removed.

Figure 90:
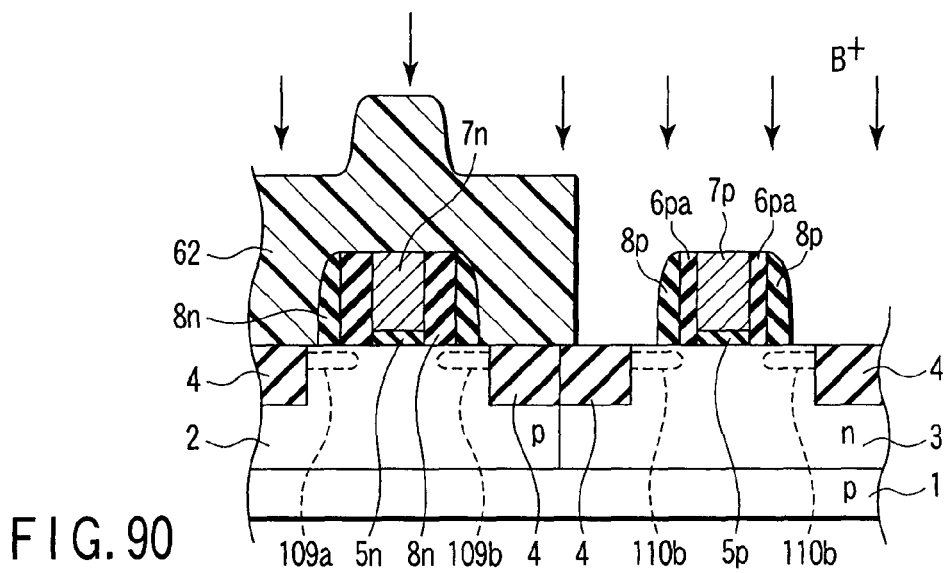

Next, as shown in FIG. 90, using a photoresist film 62 formed on the p-well region 2, the gate electrode 7p, offset spacers 6pa and sidewall spacers 8p as a mask, atoms of Group III, e.g., boron (B), which become p-type impurities, are ion-implanted in the surface of the n-well region 3. This fabrication step is the same as has been described with reference to FIG. 9 in connection with the first embodiment.

Figure 91:
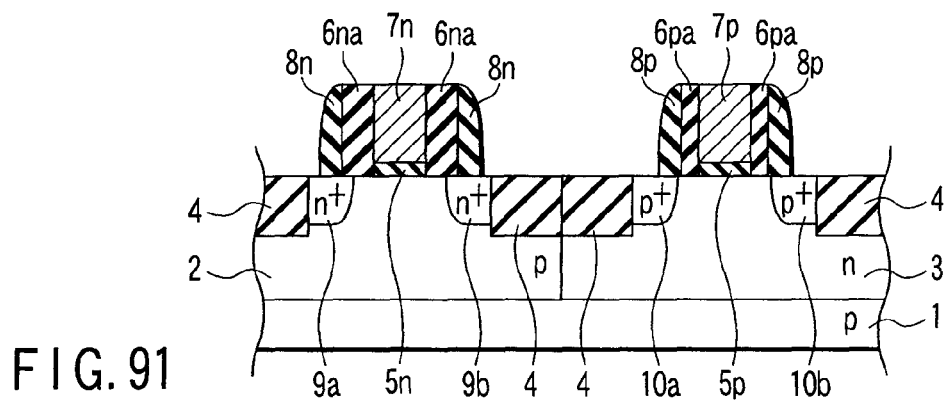

By the ion implantation in FIGS. 89 and 90, inactive source/drain regions 109a and 109b are formed in those portions of the p-well region 2, which neighbor the offset spacers 6na and device isolation regions 4. In addition, inactive source/drain regions 110a and 110b are formed in those portions of the n-well region 3, which neighbor the offset spacers 6pa and device isolation regions 4. Then, an activation annealing process for the inactive source/drain regions 109a, 109b, 110a and 110b is performed by using a halogen lamp as a heat source. The condition for the activation annealing process is a heat treatment condition in the hatched region in the double-logarithmic graph of FIG. 6 and, for example, RTA is conducted within 10 seconds at 1000° C. to 1050° C. or spike RTA is conducted with a peak temperature set at 1000° C. to 1050° C. This annealing process is the same as has been described with reference to FIG. 10 in connection with the first embodiment. By this annealing process, as shown in FIG. 91, source/drain regions 9a, 9b, 10a, and 10b, which are spaced apart from end portions of the gate electrodes 7n, 7p and are in contact with the device isolation region 4, are formed in the Si substrate 1.

Figure 92:
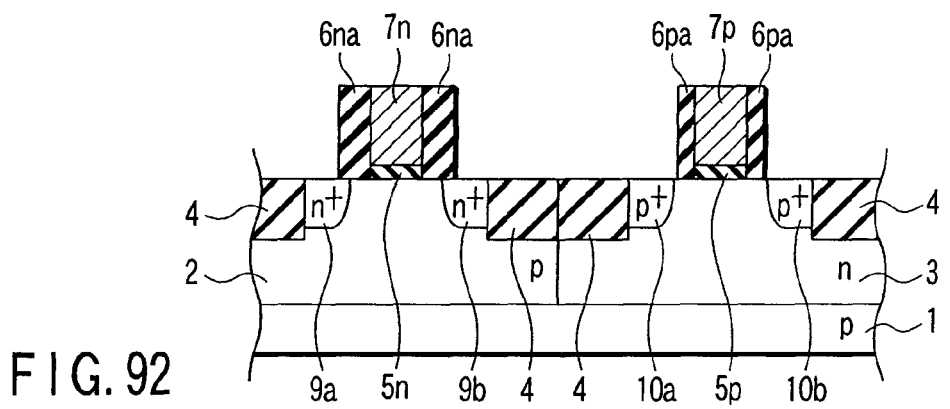

Thereafter, as shown in FIG. 92, the sidewall spacers 8n and 8p, which are formed of silicon nitride, are removed by using hot phosphoric acid.

Figure 93:
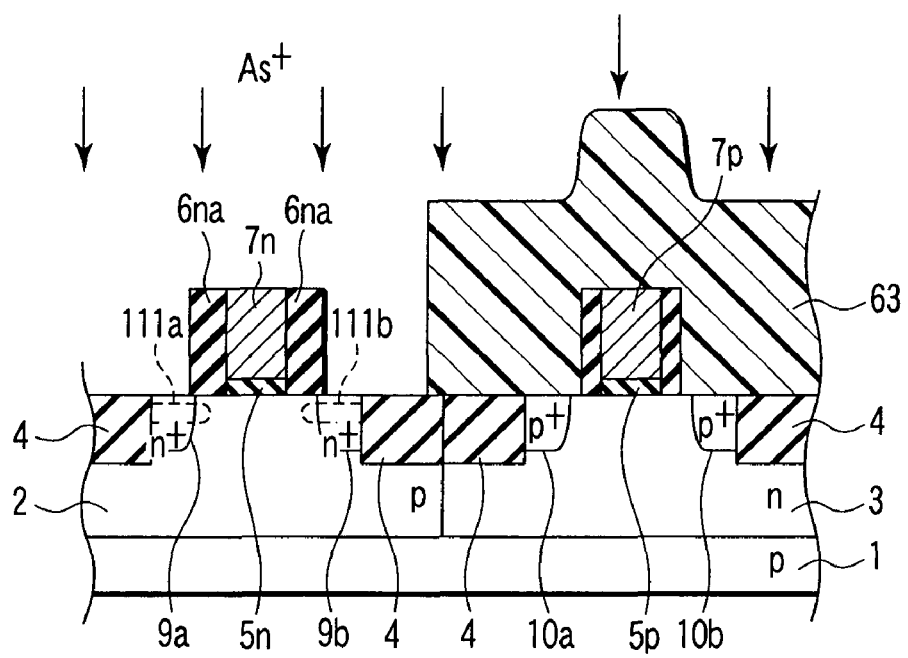

In the next step illustrated in FIG. 93, using a photoresist film 63 formed on the n-well region 3, the gate electrode 7n and offset spacers 6na as a mask, atoms of Group V, e.g., arsenic (As), which become n-type impurities, are ion-implanted in the surface of the p-well region 2. The conditions for the ion implantation are an acceleration energy of 5 keV and a dosage of $2 \times 10^{14}$ $cm^{-2}$. This fabrication step corresponds to the step of FIG. 12 in the first embodiment. The photoresist 63 is then removed.

Figure 94:
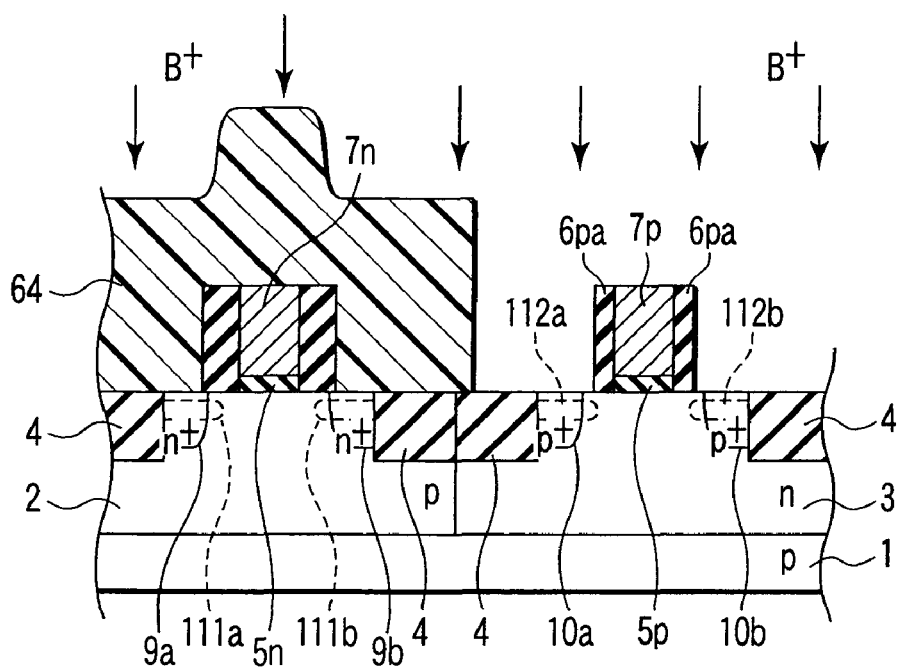

As shown in FIG. 94, using a photoresist film 64 formed on the p-well region 2, the gate electrode 7p and offset spacers 6pa as a mask, atoms of Group III, e.g., boron (B), which become p-type impurities, are ion-implanted in the surface of the n-well region 3. The conditions for the ion implantation are an acceleration energy of 0.9 keV and a dosage of $2\times10^{14}$ cm$^{-2}$.

By the steps of FIGS. 93 and 94, inactive shallow extension regions 111a, 111b, 112a and 112b are formed in those portions of the p-well region 2 and n-well region 3, which neighbor the gate electrodes 7n, 7p and device isolation regions 4.

Figure 95:
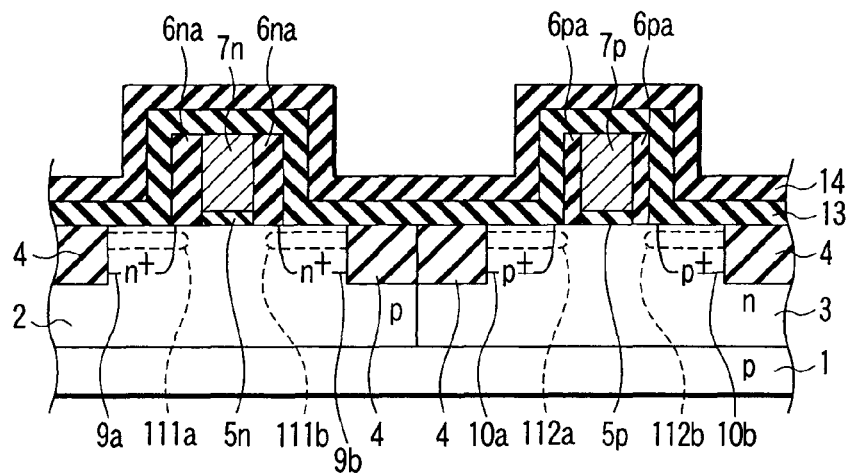

Subsequently, as shown in FIG. 95, a silicon oxide (SiO$_2$) film 13 and a silicon nitride (Si$_3$N$_4$) film 14 are successively deposited by LPCVD at film formation temperatures of 600° C. or less.

Figure 96:
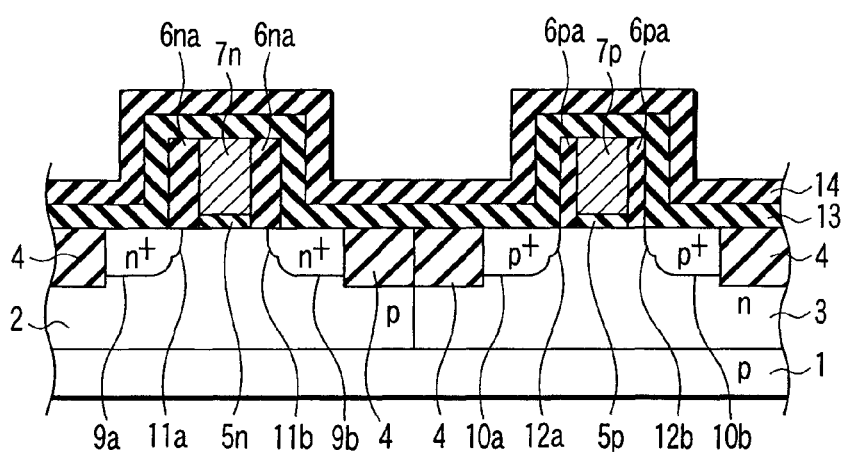

As shown in FIG. 96, using a flashtube as a heat source, an activation annealing process is performed. As the condition for the activation annealing process, the relationship between the heat treatment temperature and heat treatment time, which is indicated in the hatched region in the double-logarithmic graph of FIG. 6, is preferable. In particular, the condition of the temperature range of 1100° C. or more is preferable. This fabrication step is the same as the step of FIG. 17 which has been described in connection with the first embodiment. By this activation annealing process, shallow extension regions 11a and 11b, which neighbor the offset spacers 6na, and shallow extension regions 12a and 12b, which neighbor the offset spacers 6pa, are formed.

Figure 97:
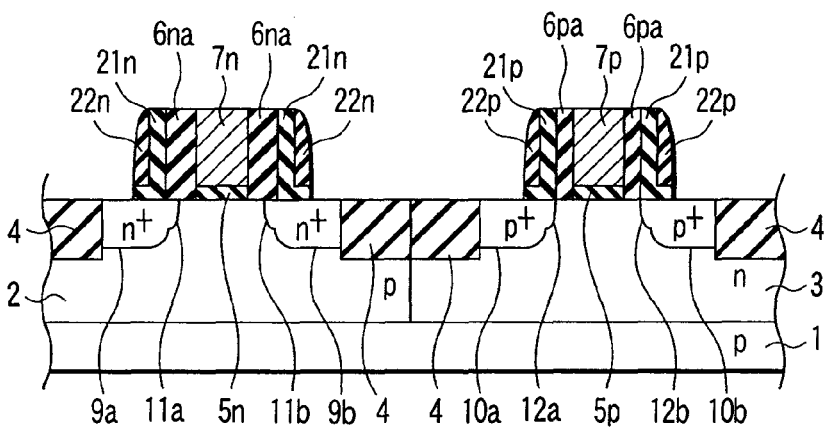

In a subsequently step illustrated in FIG. 97, the silicon nitride film 14 and silicon oxide film 13 are etched by RIE, and are selectively left on the side surfaces of the offset spacers 6na, 6pa. Alternatively, after the silicon nitride film 14 and silicon oxide film 13 are completely removed by hot phosphoric acid and hydrofluoric acid or after the uppermost-layer silicon nitride film 14 is removed by hot phosphoric acid, a silicon nitride film and a silicon oxide film, for instance, may newly be formed and selectively left by RIE on the side surfaces of the offset spacers 6na, 6pa. Thereby, as shown in FIG. 97, sidewall spacers having the stacked structure comprising the silicon oxide film 21n, 21p and silicon nitride film 22n, 22p or sidewall spacers having the single-layer structure comprising the silicon oxide film or silicon nitride film are formed. The thickness of the insulation film excluding the offset spacer 6na, 6pa, which finally becomes the sidewall spacer, is set at 20 to 40 nm as the thickness of the silicon oxide film 21n, 21p and silicon nitride film 22n, 22p combined.

The subsequent fabrication steps are the same as those in the first to third embodiments, and a description thereof is omitted here. By the above-described process, the semiconductor device with the CMOS structure, as shown in FIG. 82, which includes the extension regions 11a, 11b, 12a, 12b each having a junction depth of 20 nm or less, is completed.

According to the fourth embodiment, the gate overlap capacitance Cov can preferentially be reduced in the nMOSFET having a low gate withstand voltage and poor rolloff characteristics. Therefore, the characteristics of the nMOSFET can independently be enhanced without degrading the current driving power of the pMOSFET.

Fifth Embodiment

Figure 98:
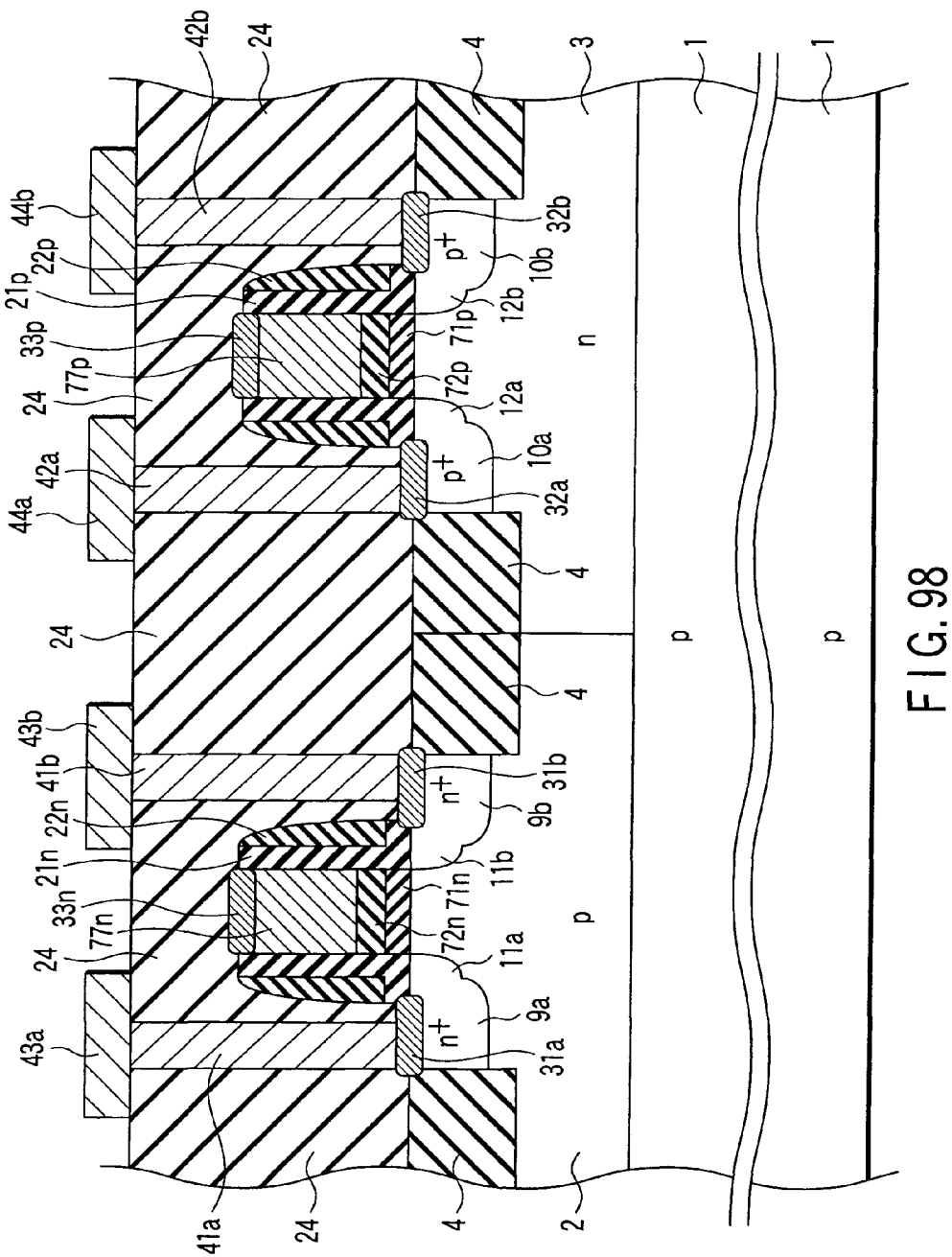
FIG. 98 is a cross-sectional view that schematically shows a part of the structure of a semiconductor device according to a fifth embodiment of the present invention.

Next, a semiconductor device and a method for fabricating the semiconductor device, according to a fifth embodiment of the invention, are described. As in the first to fourth embodiments, the first conductivity type and second conductivity type in the description below are mutually opposite conductivity types. In the description below, it is assumed that the first conductivity type is p-type and the second conductivity type is n-type. Alternatively, the first conductivity type may be n-type and the second conductivity type may be p-type. FIG. 98 is a cross-sectional view of a semiconductor device according to the fifth embodiment of the invention.

As shown in FIG. 98, in the semiconductor device according to the fifth embodiment, the gate insulation films 5p, 5n in the structure shown in FIG. 1, which has been described in connection with the first embodiment, are replaced with stacked structures comprising first gate insulation films 71n, 71p and second gate insulation films 72n, 72p. The first gate insulation films 71n, 71p are formed of SiO$_2$ films or silicon oxynitride films (SiON films). The second gate insulation films 72n, 72p are formed of SiN films, Si$_3$N$_4$ films or SiON films. The nitrogen concentration in the first gate insulation film 71n, 71p is lower than that in the second gate insulation film 72n, 72p. In the case where the first gate insulation film 71n, 71p is formed of an SiON film, it is preferable that the nitrogen concentration in the surface portion of the first gate insulation film 71n, 71p be set at 15 atomic % or less.

A gate electrode 77n of an n-channel insulated-gate transistor, which is 50 to 150 nm thick, is of the second conductivity type (n-type) and is formed of polycrystalline Si or polycrystalline SiGe (Ge concentration: 10 to 30 atomic %), is provided on the second gate insulation film 72n. Sidewall spacers 21n are formed on side walls of the gate electrode 77n, first gate insulation film 71n and second gate insulation film 72n.

A gate electrode 77p of a p-channel insulated-gate transistor, which is 50 to 150 nm thick, is of the first conductivity type (p-type) and is formed of polycrystalline Si or polycrystalline SiGe (Ge concentration: 10 to 30 atomic %), is provided on the second gate insulation film 72p. Sidewall spacers 21p are formed on side walls of the gate electrode 77p, first gate insulation film 71p and second gate insulation film 72p.

In the other structural aspects, the fifth embodiment is the same as the first embodiment, so a description of common parts is omitted here.

Figure 99:
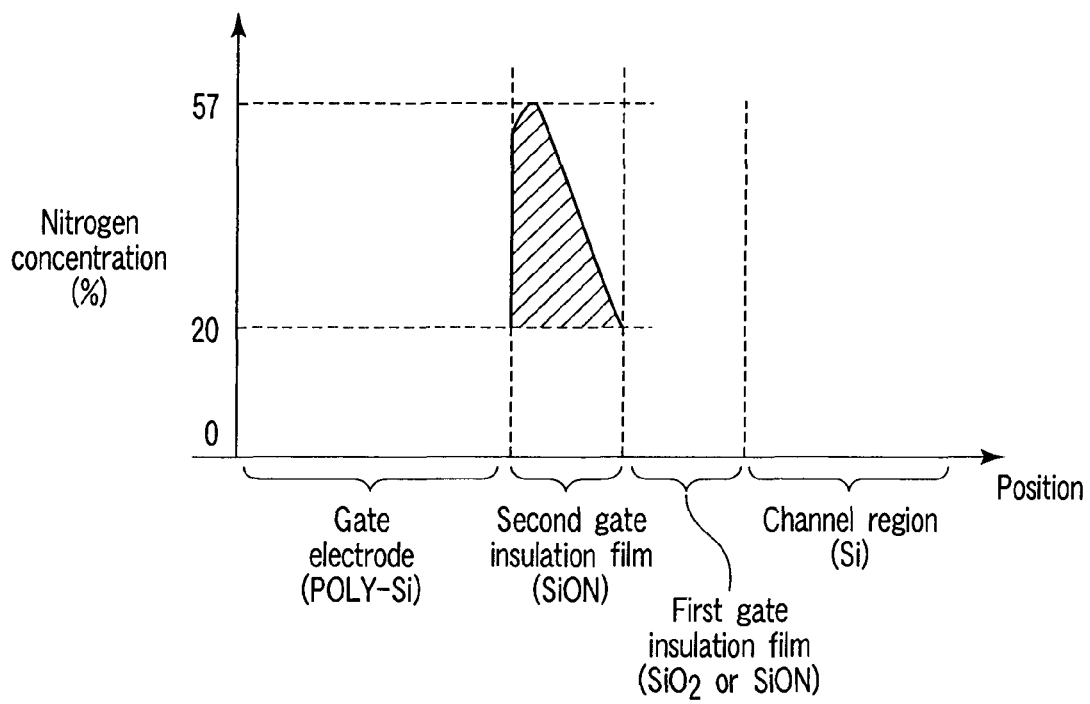
FIG. 99 is a graph showing a distribution of a nitrogen concentration in a first gate insulation film and a second gate insulation film in the semiconductor device according to the fifth embodiment of the invention.

FIG. 99 is a graph in which the abscissa indicates positions and the ordinate plots the nitrogen concentration in the second gate insulation film 72n. As shown in FIG. 99, the nitrogen concentration in the second gate insulation film 72n is 57 atomic % at maximum, and the nitrogen concentration in the second gate insulation film 72n is higher than that in the first gate insulation film 71n. The maximum nitrogen concentration of 57 atomic % corresponds to the nitrogen concentration of 4/(3+4)=57 of the Si$_3$N$_4$ film with a stoichiometric composition. The nitrogen concentration in the first gate insulation film 71n is 15 atomic % at maximum, and the nitrogen concentration in the second gate insulation film 72n may take a value within a range of 20 to 57 atomic %.

If the nitrogen concentration in the second gate insulation film 72n decreases below 20 atomic %, the gate leakage current increases disadvantageously. If the nitrogen concentration in the second gate insulation film 72n is increased to 30 atomic % or more, the gate leakage current is advantageously further reduced. However, if the nitrogen concentration in the second gate insulation film 72n exceeds 57 atomic %, the mobility deteriorates. As a result, the mutual conductance gm of the n-channel insulated-gate transistor disadvantageously decreases.

Next, a semiconductor device fabrication method according to the fifth embodiment is described. The fabrication method according to the fifth embodiment is substantially the same as the method illustrated in FIGS. 2 to 18 in connection with the first embodiment.

As shown in FIG. 2, after device isolation regions 4 are formed, desired impurities are ion-implanted in regions corresponding to channel portions, and these regions are electrically activated and a p-well region 2 and an n-well region 3 are formed.

Next, $SiO_2$ is formed by thermal oxidation on the surfaces of the p-well region 2 and n-well region 3, and thus first gate insulation films 71n, 71p are formed. Alternatively, SiON(N concentration in surface layer<15 atomic %) is formed by LPCVD on the surfaces of the p-well region 2 and n-well region 3, and thus first gate insulation films 71n, 71p are formed.

Subsequently, one to three atomic layers of SiN films or $Si_3N_4$ films, the nitrogen concentration of which is higher than that of the first gate insulation films 71n, 71p (>20 atomic %), are deposited on the first gate insulation films 71n, 71p by atomic layer deposition (ALD) using alternate introduction of dichlorosilane ($SiH_2Cl_2$) gas and ammonia ($NH_3$) gas. The deposited SiN films or $Si_3N_4$ films are formed as second gate insulation films 72n, 72p. In another method, oxygen ($O_2$) is further added to $SiH_2Cl_2$ gas and $NH_3$ gas, and one to three atomic layers of SiON(N concentration: 20 atomic % or more) are deposited and formed as second gate insulation films 72n, 72p.

In a subsequent fabrication step similar to the step of FIG. 3, a gate electrode film 77 with a thickness of 50 to 150 nm is formed on the second gate insulation film 72n, 72p by LPCVD using, e.g., polycrystalline Si film or polycrystalline SiGe (Ge concentration: 10 to 30 atomic %) as a material. The gate insulation film 5 in FIG. 3 corresponds to the stacked film of the first gate insulation film 71n and second gate insulation film 72n and the stacked film of the first gate insulation film 71p and second gate insulation film 72p in the present embodiment. The polycrystalline Si film 7 in FIG. 3 corresponds to the gate electrode film 77 in the present embodiment.

Further, in a subsequent fabrication step similar to the step of FIG. 3, using a photoresist film 51 as a mask, atoms of Group V, e.g., phosphorus (P), which become n-type impurities, are ion-implanted in the n-channel insulated-gate transistor with a dosage of $4 \times 10^{15}$ to $8 \times 10^{15}$ cm$^{-2}$.

Then, as in the step of FIG. 4, using a photoresist film 52 as a mask, atoms of Group III, e.g., boron (B), which become p-type impurities, are ion-implanted in the p-channel insulated-gate transistor with a dosage of $4 \times 10^{15}$ to $8 \times 10^{15}$ cm$^{-2}$.

Subsequently, as in the step of FIG. 5, the gate electrode film 77, the second gate insulation film 72n, 72p and the first gate insulation film 71n, 71p are selectively processed (patterned) by successive reactive ion etching (RIE). Further, an annealing process is performed under a heat treatment condition in the hatched region in the double-logarithmic graph of FIG. 6. In particular, the condition of the temperature range of 1100° C. or less is preferable. For example, RTA is conducted within a retention time of 10 seconds at 1000° C. to 1050° C. or spike RTA is conducted with a peak temperature set at 1000° C. to 1050° C. Thereby, the impurities, which are ion-implanted in the steps of FIGS. 3 and 4, are diffused uniformly in the entire gate electrode layer, of which the gate electrode 77n for the nMOSFET and the gate electrode 77p for the pMOSFET are formed, so that the diffusion may reach the interface with the second gate insulation films 72n, 72p.

Subsequently, as in the step of FIG. 7, a silicon nitride film is used as a material, and sidewall spacers 8n, 8p are formed on side walls of the gate electrode 77n, 77p, first gate insulation film 71n, 71p and second gate insulation film 72n, 72p.

In the next fabrication step, as in the step of FIG. 8, using a photoresist film 53 on the n-well region 3, gate electrode 77n and sidewall spacers 8n as a mask, atoms of Group V, e.g., phosphorus (P), which become n-type impurities, are ion-implanted in the surface of the p-well region 2. By this ion implantation, the impurity ions of Group V atoms are also implanted in the gate electrode 77n. The conditions for the ion implantation are an acceleration energy of 5 keV and a dosage of $3 \times 10^{15}$ cm$^{-2}$. The photoresist film 53 is then removed.

Next, as in the step of FIG. 9, using a photoresist 54 formed on the p-well region 2, gate electrode 77p and sidewall spacers 8p as a mask, atoms of Group III, e.g., boron (B), which become p-type impurities, are ion-implanted in the surface of the n-well region 3. By this ion implantation, the impurity ions of Group III atoms are also implanted in the gate electrode 77p. The conditions for the ion implantation are an acceleration energy of 2 keV and a dosage of $3 \times 10^{15}$ cm$^{-2}$.

Next, the inactive source/drain regions formed in the steps of FIGS. 8 and 9 are activated. Specifically, using a halogen lamp as a heat source, an activation annealing process for the inactive source/drain regions is performed. The condition for the activation annealing process is a heat treatment condition in the hatched region in the double-logarithmic graph of FIG. 6 and, for example, the annealing is conducted within 10 seconds at 1000° C. By this activation annealing process, as in the step of FIG. 10, source/drain regions 9a, 9b, 10a and 10b are formed. By this activation annealing process, the impurities, which are doped in the gate electrode 77n, 77p, can be diffused to the interface with the gate insulation film 72n, 72p, and crystal defects occurring in the Si substrate 1 due to ion implantation can be eliminated.

Thereafter, in the same step as shown in FIG. 11, the sidewall spacers 8n and 8p are removed by using hot phosphoric acid.

In the next step similar to the step of FIG. 12, using a photoresist film 55 formed on the n-well region 3 and the gate electrode 77n as a mask, atoms of Group V, e.g., arsenic (As), which become n-type impurities, are ion-implanted in the surface of the p-well region 2 on the surface of the Si substrate 1. The conditions for the ion implantation are an acceleration energy of 1.5 keV and a dosage of $1 \times 10^{15}$ cm$^{-2}$. The photoresist film 55 is then removed.

In the next step similar to the step of FIG. 13, using a photoresist film 56 formed on the p-well region 2 and the gate electrode 77p as a mask, atoms of Group III, e.g., boron (B), which become p-type impurities, are ion-implanted in the surface of the n-well region 3. The conditions for the ion implantation are an acceleration energy of 0.3 keV and a dosage of $1 \times 10^{15}$ cm$^{-2}$.

FIG. 14 shows the state immediately after the ion implantation in FIG. 12 and FIG. 13. In this state, inactive shallow extension regions 111a, 111b, 112a and 112b are formed in regions in the Si substrate 1, which neighbor the gate electrodes 77n and 77p and the device isolation regions 4.

Subsequently, as in the steps of FIGS. 15 and 16, a silicon oxide film 13 and a silicon nitride film 14 are successively formed.

Thereafter, as in the step of FIG. 17, using a flashtube as a heat source, an activation annealing process is performed. For the activation annealing process, the relationship between the heat treatment temperature and heat treatment time, which is indicated in the hatched region in the double-logarithmic graph of FIG. 6, is preferable. By the activation annealing process, shallow-junction extension regions 11a and 12b and shallow-junction extension regions 11b and 12a are formed in the Si substrate 1.

In a subsequent step similar to the step of FIG. 18, the silicon nitride film 14 and silicon oxide film 13 are etched by RIE, and sidewall spacers 21n, 22n are formed on the side walls of the gate electrode 77n, and sidewall spacers 21p, 22p are formed on the side walls of the gate electrode 77p. The subsequent fabrication steps are the same as described in connection with the first embodiment. The description of the subsequent steps of the first embodiment is applicable to the present embodiment if the term "gate electrode 7n, 7p" is changed to "gate electrode 77n, 77p" and the term "gate insulation film 5n, 5p" is changed to "gate insulation film 71n, 72n, 71p, 72p".

By the above-described process, the semiconductor device with the CMOS structure, as shown in FIG. 98, which includes the extension regions 11a, 11b, 12a, 12b each having a junction depth of 20 nm or less, is completed. In the RTA in the semiconductor device fabrication method according to the fifth embodiment, the xenon flashtube is used as the light source for light radiation. Alternatively, it is possible to use, as the light source, for instance, any one of flashtubes using other rare gases, mercury and hydrogen, an arc discharge lamp, an excimer laser, an Ar laser, an N2 laser, a YAG laser, a titanium-sapphire laser, a CO laser, and a $CO_2$ laser.

Figure 100:
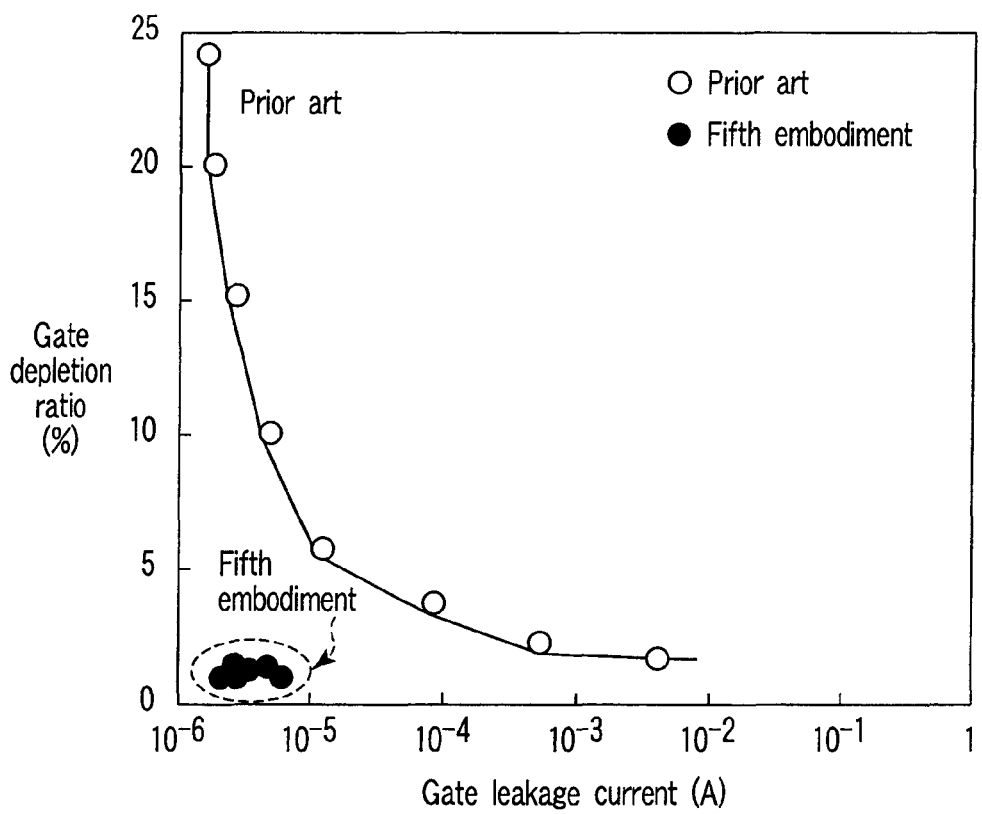
FIG. 100 is a graph showing the relationship between gate leakage current and gate depletion ratio in the n-channel insulated-gate transistors according to the fifth embodiment of the invention and conventional n-channel insulated-gate transistors.

FIG. 100 is a graph showing the relationship between gate leakage current and gate depletion ratio in the n-channel insulated-gate transistor according to the fifth embodiment of the invention and a conventional n-channel insulated-gate transistor. The term "gate depletion ratio" is defined by a ratio between the gate capacitance in the case where an inversion layer is formed in the channel and the gate capacitance in the case where an accumulation layer (in which majority carriers are accumulated) is formed in the channel. In FIG. 100, black solid circle marks indicate the present embodiment, and white circle marks indicate the prior art.

As shown in FIG. 100, in the case of the prior art, if the gate leakage current is reduced to $1\times10^{-5}$ A or less, which is a level of no problem, the gate depletion ratio rises to 5% or more. As a result, a decrease in current driving power occurs due to non-uniformity in transistor characteristics of n-channel insulated-gate transistors and an increase in effective film thickness of gate insulation films.

By contrast, in the present embodiment, in the re-channel insulated-gate transistor, deterioration of the second gate insulation film 72n and first gate insulation film 71n due to phosphorus (P) can be suppressed. Therefore, as shown in FIG. 100, even if the dosage of P is high, the gate leakage current is low and good characteristics with a gate leakage current of $1\times10^{-5}$ A or less and a gate depletion ratio of 1% or less can be obtained.

In the above descriptions of the semiconductor device and the fabrication method according to the fifth embodiment, the examples and effects have been described with attention paid to the n-channel insulated-gate transistor. Needless to say, the same advantageous effects can be obtained by applying the same techniques to the p-channel insulated-gate transistor.

Sixth Embodiment

Figure 101:
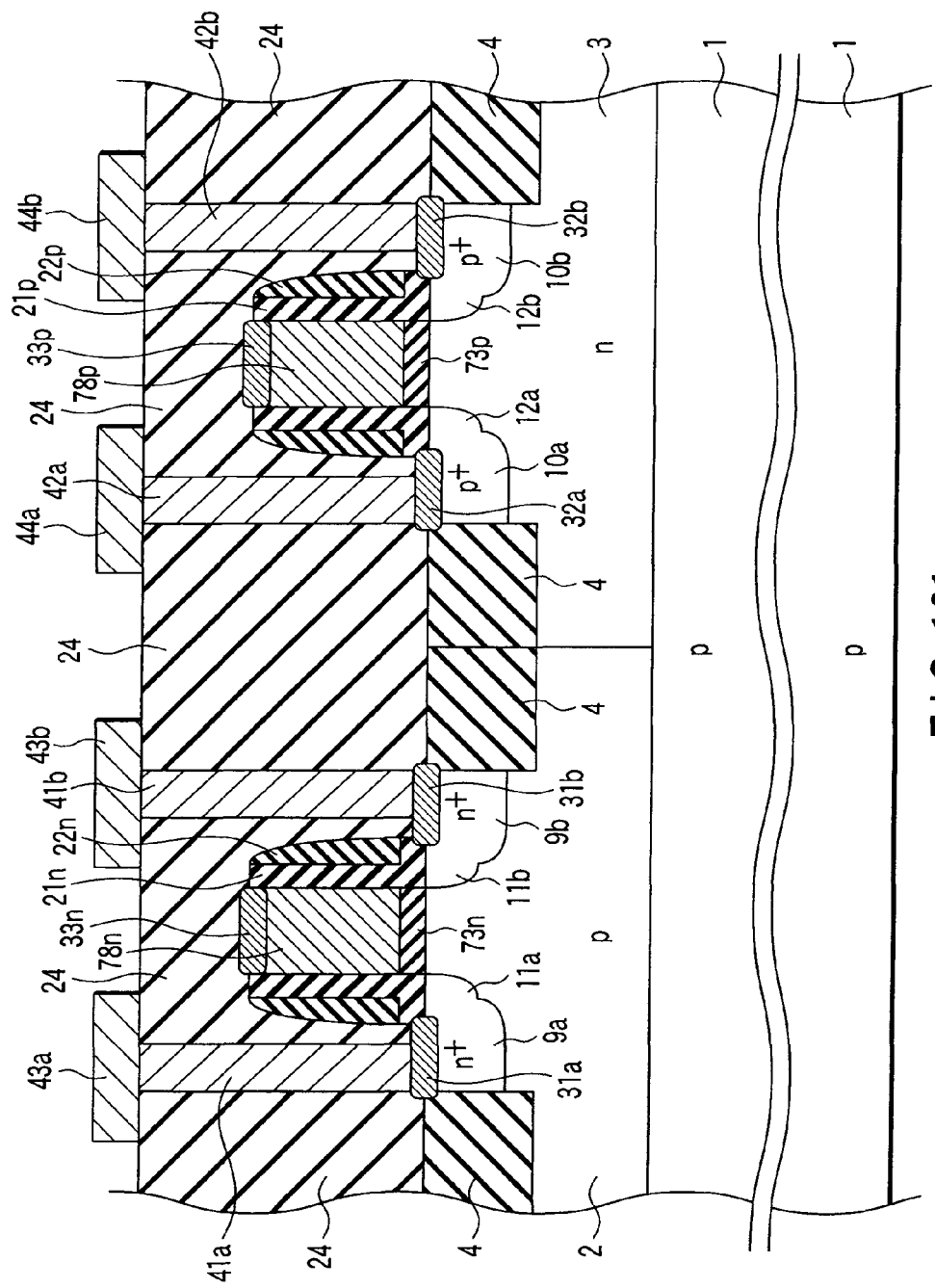
FIG. 101 is a cross-sectional view that schematically shows a part of the structure of a semiconductor device according to a sixth embodiment of the present invention.

Next, a semiconductor device and a method for fabricating the semiconductor device, according to a sixth embodiment of the invention, are described. As in the first to fifth embodiments, the first conductivity type and second conductivity type in the description below are mutually opposite conductivity types. In the description of the sixth embodiment, it is assumed that the first conductivity type is p-type and the second conductivity type is n-type. Alternatively, the first conductivity type may be n-type and the second conductivity type may be p-type. FIG. 101 is a cross-sectional view of a semiconductor device according to the sixth embodiment of the invention.

As shown in FIG. 101, in the semiconductor device according to the sixth embodiment, the gate electrodes 7n, 7p in the structure shown in FIG. 1, which has been described in connection with the first embodiment, are replaced with gate electrodes 78n, 78p, and also the gate insulation films 5n, 5p are replaced with gate insulation films 73n, 73p.

The gate insulation film 73n functions as a gate insulation film of the nMOSFET, and is formed of an $SiO_2$ film or an SiON film, the nitrogen concentration of a surface layer of which is lower than 15 atomic %. The "surface layer" of the gate insulation film, in this context, refers to a surface region which is located not on the semiconductor substrate side but on the gate electrode side and is in contact with the gate electrode.

The gate electrodes 78n, 78p are formed on the gate insulation films 73n, 73p, respectively, using polycrystalline silicon including nitrogen atoms or polycrystalline SiGe (Ge concentration: 10 to 30 atomic %) including nitrogen atoms. The thickness of the gate electrode 78n, 78p is about 50 to 150 nm. The polycrystalline Si or polycrystalline SiGe includes atomic nitrogen in an amount of about $1\times10^{18}$ $cm^3$ to $1\times10^{20}$ $cm^{-3}$. The term "atomic nitrogen" refers to nitrogen in a state in which nitrogen does not form a compound crystal with silicon or germanium and is included in an Si crystal or SiGe crystal as impurities or the like. In the case where the concentration of atomic nitrogen is less than $1\times10^{18}$ $cm^{-3}$, the gate leakage current disadvantageously increases. In the case where the concentration of atomic nitrogen is higher than $1\times10^{20}$ $cm^{-3}$, the gate depletion ratio increases and, as a result, the current driving power disadvantageously decreases due to non-uniformity in transistor characteristics and an increase in effective film thickness of gate insulation films. The range of atomic nitrogen between about $5\times10^{18}$ $cm^{-3}$ to $8\times10^{19}$ $cm^{-3}$ is more preferable since the suppression of gate leakage current becomes more conspicuous and the gate depletion ratio decreases.

Sidewall spacers 21n are formed of silicon oxide films on both side surfaces of the gate electrode 78n and gate insulation film 73n, and further sidewall spacers 22n are formed of silicon nitride films. In addition, sidewall spacers 21p are formed of silicon oxide films on both side surfaces of the gate electrode 78p and gate insulation film 73p, and further sidewall spacers 22p are formed of silicon nitride films.

In the other structural aspects, the sixth embodiment is the same as the first embodiment.

Next, a semiconductor device fabrication method according to the sixth embodiment is described. The fabrication method according to the sixth embodiment is substantially the same as the semiconductor device fabrication method according to the first embodiment, except for the formation of the gate insulation films 73n, 73p and gate electrodes 78n, 78p.

As shown in FIG. 2, after device isolation regions 4 are formed, desired impurities are ion-implanted in regions corresponding to channel portions, and these regions are electrically activated and a p-well region 2 and an n-well region 3 are formed.

Next, $SiO_2$ is formed by thermal oxidation, or SiON (N concentration in surface layer<15%) is formed by CVD, on the surfaces of the p-well region 2 and n-well region 3, and thus gate insulation films 73n, 73p are formed.

In a subsequent fabrication step similar to the step of FIG. 3, a gate electrode film 78 with a thickness of 50 to 150 nm, such as a polycrystalline Si film or polycrystalline SiGe (Ge concentration: 10 to 30 atomic %), is formed on the gate insulation film 73n, 73p by LPCVD. Specifically, the gate insulation film 5 in FIG. 3 corresponds to the gate insulation film 73n, 73p in the present embodiment, and the polycrystalline Si film 7 in FIG. 3 corresponds to the gate electrode film 78 in the present embodiment.

Thereafter, nitrogen ions are implanted in the gate electrode film 78 with an acceleration energy of 1 to 5 keV and a dosage of about $5 \times 10^{13}$ cm$^{-2}$ to $5 \times 10^{14}$ cm$^{-2}$, preferably $8 \times 10^{13}$ cm$^{-2}$ to $3 \times 10^{14}$ cm$^{-2}$. Then, the resultant structure is heated at about 500° C. to 1000° C., and the nitrogen is diffused to the bottom portion of the gate electrode film 78 of polycrystalline Si or polycrystalline SiGe.

Further, in a subsequent fabrication step similar to the step of FIG. 3, using a photoresist film 51 as a mask, atoms of Group V, e.g., phosphorus (P), which become n-type impurities, are ion-implanted in the n-channel insulated-gate transistor with a dosage of, e.g., $4 \times 10^{15}$ to $8 \times 10^{15}$ cm$^{-2}$.

Then, as in the step of FIG. 4, using a photoresist film 52 as a mask, atoms of Group III, e.g., boron (B), which become p-type impurities, are ion-implanted in the p-channel insulated-gate transistor with a dosage of, e.g., $4 \times 10^{15}$ to $8 \times 10^{15}$ cm$^{-2}$.

Subsequently, the steps of FIGS. 5 to 18, which have been described in connection with the first embodiment, are performed. Needless to say, the description of the subsequent steps of the first embodiment is applicable to the present embodiment if the term "gate insulation film 5n, 5p" is changed to "gate insulation film 73n, 73p", and the term "gate electrode 7n, 7p" is changed to "gate electrode 78n, 78p". By the above-described process, the semiconductor device with the CMOS structure, as shown in FIG. 101, which includes the extension regions 11a, 11b, 12a, 12b each having a junction depth of 20 nm or less, is completed.

In the RTA in the semiconductor device fabrication method according to the sixth embodiment, the xenon flashtube is used as the light source for light radiation. Alternatively, it is possible to use, as the light source, for instance, any one of flashtubes using other rare gases, mercury and hydrogen, an arc discharge lamp, an excimer laser, an Ar laser, an N2 laser, a YAG laser, a titanium-sapphire laser, a CO laser, and a CO$_2$ laser.

FIG. 102 is a graph showing the relationship between gate leakage current and gate depletion ratio with respect to the n-channel insulated-gate transistor according to the sixth embodiment of the invention and a conventional n-channel insulated-gate transistor. In FIG. 102, black solid circle marks indicate the present embodiment, and white circle marks indicate the prior art.

As shown in FIG. 102, in the case of the prior art, if the gate leakage current is reduced to $1 \times 10^{-5}$ A or less, which is a level of no problem, the gate depletion ratio rises to 5% or more. As a result, a decrease in current driving power occurs due to non-uniformity in transistor characteristics and an increase in effective film thickness of gate insulation films.

By contrast, in the present embodiment, deterioration of the gate insulation film 73n due to phosphorus (P) can be suppressed. Therefore, even if the dosage of P is high, the gate leakage current is low. As a result, good characteristics with a gate leakage current of $1 \times 10^{-5}$ A or less and a gate depletion ratio of 2% or less can be obtained.

In the above description, the nitrogen concentration in the surface portion of the gate insulation film 73n, 73p is less than 15 atomic %. However, the nitrogen concentration may be 15 atomic % or more. In this case, the effect of reduction in gate leakage current becomes conspicuous. Specifically, a remarkable improvement was found at a nitrogen concentration of 20 atomic % or more. Preferably, when the nitrogen concentration was set at 30 atomic % or more, the MOS characteristics were stabilized and the non-uniformity in transistor characteristics was decreased. The reason for this is that with an increase in nitrogen concentration, even if P and As come in contact at high concentration, it becomes possible to advantageously prevent fluidization of the gate insulation film 73n, local reduction in film thickness or formation of pinholes. Thus, by raising the substrate auxiliary heating temperature without varying the impurity density of P in polycrystalline Si for forming the gate electrode 78n, the sheet resistance of the extension region 11a, 11b can be reduced. As a result, the process window relating to the heat treatment step can be increased.

According to the semiconductor device fabrication method of the sixth embodiment of the invention, the activation process for the extension region 11a, 11b with a wide process window relating to the heat treatment process can be realized, and a high-performance transistor with a fine structure can easily be fabricated.

In the above descriptions of the semiconductor device and the fabrication method according to the sixth embodiment, the examples and effects have been described with attention paid to the n-channel insulated-gate transistor. Needless to say, the same advantageous effects can be obtained by applying the same techniques to the p-channel insulated-gate transistor.

Seventh Embodiment

Next, a semiconductor device and a method for fabricating the semiconductor device, according to a seventh embodiment of the invention, are described. In this embodiment, as in the first to sixth embodiments, the first conductivity type and second conductivity type are mutually opposite conductivity types. In the description of the seventh embodiment, it is assumed that the first conductivity type is p-type and the second conductivity type is n-type. Alternatively, the first conductivity type may be n-type and the second conductivity type may be p-type. FIG. 103 is a cross-sectional view of a semiconductor device according to the seventh embodiment.

As shown in FIG. 103, in the semiconductor device according to the seventh embodiment, the gate electrodes 78n, 78p in the structure shown in FIG. 101, which has been described in connection with the sixth embodiment, are replaced with gate electrodes 79n, 79p. Specifically, the gate electrodes 79n, 79p are formed of polycrystalline silicon or polycrystalline SiGe (Ge concentration: 10 to 30 atomic %) with a thickness of about 50 to 150 nm on the gate insulation films 73n, 73p, which are formed of SiO$_2$ or SiON.

A plurality of impurity elements with different atomic radii are implanted in the gate electrode 79n. FIG. 104 is a table showing atomic radii of impurities of Group IV elements (in particular, Si, Ge) as covalent bond radii according to Pauli's principle. The unit is nm.

The impurities implanted in the gate electrode 79n are a combination of an element of the major conductivity type (n-type, Group V) and an element of the opposite conductivity type (p-type, Group III) in the gate electrode 79n. Specifically, at least one of B, Al, Ga and Tl, which are Group III elements, and at least one of P, As, Sb and Bi, which are Group V elements, are implanted in the gate electrode 79n. At this time, it is preferable to set the concentration of the impurity element of the opposite conductivity type (n-type) at 10 to 70 atomic % of the concentration of the impurity element of the major conductivity type (p-type). FIG. 105 is a graph showing, for example, a gate depletion ratio and a gate leakage current, relative to the ratio of B to P, in a case where B (opposite conductivity type: p-type) and P (major conductivity type: n-type) are implanted in the gate electrode 79n. As shown in FIG. 105, if the ratio of the impurity element of the opposite conductivity type to the impurity element of the major conductivity type decreases to 10 atomic % or less, the gate leakage current disadvantageously increases. On the other hand, if the ratio exceeds 70 atomic %, the gate depletion ratio increases although the gate leakage current is low, and thus this case is not preferable. Therefore, the range of 10 to 70 atomic % is preferable.

In addition, as regards the combination of impurities implanted in the gate electrode 79n, it is preferable that the atomic radius of one of the impurity elements be greater (As, Al, Ga, Sb, Bi, Tl) than the atomic radius (r=0.117 nm) of Si, and the atomic radius of the other impurity element be less (B, P) than the atomic radius of Si. Examples of the preferable combination are B (p-type, r=0.088 nm) and Sb (n-type, r=0.136 nm); B and As (n-type, r=0.146 nm); and Al (p-type, r=0.126 nm) and P (n-type, r=0.110 nm).

The above description has been given of the case of the combination of n- and p-type impurities, but the plural impurity elements to be implanted in the gate electrode 79n may be of the same conductivity type. In this case, it is preferable to meet the condition that the atomic radius of one of the impurity elements be greater than the atomic radius of Si and the atomic radius of the other impurity element be less than the atomic radius of Si. For example, a combination of Sb (r=0.136 nm) having a greater atomic radius than Si and P (r=0.110 nm) having a less atomic radius than Si, or a combination of Ga (r=0.126 nm) and B (r=0.088) may be adopted.

Further, a combination of an electrically inactive Group IV element and a Group V element may be adopted. For example, a combination of Sn (r=0.146 nm), which is a Group IV element, and P may be adopted. In this case, too, the n-type conductivity type may be used as the major conductivity type. Accordingly, a combination of Sn, P and Ga, for instance, may be adopted.

Also in the gate electrode 79p, as in the gate electrode 79n, a plurality of impurity elements having different atomic radii are implanted. The combination of impurities to be implanted has the same relationship as in the gate electrode 79n.

For example, in the case of the combination of impurity elements of mutually opposite conductivity types, such as B (major conductivity type (p-type): r=0.088 nm) and As (opposite conductivity type (n-type): R=0.118 nm), it is preferable to set the concentration of the impurity element of the opposite conductivity type (n-type) at 10 to 70 atomic % of the concentration of the impurity element of the major conductivity type (p-type). The reason for this has been explained with reference to FIG. 105. That is, if the ratio of the impurity element of the opposite conductivity type (n-type) to the impurity element of the major conductivity type (p-type) decreases to 10 atomic % or less, the gate leakage current increases. On the other hand, if the ratio of the impurity element of the opposite conductivity type (n-type) to the impurity element of the major conductivity type (p-type) exceeds 70 atomic %, the gate depletion ratio increases.

Besides, a combination of impurity elements of the same conductivity type, such as B (r=0.088 nm) and Al (r=0.126 nm), may be adopted. Even in a combination of Sn, which is an electrically inactive Group IV element, and B, p-type conductivity may be used as the major conductivity type.

Sidewall spacers 21n, 21p are formed on side surfaces of the gate electrodes 79n, 79p having the above-described structure and the gate insulation films 73n, 73p. In the other structural aspects, the seventh embodiment is the same as the sixth embodiment.

Next, a semiconductor device fabrication method according to the seventh embodiment is described. The fabrication method according to this embodiment is substantially the same as the method of the first embodiment, except for the fabrication steps of the gate insulation films 73n, 73p and gate electrodes 79n, 79p.

To start with, as shown in FIG. 2 which has been described in connection with the first embodiment, after device isolation regions 4 are formed in the Si substrate 1, desired impurities are ion-implanted in regions corresponding to channel portions, and these regions are electrically activated and a p-well region 2 and an n-well region 3 are formed.

Next, gate insulation films 73n, 73p are formed of $SiO_2$ by thermal oxidation, or of SiON(N concentration in surface layer<15%) by LPCVD, on the surfaces of the p-well region 2 and n-well region 3. This fabrication step is common to the step in the sixth embodiment.

In a subsequent fabrication step similar to the step of FIG. 3, a gate electrode film 79 with a thickness of 50 to 150 nm, such as a polycrystalline Si film or polycrystalline SiGe (Ge concentration: 10 to 30 atomic %) film, is formed on the gate insulation film 73n, 73p by LPCVD. Specifically, the gate insulation film 5 in FIG. 3 corresponds to the gate insulation film 73n, 73p in the present embodiment, and the polycrystalline Si film 7 in FIG. 3 corresponds to the gate electrode film 79 in the present embodiment.

Next, in a subsequent fabrication step similar to the step of FIG. 3, a photoresist film 51 is formed on the n-well region 3. Using the photoresist film 51 as a mask, atoms of Group V, e.g., phosphorus (P) or arsenic (As), which become n-type impurities, are ion-implanted in the gate electrode film 79 on the p-well region 2 with a dosage of $1 \times 10^{15}$ $cm^{-2}$ to $5 \times 10^{15}$ $cm^{-2}$. Further, boron (B), which is impurities of the opposite conductivity type, are ion-implanted with a dosage of, e.g., $2 \times 10^{15}$ $cm^{-2}$. By this step, the impurity element having a greater atomic radius than Si and the impurity element having a less atomic radius than Si are implanted in the gate electrode film 79 on the p-well region 2. Needless to say, the combination of impurities to be implanted is not limited to this example.

Then, as in the step of FIG. 4, a photoresist film 52 is formed on the p-well region 2. Using the photoresist film 52 as a mask, atoms of Group III, e.g., B, which become p-type impurities, are ion-implanted in the gate electrode film 79 on the n-well region 3 with a dosage of $4 \times 10^{15}$ $cm^{-2}$ to $8 \times 10^{15}$ $cm^{-2}$. Further, arsenic (As), which is impurities of the opposite conductivity type, are ion-implanted with a dosage of, e.g., $2 \times 10^{15}$ $cm^{-2}$. By this step, the impurity element having a greater atomic radius than Si and the impurity element having a less atomic radius than Si are implanted in the gate electrode film 79 on the n-well region 3. Needless to say, the combination of impurities to be implanted is not limited to this example.

Subsequently, as in the step of FIG. 5, the gate electrode film 79 and the gate insulation film 73n, 73p are selectively processed (patterned) by successive RIE. Thereby, gate electrodes 79n, 79p are completed. Further, an annealing process is performed under a heat treatment condition in the hatched region in the double-logarithmic graph of FIG. 6, preferably in a temperature range of 1100° C. or less. For example, RTA is conducted within a retention time of 10 seconds at 1000° C. to 1050° C. or spike RTA is conducted with a peak temperature set at 1000° C. to 1050° C. Thereby, the impurities, which are ion-implanted in the steps of FIGS. 2 to 4 are diffused uniformly in the entire gate electrode layer, of which the gate electrode 79n for the nMOSFET and the gate electrode 79p for the pMOSFET are formed, so that the diffusion may reach the interface with the gate insulation films 73n, 73p.

Subsequently, as in the step of FIG. 7, sidewall spacers 8n, 8p are formed on side surfaces of the gate electrode 79n and gate insulation film 73n and on side surfaces of the gate electrode 79p and gate insulation film 73p.

In the next fabrication step, as in the step of FIG. 8, using a photoresist film 53 formed on the n-well region 3, gate electrode 79n and sidewall spacers 8n as a mask, atoms of Group V, e.g., phosphorus (P), which become n-type impurities, are ion-implanted in the surface of the p-well region 2. By this ion implantation, the impurity ions of Group V atoms are also implanted in the gate electrode 79n. The conditions for the ion implantation are an acceleration energy of 5 keV and a dosage of $3 \times 10^{15}$ cm$^{-2}$. The photoresist film 53 is then removed.

Next, as in the step of FIG. 9, using a photoresist 54 formed on the p-well region 2, gate electrode 79p and sidewall spacers 8p as a mask, atoms of Group III, e.g., boron (B), which become p-type impurities, are ion-implanted in the surface of the n-well region 3. By this ion implantation, the impurity ions of Group III atoms are also implanted in the gate electrode 79p. The conditions for the ion implantation are an acceleration energy of 2 keV and a dosage of $3 \times 10^{15}$ cm$^{-2}$.

Next, the inactive source/drain regions formed in the steps of FIGS. 8 and 9 are activated. Specifically, by using a halogen lamp as a heat source, an activation annealing process for the inactive source/drain regions is performed. The condition for the activation annealing process is a heat treatment condition in the hatched region in the double-logarithmic graph of FIG. 6 and, for example, the annealing is conducted within 10 seconds at 1000° C. By this activation annealing process, as in the step of FIG. 10, source/drain regions 9a, 9b, 10a and 10b, which are spaced apart from end portions of the gate electrodes 79n, 79p and are in contact with the device isolation regions 4, are formed in the Si substrate 1. By this activation annealing process, the impurities, which are doped in the gate electrode 79n, 79p, can be diffused to the interface with the gate insulation film 73n, 73p, and crystal defects occurring in the Si substrate 1 due to ion implantation can be eliminated.

Thereafter, in the same step as shown in FIG. 11, the sidewall spacers 8n and 8p are removed by using hot phosphoric acid.

In the next step similar to the step of FIG. 12, using a photoresist film 55 formed on the p-channel insulated-gate transistor region and the gate electrode 79n as a mask, atoms of Group V, e.g., arsenic (As), which become n-type impurities, are ion-implanted in the surface of the p-well region 2 on the surface of the Si substrate 1. The conditions for the ion implantation are an acceleration energy of 1.5 keV and a dosage of $1 \times 10^{15}$ cm$^{-2}$. As a result, the impurity element of the major conductivity type (n-type) is finally doped in the gate electrode 79n with a dosage of $5 \times 10^{15}$ cm$^{-2}$ to $1 \times 10^{16}$ cm$^{-2}$. The photoresist film 55 is then removed.

In the next step similar to the step of FIG. 13, using a photoresist film 56 formed on the p-well region 2 and the gate electrode 79p as a mask, atoms of Group III, e.g., boron (B), which become p-type impurities, are ion-implanted in the surface of the n-well region 3. The conditions for the ion implantation are an acceleration energy of 0.3 keV and a dosage of $1 \times 10^{15}$ cm$^{-2}$. As a result, the impurity element of the major conductivity type (p-type) is finally doped in the gate electrode 79p with a dosage of $5 \times 10^{15}$ cm$^{-2}$ to $1 \times 10^{16}$ cm$^{-2}$. FIG. 14 shows the state immediately after the ion implantation. In this state, inactive shallow extension regions 111a, 111b, 112a and 112b are formed in regions in the Si substrate 1, which neighbor the gate electrodes 79n and 79p and the device isolation regions 4.

Subsequently, as in the steps of FIGS. 15 and 16, a silicon oxide film 13 and a silicon nitride film 14 are successively formed.

Thereafter, as in the step of FIG. 17, using a flashtube as a heat source, an activation annealing process is performed. For the activation annealing process, the relationship between the heat treatment temperature and heat treatment time, which is indicated in the hatched region in the double-logarithmic graph of FIG. 6, is preferable.

The subsequent fabrication steps are the same as those described in connection with the first embodiment. In the RTA in the semiconductor device fabrication method according to the seventh embodiment, the xenon flashtube is used as the light source for light radiation. Alternatively, it is possible to use, as the light source, for instance, any one of flashtubes using other rare gases, mercury and hydrogen, an arc discharge lamp, an excimer laser, an Ar laser, an N2 laser, a YAG laser, a titanium-sapphire laser, a CO laser, and a CO$_2$ laser.

Figure 106:
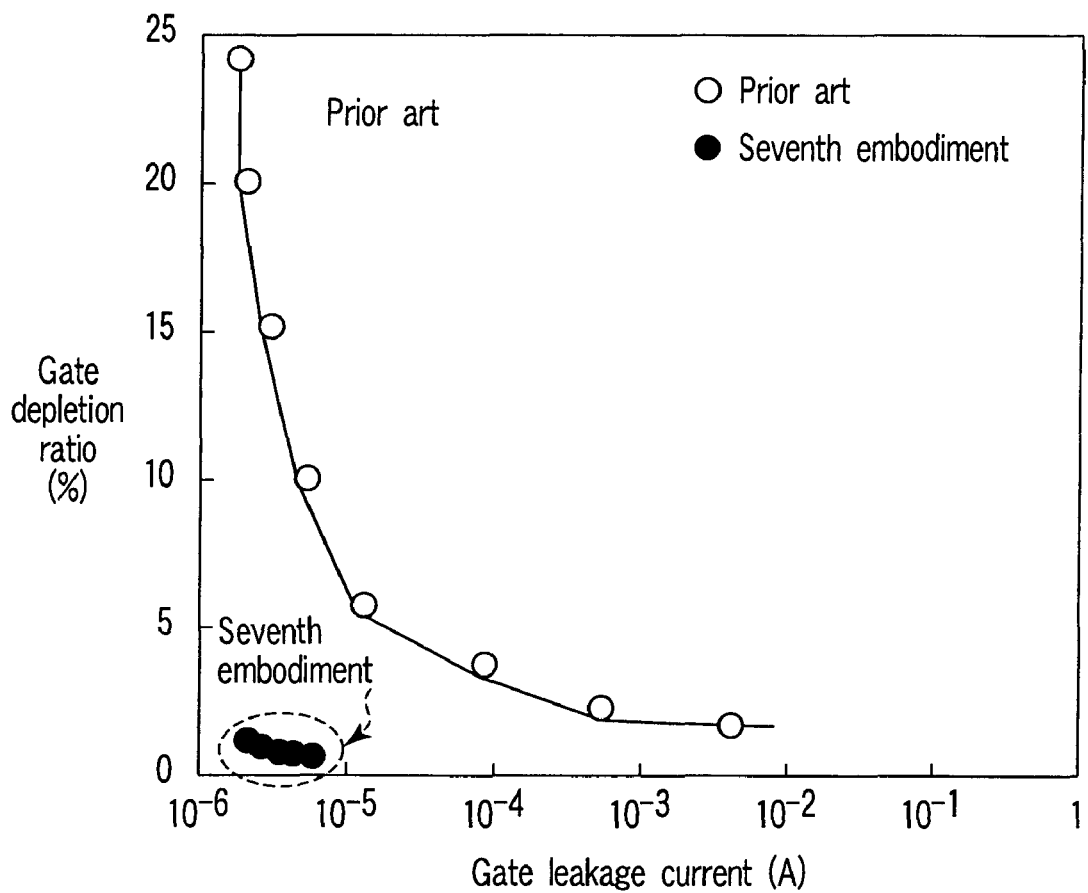
FIG. 106 is a graph showing the relationship between gate leakage current and gate depletion ratio in n-channel insulated-gate transistors according to the seventh embodiment of the invention and conventional n-channel insulated-gate transistors.

FIG. 106 is a graph showing the relationship between gate leakage current and gate depletion ratio with respect to the n-channel insulated-gate transistor according to the present embodiment and a conventional n-channel insulated-gate transistor. In FIG. 106, black solid circle marks indicate the present embodiment, and white circle marks indicate the prior art.

As shown in FIG. 106, in the case of the prior art, if the gate leakage current is reduced to $1 \times 10^{-5}$ A or less, which is a level of no problem, the gate depletion ratio rises to 5% or more.

By contrast, in the present embodiment, deterioration of the gate insulation film 73n due to phosphorus (P) can be suppressed. Therefore, even if the dosage of P is high, the gate leakage current is low. As a result, good characteristics with a gate leakage current of $1 \times 10^{-5}$ A or less and a gate depletion ratio of 1% or less can be obtained.

FIG. 107 is a graph showing the relationship between on-current and off-current in the n-channel insulated-gate transistor according to the seventh embodiment of the invention and the conventional n-channel insulated-gate transistor. FIG. 108 is a graph showing the relationship between gate length and gate threshold voltage in the n-channel insulated-gate transistor according to the seventh embodiment of the invention and the conventional n-channel insulated-gate transistor. In FIGS. 107 and 108, black solid circle marks indicate the present embodiment, and white circle marks indicate the prior art.

As shown in FIGS. 107 and 108, with the structure of the present embodiment, compared to the prior art, a higher driving power and good rolloff characteristics were obtained. In short, according to the semiconductor device fabrication method according to the seventh embodiment, a transistor with a fine structure and a high performance can be fabricated.

According to the semiconductor device fabrication method of the present embodiment, if impurities of the opposite conductivity type (p-type) are doped in the gate electrode 79n, a remarkable improvement is observed, as shown in FIG. 105, in the gate depletion ratio/gate leakage current characteristics in the range of impurity density between 10 atomic % and 70 atomic % relative to the impurities of the major conductivity type (n-type). Preferably, if the impurity density is set between 30 atomic % and 60 atomic %, the MOS characteristics are stabilized and the non-uniformity in transistor characteristics can be reduced. The reason is as follows. With the increase in impurity density of boron (B) that is of the opposite conductivity type, the boron combines with P to form a III-V compound and stabilizes. Thus, even if high-concentration P is present, diffusion or permeation to the gate insulation film is suppressed and virtually no leakage path is formed. Hence, despite the impurity density of P in the gate polycrystalline Si being the same, the activation temperature can be raised. Therefore, the activation density of the gate electrode 79n, source/drain region 9a, 9b and extension region 11a, 11b can be increased within such a range as not to increase gate leakage current, and the process window relating to the heat treatment process can be increased.

Thus, according to the semiconductor device fabrication method of the seventh embodiment, the activation process of the extension region 11a, 11b with a wide process window relating to the heat treatment step can be realized, and a high-performance transistor with a fine structure can easily be fabricated.

In the above descriptions of the semiconductor device and fabrication method according to the seventh embodiment, the examples and effects have been described with attention paid to the n-channel insulated-gate transistor. Needless to say, the same advantageous effects can be obtained by applying the same techniques to the p-channel insulated-gate transistor.

Other Embodiments

The embodiments of the present invention are not restricted to the first to seventh embodiments. Various alternative embodiments, as well as examples and techniques for implementation of the semiconductor device fabrication method according to the first embodiment, will be clear from the disclosure to a person skilled in the art.

In the description of the first to seventh embodiments, the CMOS structure has been described. However, the embodiments should not be interpreted to be restricted to the CMOS structure. Needless to say, the embodiments are also applicable to, for instance, the structure of a p-channel insulated-gate transistor alone, such as a pMOS integrated circuit, and to the structure of an n-channel insulated-gate transistor alone, such as a nMOS integrated circuit. Further, the invention is applicable to an integrated circuit including a bipolar transistor. Although it should be noted that the third and fourth embodiments are techniques relating to the adjustment of characteristics of the p-channel insulated-gate transistor and n-channel insulated-gate transistor, which are necessitated by microfabrication, these techniques are also applicable to an integrated circuit including a bipolar transistor.

As is understood from the description of the fifth to seventh embodiments, it is not necessary to restrictively apply the descriptions of the first to fourth embodiments to MOSFETs in narrow senses, such as a pMOSFET and an nMOSFET, wherein silicon oxide films are used as gate insulation films. For example, the invention is applicable to insulated-gate transistors in which insulation films, other than the silicon oxide films, are used as gate insulation films. Various insulation films, aside from the SiN film, $Si_3N_4$ film and SiON film as described in the fifth to seventh embodiments, are usable as such gate insulation films of insulated-gate transistors. A multilayer film, for example, a three-layer stacked film such as an ONO stacked film (silicon oxide film ($SiO_2$ film)/silicon nitride film ($Si_3N_4$ film)/silicon oxide film ($SiO_2$ film)), is also usable. For example, as a gate insulation film of the insulated-gate transistors according to the embodiments of the invention, usable is a single-layer film, which is selected from a strontium oxide (SrO) film with $\in_r=6$, a silicon nitride film ($Si_3N_4$ film) with $\in_r=7$, an aluminum oxide ($Al_2O_3$) film with $\in_r=8$ to 11, a magnesium oxide (MgO) film with $\in_r=10$, an yttrium oxide ($Y_2O_3$) film with $\in_r=16$ to 17, a hafnium oxide ($HfO_2$) film with $\in_r=22$ to 23, a zirconium oxide ($ZrO_2$) film with $\in_r=22$ to 23, a tantalum oxide ($Ta_2O_5$) film with $\in_r=25$ to 27 and a bismuth oxide ($Bi_2O_3$) film with $\in_r=40$, or a composite stacked film of two or more of these films. Needless to say, the value of specific dielectric constant $\in_r$, exemplified above, is variable depending on fabrication methods, and may take a value deviating from the range of the above-exemplified values. Further, a composite film of a silicon oxide film and at least one of the above-listed films may be used. The composite film may comprise three or more stacked layers. Specifically, an insulation film, which includes at least a part of the above-mentioned material with a specific dielectric constant $\in_r$ of 5 to 6 or more, is preferable. In the case of the composite film, however, it is preferable to select a combination in which the effective specific dielectric constant $\in_r$, which is measured as the dielectric constant of the whole film, becomes 5 to 6 or more. An insulation film of a ternary compound, such as a hafnium aluminate (HfAlO) film, is usable. Specifically, an oxide including at least one of strontium (Sr), aluminum (Al), magnesium (Mg), yttrium (Y), hafnium (Hf), zirconium (Zr), tantalum (TA) and bismuth, or a silicon nitride including at least one of these elements, is usable as a gate insulation film of the insulated-gate transistors according to the embodiments of the invention. A ferroelectric material, such as strontium titanate ($SrTiO_3$) or barium strontium titanate ($BaSrTiO_3$), is usable as a high-dielectric-constant gate insulation film material, but, in this case, consideration should be given to deficiency in thermal stability at interface with polycrystalline Si and to hysteresis characteristics of ferroelectric material.

The semiconductor devices according to the embodiments of the invention are not limited to semiconductor integrated circuits such as LSIs. For example, the embodiments are applicable to an individual semiconductor device, for example, a microfabricated pMOSFET or nMOSFET, such as a terahertz-band high-frequency MOS transistor. Furthermore, the embodiments are applicable to the structure of a high-frequency power transistor in which a great number of microfabricated unit cells are arrayed on one chip, and a method for fabricating the same.

The profile of nitrogen concentration, which has been described in connection with the fifth embodiment, is not limited to the above-described example.

Figure 109:
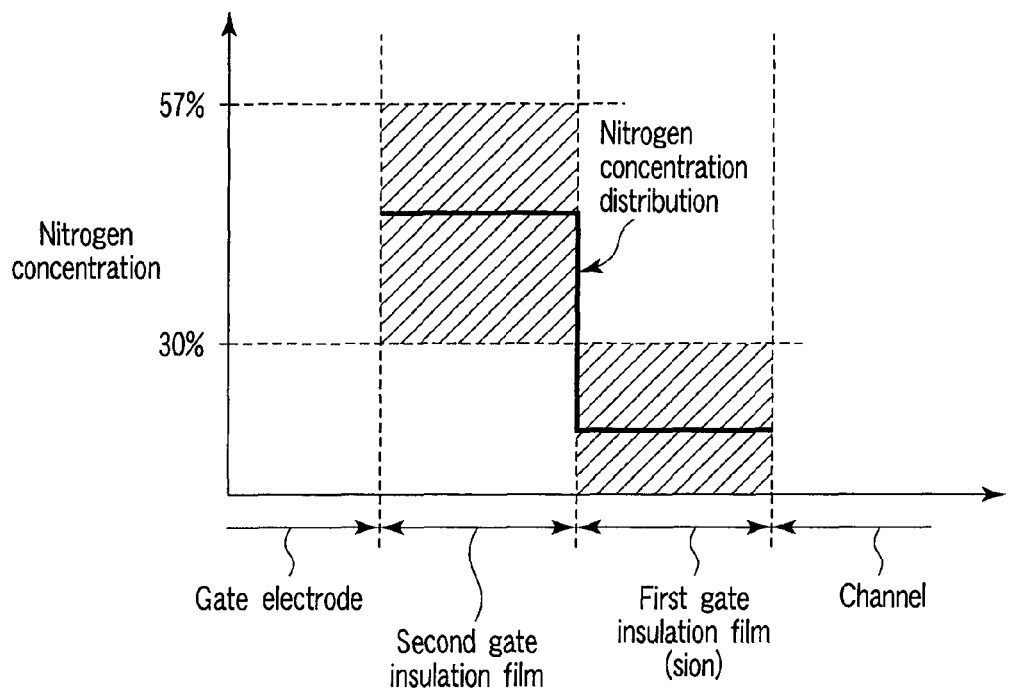
FIG. 109 is a graph showing a nitrogen concentration profile in gate insulation films in an n-channel insulated-gate transistor according to a first modification of the fifth embodiment of the invention.

FIG. 109 is a graph showing an impurity concentration profile in the first and second insulation films in a semiconductor device according to a first modification of the fifth embodiment. As shown in FIG. 109, it should suffice if the nitrogen concentration in the first gate insulation film is 30 atomic % or less, and if the nitrogen concentration in the second gate insulation film is 30 to 57 atomic %. These ranges are indicated by hatched regions in FIG. 109. Thus, for example, the nitrogen concentration may substantially be uniform in the first and second gate insulation films.

Figure 110:
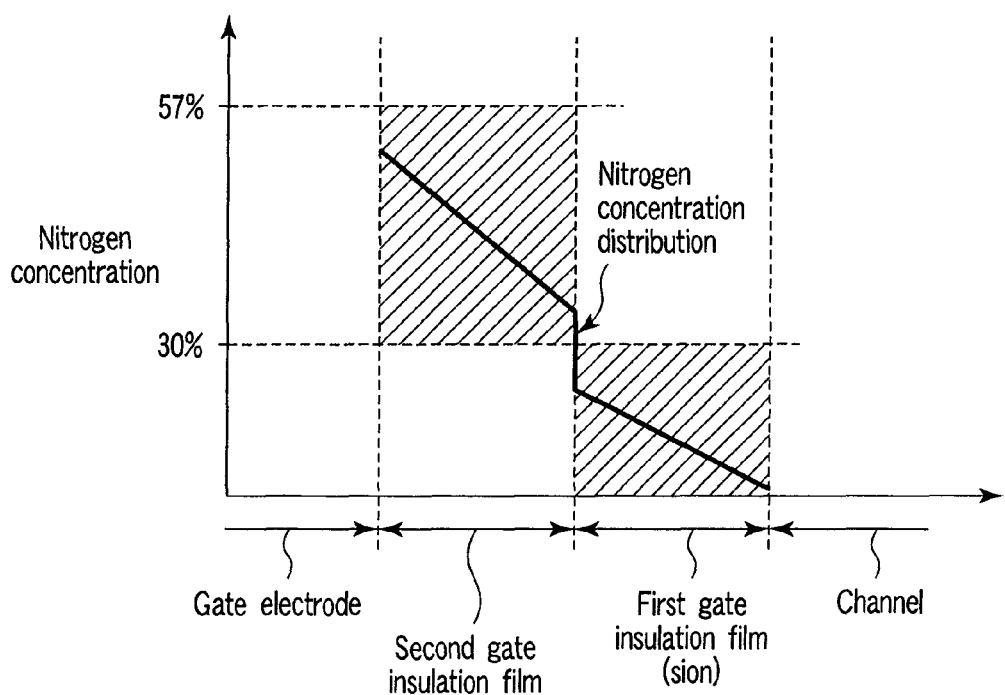
FIG. 110 is a graph showing a nitrogen concentration profile in gate insulation films in an re-channel insulated-gate transistor according to a second modification of the fifth embodiment of the invention.

FIG. 110, like FIG. 109, is a graph showing an impurity concentration profile in a semiconductor device according to a second modification of the fifth embodiment. As shown in FIG. 110, the nitrogen concentration in the first and second gate insulation films may vary with a gradient (e.g., inverse proportion to depth). It should suffice if the nitrogen concentration in the gate insulation film falls within the hatched regions in FIGS. 109 and 110. The gate insulation film may be a multilayer film comprising three or more layers, or may be a single-layer film having a concentration profile which falls within the hatched regions.

Figure 111:
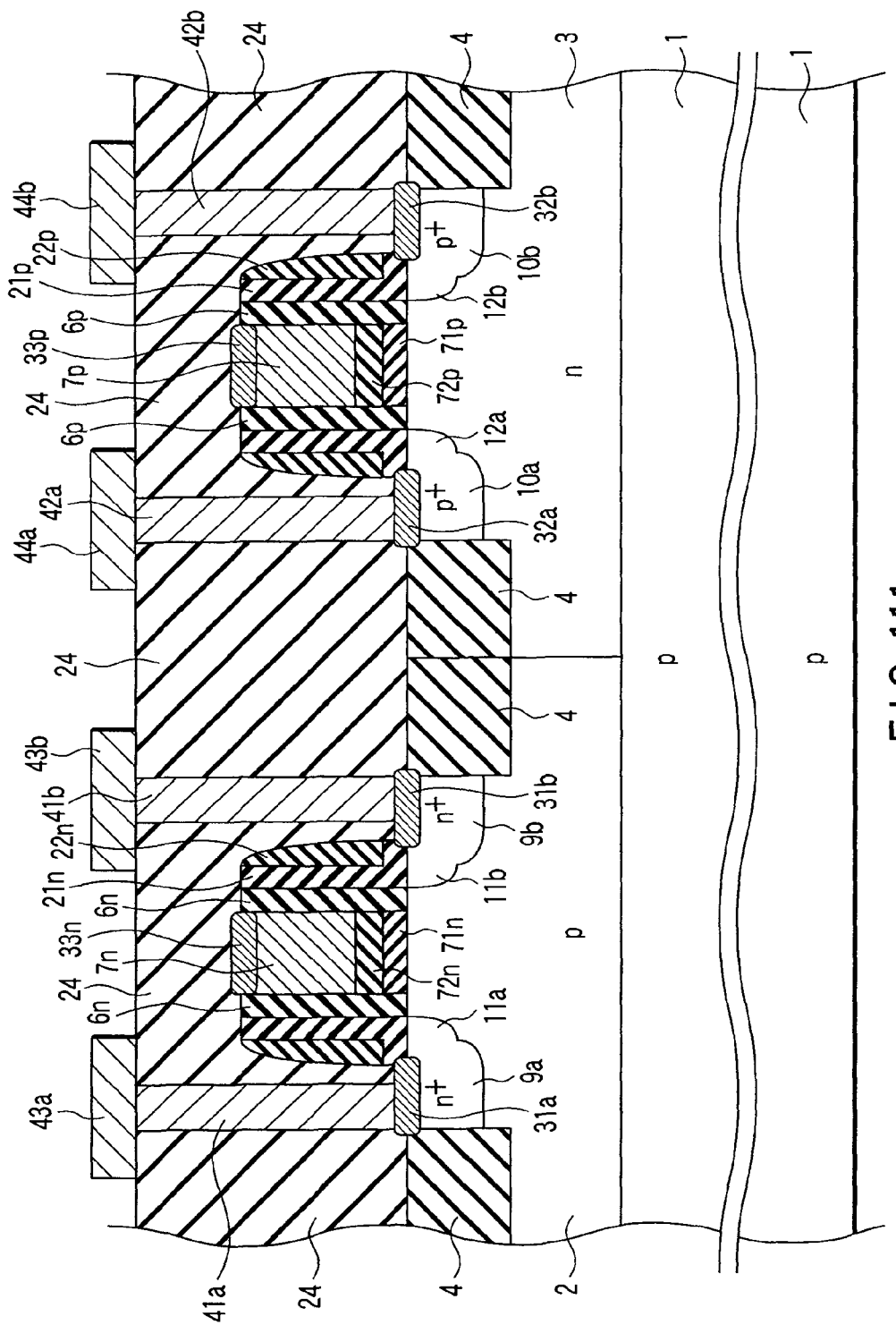
FIG. 111 is a cross-sectional view of a semiconductor device according to a third modification of the fifth embodiment of the invention.

FIG. 111 is a cross-sectional view of a semiconductor device according to a third modification of the fifth embodiment. In this modification, the fifth embodiment and the second embodiment are combined. Specifically, in the structure shown in FIG. 98, the offset spacers 6n and 6p, which have been described in connection with the second embodiment, may be provided.

Figure 112:
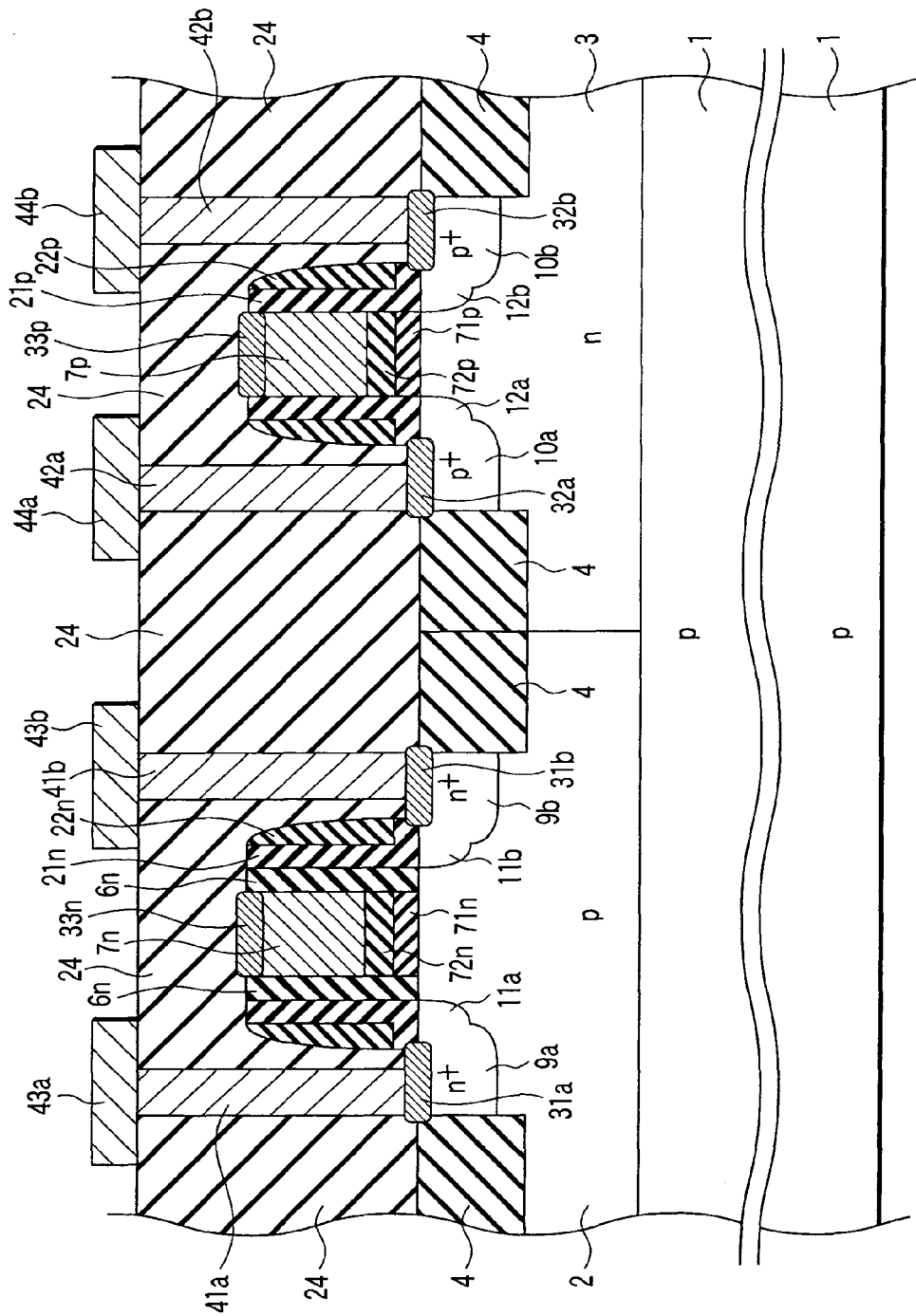
FIG. 112 is a cross-sectional view of a semiconductor device according to a fourth modification of the fifth embodiment of the invention.

FIG. 112 is a cross-sectional view of a semiconductor device according to a fourth modification of the fifth embodiment. In this modification, the fifth embodiment and the third embodiment are combined. Specifically, in the structure shown in FIG. 98, the offset spacers 6n, which have been described in connection with the third embodiment, may be provided in the nMOSFET. In this case, no offset spacer is provided in the pMOSFET.

Figure 113:
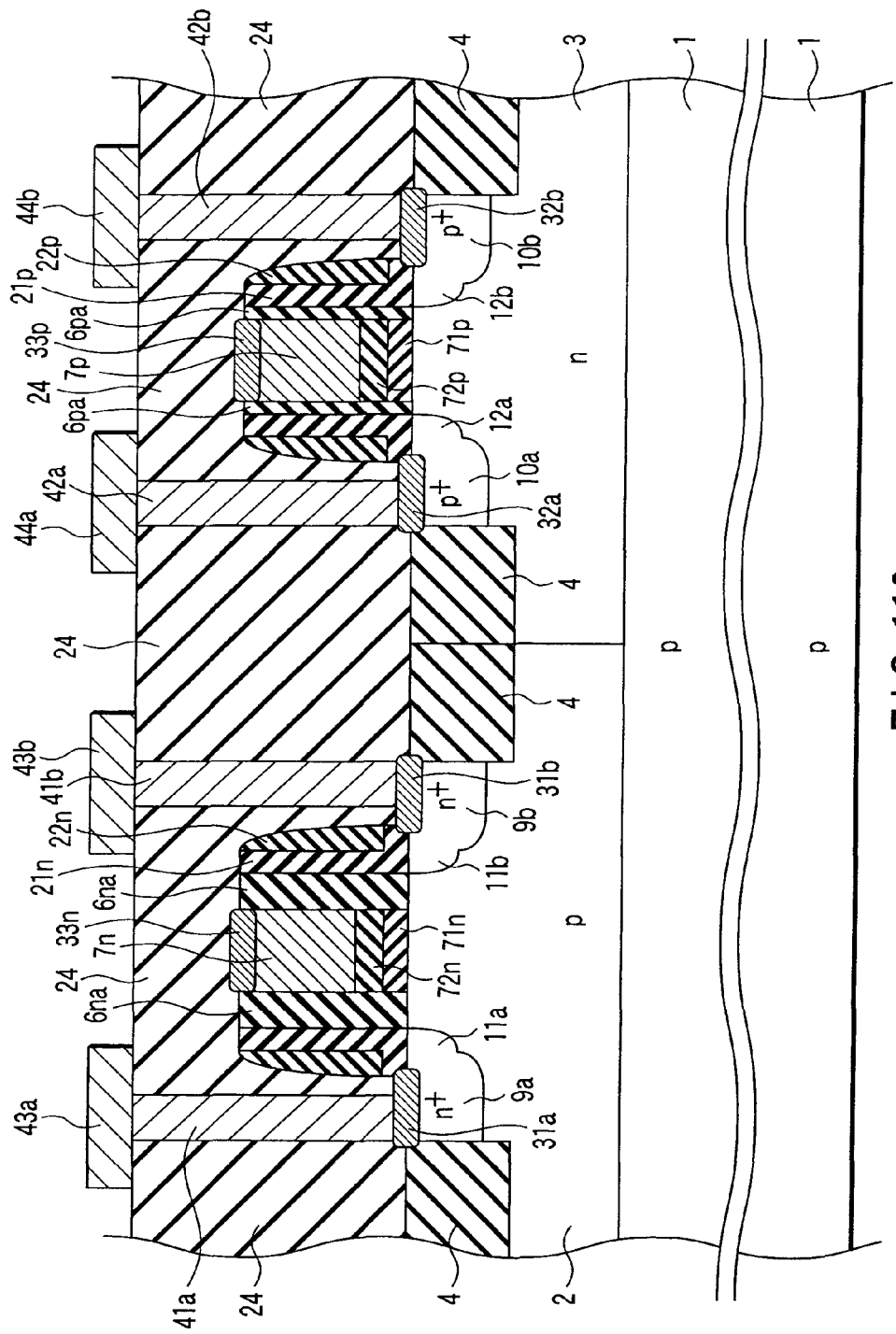
FIG. 113 is a cross-sectional view of a semiconductor device according to a fifth modification of the fifth embodiment of the invention.

FIG. 113 is a cross-sectional view of a semiconductor device according to a fifth modification of the fifth embodiment. In this modification, the fifth embodiment and the fourth embodiment are combined. Specifically, in the structure shown in FIG. 98, the offset spacers 6na and 6pa, which have been described in connection with the fourth embodiment, may be provided. Needless to say, the relationship in thickness between the offset spacers 6na and 6pa is:

offset spacer 6na>offset spacer 6pa.

Figure 114:
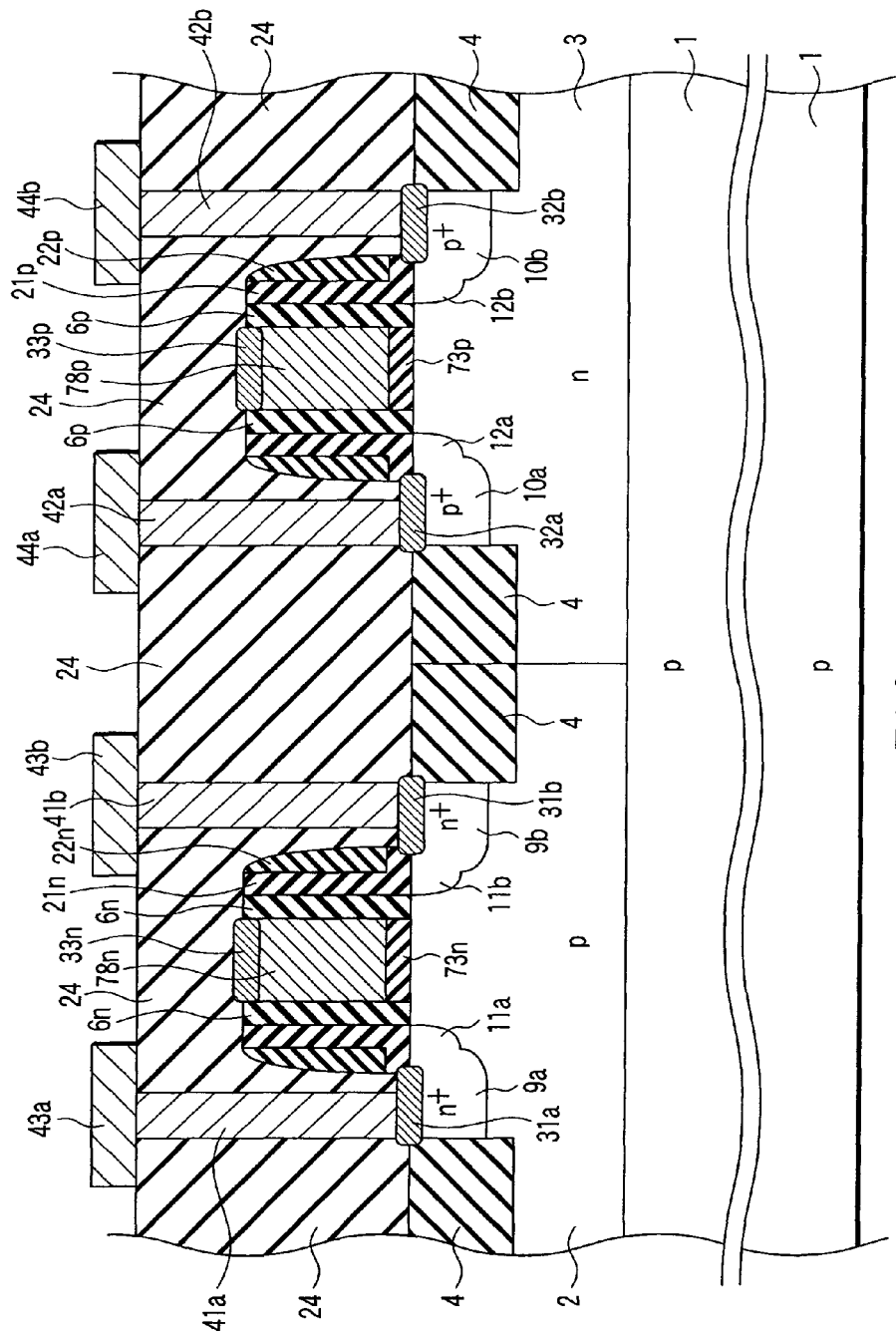
FIG. 114 is a cross-sectional view of a semiconductor device according to a first modification of the sixth embodiment of the invention.

FIG. 114 is a cross-sectional view of a semiconductor device according to a first modification of the sixth embodiment. In this modification, the sixth embodiment and the second embodiment are combined. Specifically, in the structure shown in FIG. 101, the offset spacers 6n and 6p, which have been described in connection with the second embodiment, may be provided.

Figure 115:
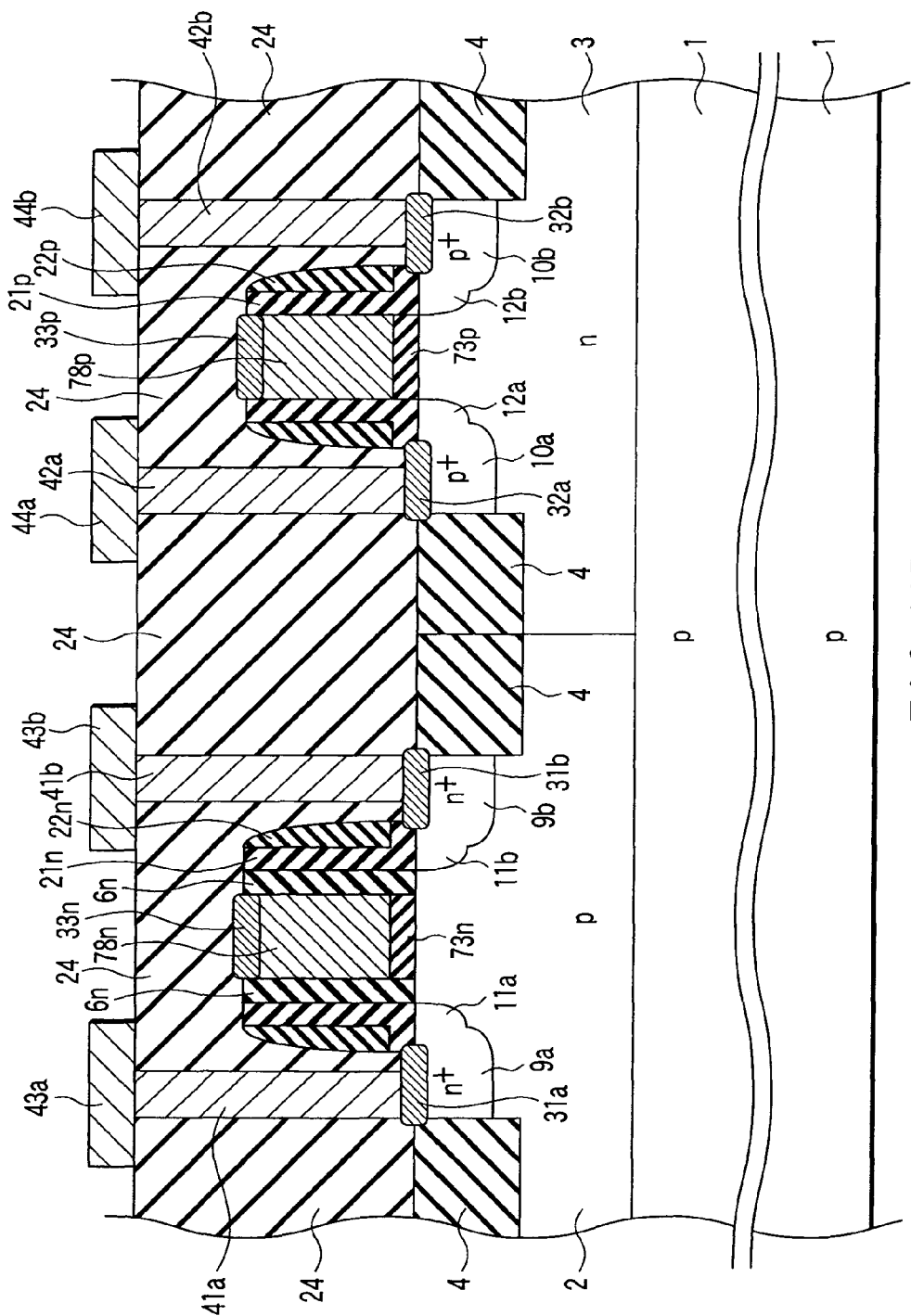
FIG. 115 is a cross-sectional view of a semiconductor device according to a second modification of the sixth embodiment of the invention.

FIG. 115 is a cross-sectional view of a semiconductor device according to a second modification of the sixth embodiment. In this modification, the sixth embodiment and the third embodiment are combined. Specifically, in the structure shown in FIG. 101, the offset spacers 6n, which have been described in connection with the third embodiment, may be provided in the nMOSFET. In this case, no offset spacer is provided in the pMOSFET.

Figure 116:
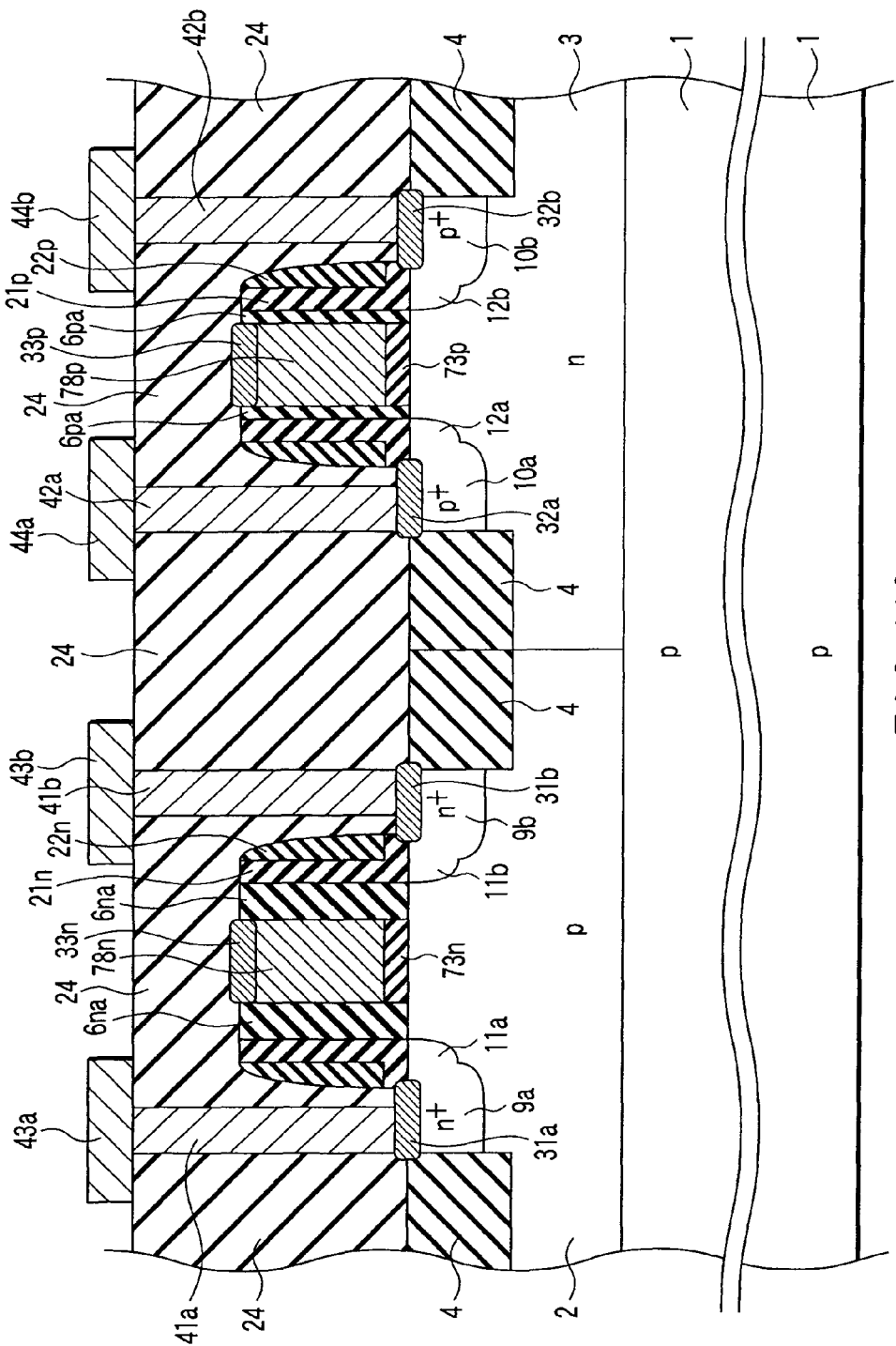
FIG. 116 is a cross-sectional view of a semiconductor device according to a third modification of the sixth embodiment of the invention.

FIG. 116 is a cross-sectional view of a semiconductor device according to a third modification of the sixth embodiment. In this modification, the sixth embodiment and the fourth embodiment are combined. Specifically, in the structure shown in FIG. 101, the offset spacers 6na and 6pa, which have been described in connection with the fourth embodiment, may be provided. Needless to say, the relationship in thickness between the offset spacers 6na and 6pa is:

offset spacer 6na>offset spacer 6pa.

Figure 117:
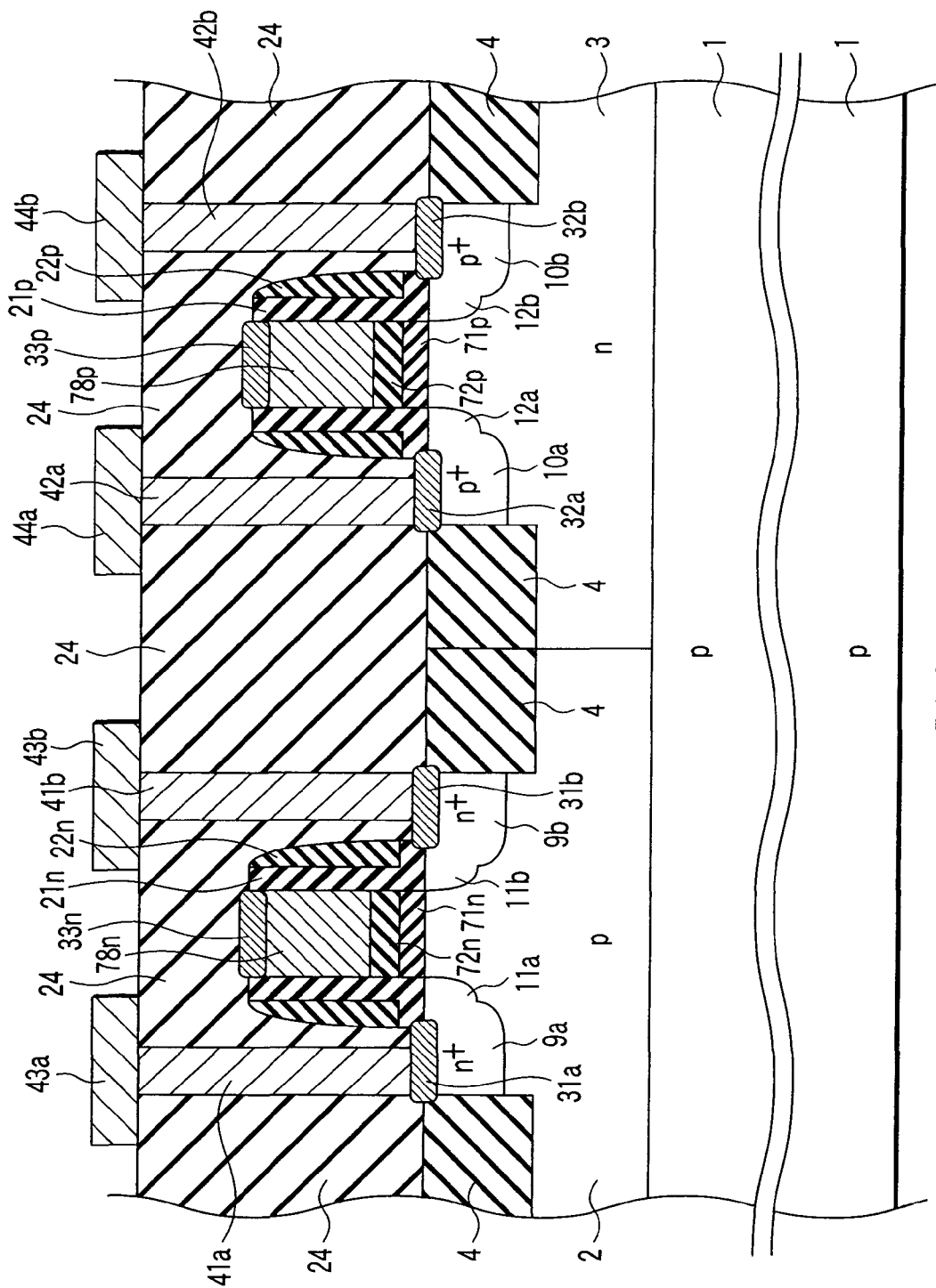
FIG. 117 is a cross-sectional view of a semiconductor device according to a fourth modification of the sixth embodiment of the invention.

FIG. 117 is a cross-sectional view of a semiconductor device according to a fourth modification of the sixth embodiment. In this modification, the sixth embodiment and the fifth embodiment are combined. Specifically, in the structure shown in FIG. 101, the gate insulation film 73n may be replaced with the stacked structure of the first gate insulation film 71n and second gate insulation film 72n, which has been described in connection with the fifth embodiment, and the gate insulation film 73p may be replaced with the stacked structure of the first gate insulation film 71p and second gate insulation film 72p, which has been described in connection with the fifth embodiment. In addition, in the structure shown in FIG. 117, the offset spacers 6n and 6p, which have been described in connection with the second to fourth embodiments, may be provided.

Figure 118:
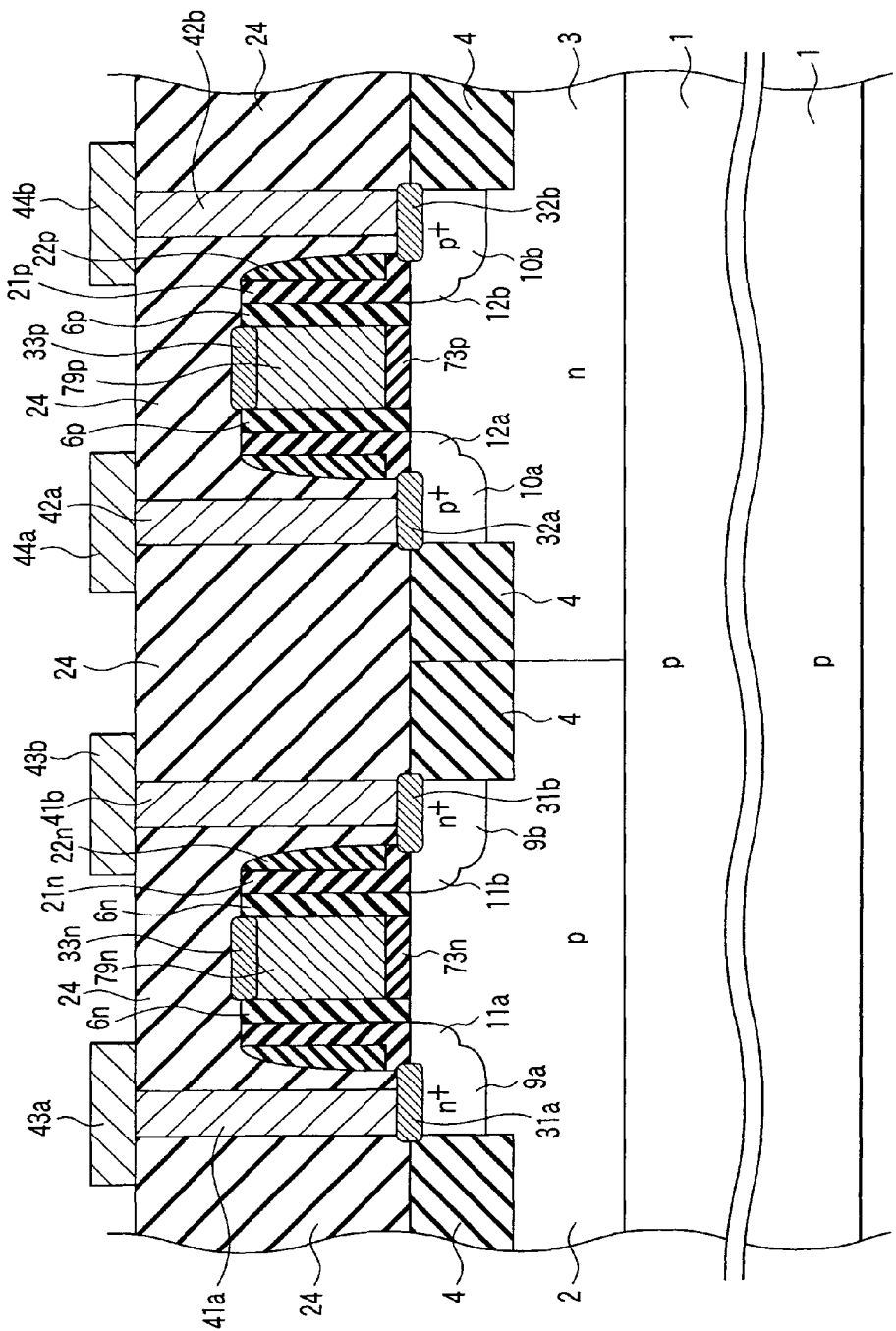
FIG. 118 is a cross-sectional view of a semiconductor device according to a first modification of the seventh embodiment of the invention.

FIG. 118 is a cross-sectional view of a semiconductor device according to a first modification of the seventh embodiment. In this modification, the seventh embodiment and the second embodiment are combined. Specifically, in the structure shown in FIG. 103, the offset spacers 6n and 6p, which have been described in connection with the second embodiment, may be provided.

Figure 119:
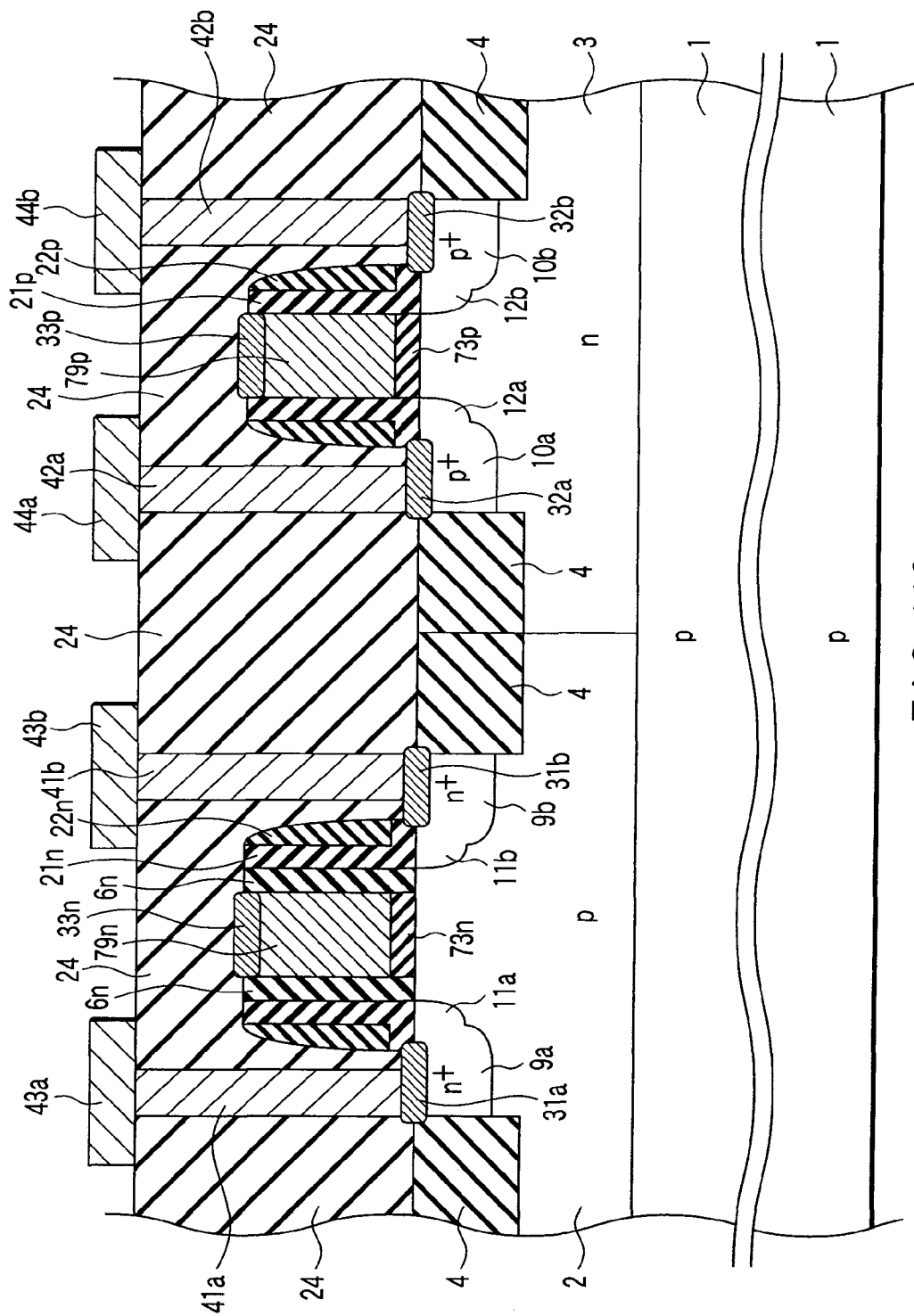
FIG. 119 is a cross-sectional view of a semiconductor device according to a second modification of the seventh embodiment of the invention.

FIG. 119 is a cross-sectional view of a semiconductor device according to a second modification of the seventh embodiment. In this modification, the seventh embodiment and the third embodiment are combined. Specifically, in the structure shown in FIG. 103, the offset spacers 6n, which have been described in connection with the third embodiment, may be provided in the nMOSFET. In this case, no offset spacer is provided in the pMOSFET.

Figure 120:
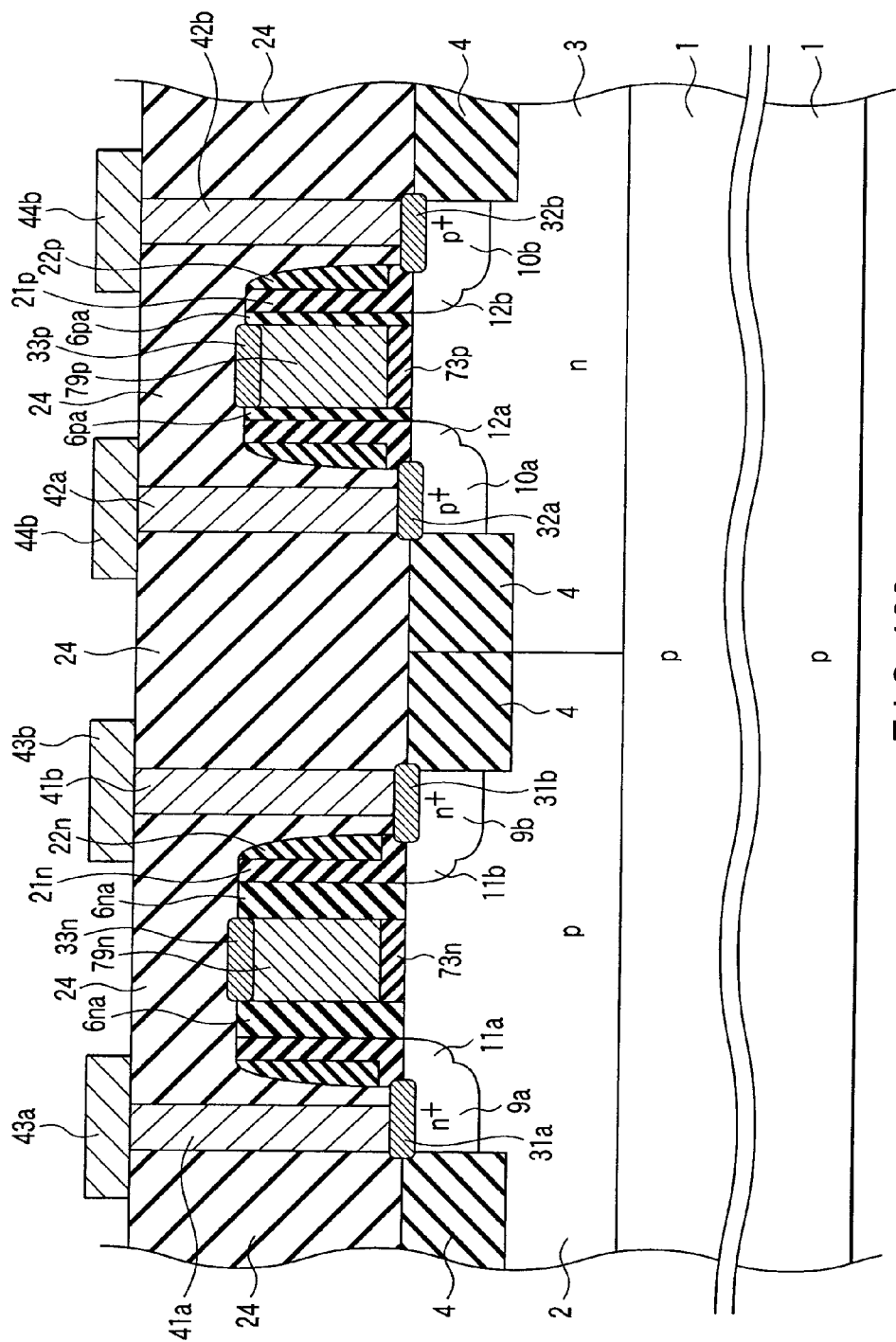
FIG. 120 is a cross-sectional view of a semiconductor device according to a third modification of the seventh embodiment of the invention.

FIG. 120 is a cross-sectional view of a semiconductor device according to a third modification of the seventh embodiment. In this modification, the seventh embodiment and the fourth embodiment are combined. Specifically, in the structure shown in FIG. 103, the offset spacers 6na and 6pa, which have been described in connection with the fourth embodiment, may be provided. Needless to say, the relationship in thickness between the offset spacers 6na and 6pa is:

offset spacer 6na>offset spacer 6pa.

FIG. 121 is a cross-sectional view of a semiconductor device according to a fourth modification of the seventh embodiment. In this modification, the seventh embodiment and the fifth embodiment are combined. Specifically, in the structure shown in FIG. 103, the gate insulation film 73n may be replaced with the stacked structure of the first gate insulation film 71n and second gate insulation film 72n, which has been described in connection with the fifth embodiment, and the gate insulation film 73p may be replaced with the stacked structure of the first gate insulation film 71p and second gate insulation film 72p, which has been described in connection with the fifth embodiment. In addition, in the structure shown in FIG. 121, the offset spacers 6n and 6p, which have been described in connection with the second to fourth embodiments, may be provided.

Figure 122:
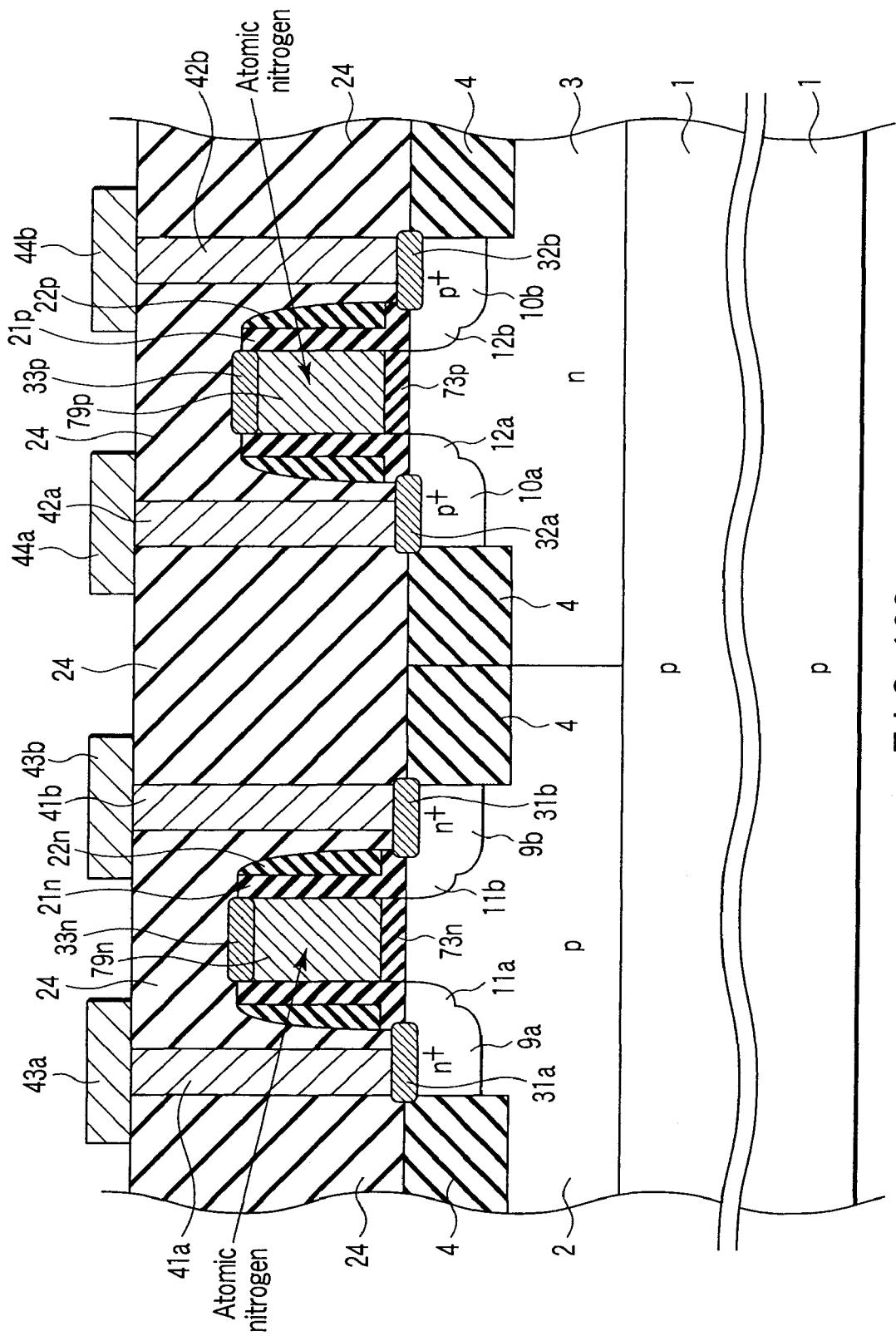
FIG. 122 is a cross-sectional view of a semiconductor device according to a fifth modification of the seventh embodiment of the invention.

FIG. 122 is a cross-sectional view of a semiconductor device according to a fifth modification of the seventh embodiment. In this modification, the seventh embodiment and the sixth embodiment are combined. Specifically, in the structure shown in FIG. 103, atomic nitrogen may be doped in the gate electrodes 79n and 79p. Arrows in FIG. 122 indicate that the gate electrodes 79n and 79p contain atomic nitrogen. The nitrogen concentration at this time is set as described in connection with the sixth embodiment. In the structure shown in FIG. 122, the offset spacers 6n and 6p, which have been described in connection with the second to fourth embodiments, may be provided, and the gate insulation film 73n, 73p may be formed to have the multilayer structure as described in connection with the fifth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first, p-type, semiconductor region;
   an n-channel insulated-gate transistor which is formed on the first semiconductor region and includes:
      a first gate insulation film;
      a first gate electrode formed on the first gate insulation film; and
      a first drain extension region;
   a second, n-type, semiconductor region; and
   a p-channel insulated-gate transistor which is formed on the second semiconductor region and includes:
      a second gate insulation film;
      a second gate electrode formed on the second gate insulation film; and
      a second drain extension region, wherein an overlap capacitance between the second drain extension region and the second gate electrode is greater than an overlap capacitance between the first drain extension region and the first gate electrode, wherein at least one of the first gate insulation film and the second gate insulation film includes:

a third gate insulation film which is formed on the first or second semiconductor region and is formed of a silicon oxide film or a silicon oxynitride film having a nitrogen concentration of 15 atomic % or less; and a fourth gate insulation film which is formed on the third gate insulation film and contains nitrogen at a concentration of between 20 atomic % and 57 atomic %.

2. The device according to claim 1, wherein:

the n-channel insulated-gate transistor includes:

a first, n-type, source region which is formed in a surface portion of the first semiconductor region;

a first, n-type, drain region which is formed in a surface portion of the first semiconductor region and is apart from the first source region; and a first, n-type, source extension region which is formed in a surface portion of the first semiconductor region between the first source region and the first drain region, is in contact with the first source region, and is apart from the first drain region, the first source extension region having a depth from a surface of the first semiconductor region, which is less than a depth of the first source region from the surface of the first semiconductor region, wherein:

the first drain extension region is an n-type region, is formed in a surface portion of the first semiconductor region between the first source extension region and the first drain region, is in contact with the first drain region, and is apart from the first source extension region, the first drain extension region having a depth from the surface of the first semiconductor region, which is less than a depth of the first drain region from the surface of the first semiconductor region, the first gate insulation film is formed on the first semiconductor region between the first source extension region and the first drain extension region, and the first gate electrode is an n-type electrode, and the p-channel insulated-gate transistor includes:

a second, p-type, source region which is formed in a surface portion of the second semiconductor region;

a second, p-type, drain region which is formed in a surface portion of the second semiconductor region and is apart from the second source region; and a second, p-type, source extension region which is formed in a surface portion of the second semiconductor region between the second source region and the second drain region, is in contact with the second source region, and is apart from the second drain region, the second source extension region having a depth from a surface of the second semiconductor region, which is less than a depth of the second source region from the surface of the second semiconductor region, wherein:

the second drain extension region is a p-type region, is formed in a surface portion of the second semiconductor region between the second source extension region and the second drain region, is in contact with the second drain region, and is apart from the second source extension region, the second drain extension region having a depth from the surface of the second semiconductor region, which is less than a depth of the second drain region from the surface of the second semiconductor region, the second gate insulation film is formed on the second semiconductor region between the second source extension region and the second drain extension region, and the second gate electrode is a p-type electrode.

3. The device according to claim 2, wherein the n-channel insulated-gate transistor further includes first offset spacers formed on side walls of the first gate electrode; and first sidewall spacers formed on side walls of the first offset spacers, and the p-channel insulated-gate transistor further includes second offset spacers formed on side walls of the second gate electrode; and second sidewall spacers formed on side walls of the second offset spacers.

4. The device according to claim 3, wherein the first offset spacer has a greater thickness than the second offset spacer.

5. The device according to claim 2, wherein an area of part of the second drain extension region which faces the second gate electrode is greater than an area of a part of the first drain extension region which faces the first gate electrode.

6. The device according to claim 2, wherein the n-channel insulated-gate transistor further includes offset spacers formed on side walls of the first gate electrode; and first sidewall spacers formed on side walls of the offset spacers, and the p-channel insulated-gate transistor further includes second sidewall spacers which are formed on side walls of the second gate electrode with no offset spacer interposed.

* * * * *

UNITED STATES PATENT AND TRADEMARK OFFICE
CERTIFICATE OF CORRECTION

| | | |
|---|---|---|
| PATENT NO. | : 7,989,903 B2 | Page 1 of 1 |
| APPLICATION NO. | : 12/757658 | |
| DATED | : August 2, 2011 | |
| INVENTOR(S) | : Ito et al. | |

It is certified that error appears in the above-identified patent and that said Letters Patent is hereby corrected as shown below:

On the title page under item (56), insert

-- OTHER PUBLICATIONS

Notice of Reasons for Rejection mailed May 10, 2011, in JP 2006-037107, and English-language translation. --

Signed and Sealed this
Seventh Day of August, 2012

David J. Kappos
*Director of the United States Patent and Trademark Office*